United States Patent
Seo et al.

(10) Patent No.: US 8,415,878 B2
(45) Date of Patent: Apr. 9, 2013

(54) LIGHT-EMITTING ELEMENT, LIGHT-EMITTING DEVICE, AND ELECTRONIC DEVICE

(75) Inventors: Satoshi Seo, Kanagawa (JP); Yuji Iwaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/994,364

(22) PCT Filed: Jul. 3, 2006

(86) PCT No.: PCT/JP2006/313631
§ 371 (c)(1),
(2), (4) Date: Dec. 31, 2007

(87) PCT Pub. No.: WO2007/004729
PCT Pub. Date: Jan. 11, 2007

(65) Prior Publication Data
US 2009/0206732 A1    Aug. 20, 2009

(30) Foreign Application Priority Data
Jul. 6, 2005 (JP) .................. 2005-197614

(51) Int. Cl.
*H01J 1/62* (2006.01)
(52) U.S. Cl.
USPC .......................... 313/506; 313/504
(58) Field of Classification Search ........... 313/498–512
See application file for complete search history.

(56) References Cited

U.S. PATENT DOCUMENTS

| | | | |
|---|---|---|---|
| 4,871,236 A | 10/1989 | Gemma et al. |
| 5,240,762 A | 8/1993 | Miura et al. |
| 5,343,050 A | 8/1994 | Egusa et al. |
| 5,783,292 A | 7/1998 | Tokito et al. |
| 5,989,737 A | 11/1999 | Xie et al. |
| 6,107,734 A | 8/2000 | Tanaka et al. |
| 6,337,492 B1 | 1/2002 | Jones et al. |
| 6,423,429 B2 | 7/2002 | Kido et al. |

(Continued)

FOREIGN PATENT DOCUMENTS

| | | |
|---|---|---|
| EP | 1 143 773 A1 | 10/2001 |
| EP | 2 271 183 A2 | 1/2006 |

(Continued)

OTHER PUBLICATIONS

International Search Report re application No. PCT/JP2006/313631, dated Sep. 5, 2006.

(Continued)

*Primary Examiner* — Bumsuk Won
(74) *Attorney, Agent, or Firm* — Husch Blackwell LLP

(57) ABSTRACT

It is an object to provide a light-emitting element which can reduce power consumption. A light-emitting element is provided, which includes a pair of electrodes and a light-emitting layer interposed between the pair of electrodes. The light-emitting layer includes at least a first layer and a second layer, each of the first layer and the second layer includes an emission center and a host material, the emission center is dispersed in the host material, a thickness of each of the first layer and the second layer is 1 nm or more and 10 nm or less, and the first layer is not in contact with the second layer.

78 Claims, 27 Drawing Sheets

U.S. PATENT DOCUMENTS

| | | |
|---|---|---|
| 6,486,601 B1 | 11/2002 | Sakai et al. |
| 6,580,213 B2 | 6/2003 | Yamazaki |
| 6,589,673 B1 | 7/2003 | Kido et al. |
| 6,617,788 B2 | 9/2003 | Shiiki et al. |
| 6,660,186 B2 | 12/2003 | Ravilisetty |
| 6,759,146 B2 | 7/2004 | Aziz et al. |
| 6,806,491 B2 | 10/2004 | Qiu et al. |
| 6,818,325 B2 | 11/2004 | Mishima et al. |
| 6,872,472 B2 | 3/2005 | Liao et al. |
| 6,875,524 B2 | 4/2005 | Hatwar et al. |
| 6,893,743 B2 | 5/2005 | Sato et al. |
| 6,910,933 B1 | 6/2005 | Matsuo et al. |
| 6,962,755 B2 | 11/2005 | Ise et al. |
| 7,038,374 B2 | 5/2006 | Yamazaki et al. |
| 7,041,390 B2 | 5/2006 | Seo et al. |
| 7,049,741 B2 | 5/2006 | Madathil et al. |
| 7,053,545 B2 | 5/2006 | Yamazaki |
| 7,158,161 B2 | 1/2007 | Gyoutoku et al. |
| 7,199,521 B2 | 4/2007 | Ibe |
| 7,239,081 B2 | 7/2007 | Tsutsui |
| 7,252,894 B2 | 8/2007 | Yu et al. |
| 7,271,537 B2 | 9/2007 | Matsuda et al. |
| 7,291,969 B2 | 11/2007 | Tsutsui |
| 7,345,300 B2 | 3/2008 | Qin et al. |
| 7,403,177 B2 | 7/2008 | Tanada et al. |
| 7,420,203 B2 | 9/2008 | Tsutsui et al. |
| 7,504,049 B2 | 3/2009 | Tsutsui et al. |
| 7,504,657 B2 | 3/2009 | Suzuri et al. |
| 7,511,418 B2 | 3/2009 | Yamazaki et al. |
| 7,511,421 B2 | 3/2009 | Tsutsui et al. |
| 7,535,440 B2 | 5/2009 | Nishi et al. |
| 7,572,522 B2 | 8/2009 | Seo et al. |
| 7,585,573 B2 | 9/2009 | Lee et al. |
| 7,659,012 B2 | 2/2010 | Kim et al. |
| 7,667,389 B2 | 2/2010 | Ikeda et al. |
| 7,732,808 B2 | 6/2010 | Ikeda et al. |
| 7,785,718 B2 | 8/2010 | Yatsunami et al. |
| 7,897,421 B2 | 3/2011 | Suzuri et al. |
| 7,898,168 B2 | 3/2011 | Seo et al. |
| 2001/0031509 A1* | 10/2001 | Yamazaki ............... 438/48 |
| 2002/0068192 A1* | 6/2002 | Moriyama et al. ............. 428/690 |
| 2003/0127967 A1 | 7/2003 | Tsutsui et al. |
| 2003/0189401 A1* | 10/2003 | Kido et al. ............... 313/504 |
| 2003/0218166 A1 | 11/2003 | Tsutsui |
| 2004/0140758 A1 | 7/2004 | Raychaudhuri et al. |
| 2005/0062405 A1 | 3/2005 | Peng |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2006/0216544 A1 | 9/2006 | Yamazaki et al. |
| 2006/0226770 A1* | 10/2006 | Lee et al. ............... 313/504 |
| 2006/0227079 A1 | 10/2006 | Kashiwabara |
| 2006/0243967 A1 | 11/2006 | Nomura et al. |
| 2006/0244373 A1 | 11/2006 | Nomura et al. |
| 2006/0257684 A1 | 11/2006 | Arakane et al. |
| 2006/0260679 A1* | 11/2006 | Aratani et al. ............... 136/258 |
| 2006/0261728 A1 | 11/2006 | Yamazaki et al. |
| 2006/0279190 A1* | 12/2006 | Nakayama ............... 313/113 |
| 2007/0200125 A1 | 8/2007 | Ikeda et al. |
| 2009/0026917 A1 | 1/2009 | Ikeda et al. |
| 2010/0096627 A1 | 4/2010 | Ikeda et al. |
| 2010/0207518 A1 | 8/2010 | Ikeda et al. |

FOREIGN PATENT DOCUMENTS

| | | |
|---|---|---|
| EP | 1 667 494 A1 | 6/2006 |
| EP | 1 784 056 A1 | 5/2007 |
| EP | 2 178 348 A2 | 4/2010 |
| JP | 3-26780 | 2/1991 |
| JP | 3-274695 | 12/1991 |
| JP | 10-60639 | 3/1998 |
| JP | 2824411 | 11/1998 |
| JP | 11-307259 | 11/1999 |
| JP | 11-307264 | 11/1999 |
| JP | 2000-315580 | 11/2000 |
| JP | 2001-81548 | 3/2001 |
| JP | 2001-189193 | 7/2001 |
| JP | 2001-244079 | 9/2001 |
| JP | 2002-56976 | 2/2002 |
| JP | 2003-286563 | 10/2003 |
| JP | 2005-26121 | 1/2005 |
| JP | 2005-32618 | 2/2005 |
| JP | 2005-100921 | 4/2005 |
| JP | 2005-108730 | 4/2005 |
| JP | 2005-116203 | 4/2005 |
| JP | 2005-251587 | 9/2005 |
| JP | 2006-210848 | 8/2006 |
| JP | 2006-302864 | 11/2006 |
| JP | 2006-324016 | 11/2006 |
| WO | WO 2005/027586 A1 | 3/2005 |
| WO | WO 2005/031798 A2 | 4/2005 |
| WO | WO 2006/009024 A1 | 1/2006 |

OTHER PUBLICATIONS

Written Opinion re application No. PCT/JP2006/313631, dated Sep. 5, 2006.

Huang, J. et al, "High-Brightness Organic Double-Quantum-Well Electroluminescent Devices," Applied Physics Letters, vol. 77, No. 12, Sep. 18, 2000, pp. 1750-1752.

Ren, X. et al, "Ultrahigh Energy Gap Hosts in Deep Blue Organic Electrophosphorescent Devices," Chemistry of Materials, vol. 16, No. 23, 2004, pp. 4743-4747.

* cited by examiner

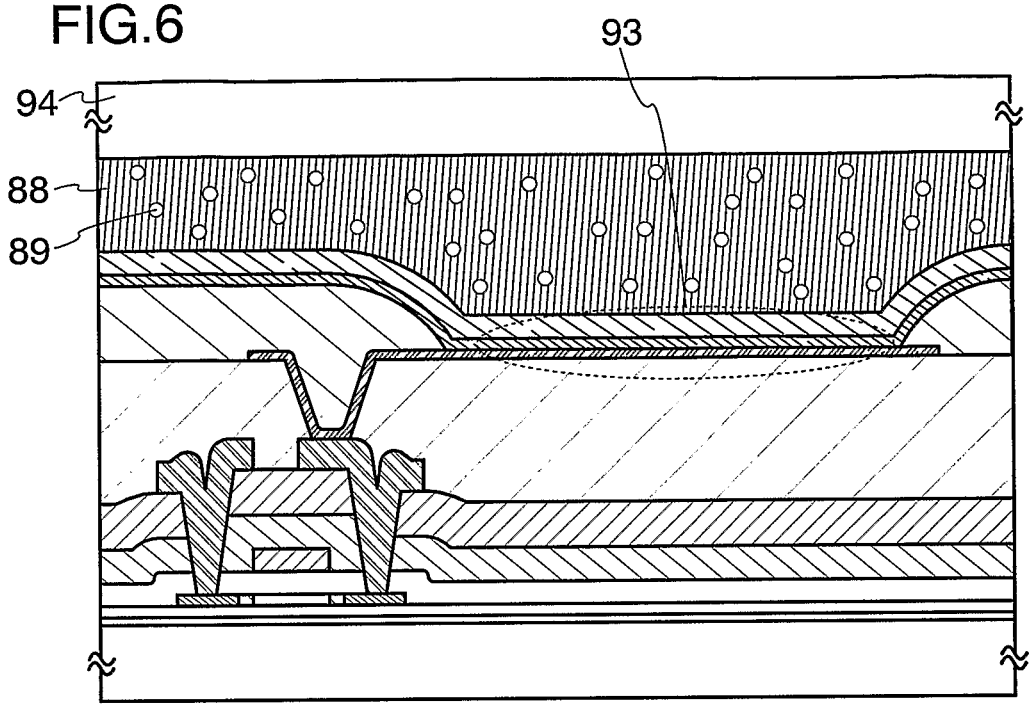

LIGHT-EMITTING ELEMENT, LIGHT-EMITTING DEVICE, AND ELECTRONIC DEVICE

TECHNICAL FIELD

The present invention relates to a light-emitting element which emits light by applying current, and a light-emitting device using the light-emitting element. In particular, the present invention relates to a light-emitting element and a light-emitting device having high efficiency and low driving voltage.

BACKGROUND ART

Development of a light-emitting device using a light-emitting element which has a layer containing an organic material between a pair of electrodes and emits light by applying current between the pair of electrodes has been carried out. Such a light emitting device is advantageous to be thin and lightweight as compared with other display devices that are called a thin display device, and has good visibility since it is self light-emitting device, and accordingly response speed is fast. Therefore, the development of the light-emitting device is actively carried out as a next generation display device, and part thereof is currently put to practical use.

In such a light-emitting element, holes are injected to a layer containing an organic material from an electrode functioning as an anode, and electrons are injected to the layer containing an organic material from an electrode functioning as a cathode. Then, the holes and the electrons are recombined to excite a light-emitting material in the layer containing an organic material, and excess energy is emitted as light when the light-emitting material returns to a ground state. Therefore, the quantity of light emitted by the light-emitting element is proportional to current which flows in the light-emitting element.

Such a light-emitting device which is advantageous to be thin and lightweight is especially suitable for application to a mobile device. A light-emitting device, mounted on a mobile device in which there is a limitation of battery, is required to save power. In addition, a requirement of low energy consumption has been more and more increased in association with environment problems, energy problems, and the like.

There are various methods to reduce power consumption. For example, there are methods of improving internal light emission efficiency, improving external extraction efficiency, reducing driving voltage, or the like. For example, Reference 1 discloses increase of internal light emission efficiency by roughly equalizing injection balance of holes and electrons to reduce power consumption (Reference 1: Japanese Patent Laid-Open No. 2005-116203).

DISCLOSURE OF INVENTION

As described above, reduction in power consumption by using various methods is attempted; however, it is difficult to say that low power consumption is sufficiently attempted in the present situation. Therefore, further reduction in power consumption is hoped. It is an object of the present invention to provide a light-emitting element and a light-emitting device which is capable of further reducing power consumption.

One feature of the present invention to solve the above-described problem is a light-emitting element having a pair of electrodes and a layer containing an organic compound interposed between the pair of electrodes, where the layer containing an organic compound has a light-emitting layer, the light-emitting layer has a plurality of light-emitting regions in which a substance which becomes an emission center is dispersed in a host material, the thickness of each of the plurality of light-emitting regions is 1 nm or more and 10 nm or less, and the plurality of light-emitting regions are formed at intervals.

Another feature of the present invention to solve the above-described problem is a light-emitting element having a pair of electrodes and a layer containing an organic compound interposed between the pair of electrodes, where the layer containing an organic compound has a light-emitting layer, the light-emitting layer has a plurality of light-emitting regions in which a substance which becomes an emission center is dispersed in a host material, the thickness of each of the plurality of light-emitting regions is 1 nm or more and 5 nm or less, and the plurality of light-emitting regions are formed at intervals.

Another feature of the present invention to solve the above-described problem, in the above-described structure, is a light-emitting element in which an absolute value of reduction potential of a substance which becomes an emission center is smaller than an absolute value of reduction potential of a host material. In addition, another feature of the present invention, in the above-described structure, is a light-emitting element in which electron affinity of a substance which becomes an emission center is larger than that of a host material.

Another feature of the present invention to solve the above-described problem, in the above-described structure, is a light-emitting element in which a substance which becomes an emission center is a phosphorescent material.

Another feature of the present invention to solve the above-described problem, in the above-described structure, is a light-emitting element in which a substance which becomes an emission center has an electron withdrawing group.

Another feature of the present invention to solve the above-described problem, in the above-described structure, is a light-emitting element in which a substance which becomes an emission center is a phosphorescent material having an electron withdrawing group.

Another feature of the present invention to solve the above-described problem, in the above-described structure, is a light-emitting element in which a host material is 4,4'-di(N-carbazolyl)biphenyl, and a substance which becomes an emission center is (acetylacetonate)bis[2,3-bis(4-fluorophenyl)quinoxalinato]iridium(III) or (acetylacetonate)bis[2,3-bis(4-fluorophenyl)-5-methylpyrazinato]iridium(III).

Another feature of the present invention to solve the above-described problem, in the above-described structure, is a light-emitting element in which an interval between a plurality of light-emitting regions is 1 nm or more and 10 nm or less.

Another feature of the present invention to solve the above-described problem, in the above-described structure, is a light-emitting element in which an interval between a plurality of light-emitting regions is 1 nm or more and 5 nm or less.

Another feature of the present invention to solve the above-described problem, in the above-described structure, is a light-emitting element in which the number of a plurality of light-emitting regions is 2 or more and 5 or less.

Another feature of the present invention to solve the above-described problem, in the above-described structure, is a light-emitting element in which the number of a plurality of light-emitting regions is 2 or 3.

Another feature of the present invention to solve the above-described problem, in the above-described structure, is a light-emitting element in which the number of a plurality of light-emitting regions is 2.

Another feature of the present invention to solve the above-described problem, in the above-described structure, is a light-emitting element in which 0.001 to 50 wt % of a substance which becomes an emission center is included with respect to a host material.

Another feature of the present invention to solve the above-described problem, in the above-described structure, is a light-emitting element in which 0.03 to 30 wt % of a substance which becomes an emission center is included with respect to a host material.

Another feature of the present invention to solve the above-described problem, in the above-described structure, is a light-emitting element in which a layer containing an organic compound has a carrier transporting layer in contact with a light-emitting layer, the light-emitting layer has a region formed from a material having a carrier transporting property in a region which is in contact with the carrier transporting layer, the region formed from a material having a carrier transporting property is provided to be 1 to 5 nm thick, and a band gap of a material having a carrier transporting property is bigger than that of a substance which is used for the carrier transporting layer.

A light-emitting element according to the present invention includes a pair of electrodes and a light-emitting layer interposed between the pair of electrodes. The light-emitting layer includes at least a first layer (also referred to as a first light-emitting region) and a second layer (also referred to as a second light-emitting region), each of the first layer and the second layer includes an emission center (also referred to as a substance which becomes an emission center) and a host material, the emission center is dispersed in the host material, a thickness of each of the first layer and the second layer is 1 nm or more and 10 nm or less, and the first layer is not in contact with the second layer. The distance between the first layer and the second layer is 1 nm or more and 10 nm or less.

A light-emitting element according to the present invention includes a pair of electrodes and a light-emitting layer interposed between the pair of electrodes. The light-emitting layer includes at least a first layer (also referred to as a first light-emitting region), a second layer (also referred to as a second light-emitting region), and a third layer (a region formed from a material having a carrier transporting property), each of the first layer and the second layer includes an emission center (also referred to as a substance which becomes an emission center) and a host material, the emission center is dispersed in the host material, a thickness of each of the first layer and the second layer is 1 nm or more and 10 nm or less, and the third layer is interposed between the first layer and the second layer. A thickness of each of the third layer is 1 nm or more and 10 nm or less. The third layer contains the host material.

In the light-emitting element having the above structure, the emission center is an organic material. The host material is an organic material.

By using the present invention, a light-emitting element and a light-emitting device in which lower power consumption is realized can be obtained. In addition, by thinning a light-emitting layer, a light-emitting element and a light-emitting device in which lower power consumption is realized can be obtained.

BRIEF DESCRIPTION OF DRAWINGS

In the accompanying drawings:

FIG. 6 is a cross-sectional view showing a manufacturing method of a light-emitting device of the present invention;

BEST MODE FOR CARRYING OUT THE INVENTION

Hereinafter, embodiment modes of the present invention will be described with reference to the drawings. However, the present invention can be carried out in many different modes, and it is easily understood by those skilled in the art that modes and details thereof can be modified in various ways without departing from the purpose and the scope of the present invention. Therefore, the present invention is not understood as being limited to the description of this embodiment mode.

[Embodiment Mode 1]

Figure 1A:
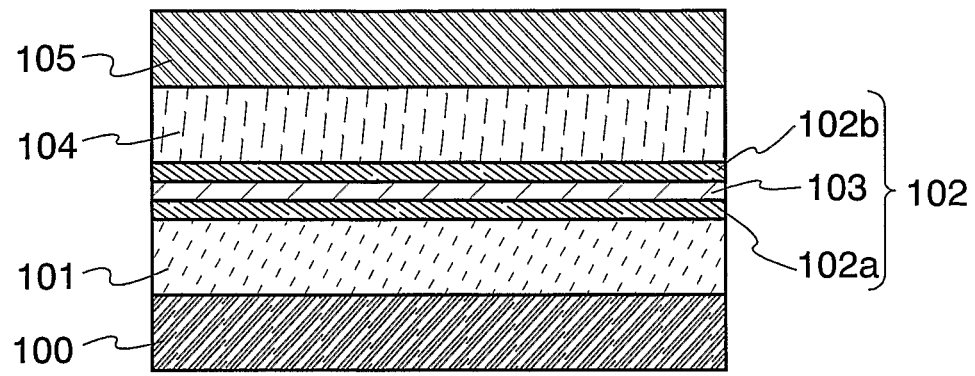
FIGS. 1A to 1C each show a cross-sectional view of a light-emitting element of the present invention.

FIG. 1A is a view of a light-emitting element of the present invention. The light-emitting element of the present invention has a layer containing an organic compound between a pair of electrodes formed of a first electrode 100 and a second electrode 105, and the layer containing an organic compound has at least a light-emitting layer 102. In FIG. 1A, the light-emitting layer 102 has a first light-emitting region 102a, a second light-emitting region 102b, and a region 103 formed from a material having a carrier transporting property. The region 103 formed from a material having a carrier transporting property is provided between the first light-emitting region 102a and the second light-emitting region 102b. Therefore, the first light-emitting region 102a and the second light-emitting region 102b are formed having an interval therebetween. In addition, a first carrier transporting layer 101 and a second carrier transporting layer 104 may be provided between the electrode and the light-emitting layer 102. The first carrier transporting layer 101 and the second carrier transporting layer 104 are formed from a material having a carrier injecting property and a carrier transporting property. It is to be noted that, in FIG. 1A, the first carrier transporting layer 101 is provided at the first electrode 100 side when seen from the light-emitting layer 102, and the second carrier transporting layer 104 is provided at the electrode 105 side when seen from the light-emitting layer 102. In the present invention, a plurality of light-emitting regions is formed; however, an example in which two layers of light-emitting regions are formed is shown in FIG. 1A.

Light-emission can be obtained from the light-emitting layer 102 when a voltage is applied so that a voltage of one of a pair of electrodes including the first electrode 100 and the second electrode 105 is higher than the other of the pair of electrodes in the light-emitting element of the present invention.

An electrode through which light is extracted of either the first electrode 100 or the second electrode 105 is formed from a conductive material having a light-transmitting property. At this time, light-emission can be efficiently extracted by forming the other electrode from a material having high reflectivity. In addition, if both of the electrodes are formed from a conductive material having a light-transmitting property, light can be extracted through both sides of the light-emitting element. Further, it is preferable to use a conductive material which has a high work function (work function of 4.0 eV or more) for an electrode to which high voltage is applied in obtaining light emission from the light-emitting layer 102, and it is also preferable to use a conductive material which has a low work function (work function of 3.8 eV or less) for an electrode to which low voltage is applied in obtaining light emission. However, the conductive material can be used as an electrode regardless of the work function by placing a material having a carrier injecting property in a layer containing an organic compound so as to be in contact with the electrode.

Metal, alloy, an electroconductive compound, and a mixture thereof can be used as a material for these electrodes. For example, metal having conductivity such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); alloy such as alloy formed from aluminum and silicon (Al—Si), alloy formed from aluminum and titanium (Al—Ti), or alloy formed from aluminum, silicon, and copper (Al—Si—Cu); nitride of a metal material such as titanium nitride (TiN); a metal compound such as indium tin oxide (ITO), ITO containing silicon (ITSO), or indium zinc oxide (IZO) in which indium oxide is mixed with 2 to 20 wt % of zinc oxide (ZnO); or the like can be used. It is to be noted that since ITO, ITSO, IZO, and the like are conductive materials having a light-transmitting property, they can be preferably used as a material for an electrode through which light is extracted. In addition, when the electrode is formed of a thick film using aluminum, silver, or the like, the electrode has a non light-transmitting property; however, when the electrode is formed of a thin film, the electrode has a light-transmitting property. Therefore, a thin film of aluminum or silver can be used as the electrode having a light-transmitting property. It is to be noted that since aluminum, silver, and the like have high reflectivity, they can also be used as a reflective electrode by being formed with a certain thickness or more. These electrodes can be formed by a known method such as a sputtering method or an evaporation method.

The first light-emitting region 102a and the second light-emitting region 102b are formed by dispersing a substance which becomes an emission center in a material having a carrier transporting property which is called a host. The substance which becomes an emission center is included at 0.001 to 50 wt %, preferably 0.03 to 30 wt %, with respect to the host material. A material having a carrier transporting material and a material having a high light-transmitting property can be used for the host material and the substance which becomes an emission center, respectively; however, in the present invention, materials are combined so that an absolute value of reduction potential of the substance which becomes an emission center is smaller than an absolute value of reduction potential of the host material. In other words, materials are preferably combined so that electron affinity of the substance which becomes an emission center is larger than that of the host material. In the case of such a combination, the substance which becomes an emission center functions as an electron trap in a conventional element structure, and accordingly, driving voltage of an element increases; however, increase of driving voltage can be eliminated by applying the element structure of the present invention.

It is to be noted that reduction potential can be measured by performing cyclic voltammetry measurement (CV measurement) and detecting reduction peak potential. Also, it can be said that an absolute value of reduction potential of a substance in which clear reduction potential cannot be measured by the CV measurement is larger than an absolute value of reduction potential of a substance in which clear reduction peak potential can be measured. As a typical example of a combination of materials having such a relation, the following can be given. A combination in which (acetylacetonate) bis[2,3-bis(4-fluorophenyl)quinoxalinato]iridium(III) (abbreviation: Ir(Fdpq)$_2$(acac)) or (acetylacetonate)bis[2,3-bis(4-fluorophenyl)-5-methylpyrazinato]iridium(III) (abbreviation: Ir(Fdppr-Me)$_2$(acac)) is used as a substance which becomes an emission center, and 4,4'-di(N-carbazolyl) biphenyl (abbreviation: CBP) is used as a host material.

As a substance which can be used as a host material in the light-emitting region of the present invention, the following can be given: the above-described 4,4'-di(N-carbazolyl)biphenyl (abbreviation: CBP); 4,4'-bis[N-(1-napthyl)-N-phenylamino]biphenyl (abbreviation: NPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis{N-[4-(N,N-di-m-tolylamino)phenyl]-N-phenylamino}biphenyl (abbreviation: DNTPD); 1,3,5-tris [N,N-di(m-tolyl)amino]benzene (abbreviation: m-MTDAB), 4,4',4''-tris(N-carbazolyl)triphenylamine (abbreviation: TCTA); tris(8-quinolinolato)aluminum (abbreviation: Alq$_3$); tris(4-methyl-8-quinolinolato)aluminum (abbreviation: Almq$_3$); bis(10-hydroxybenz[h]-quinolinato) beryllium (abbreviation: BeBq$_2$); bis(2-methyl-8- quinolinolato)-4-phenylphenolato-aluminum (abbreviation: BAlq); bis[2-(2-hydroxyphenyl)-benzoxazolate]zinc (abbreviation: $Zn(BOX)_2$); bis[2-(2-hydroxyphenyl)-benzothiazolate]zinc (abbreviation: $Zn(BTZ)_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-biphenylyl)-4-phenyl-5-(4-tert-butylphenyl)-1,2,4-triazole (abbreviation: TAZ01); 3-(4-biphenylyl)-4-(4-ethylphenyl)-5-(4-tert-butylphenyl)-1,2,4-triazole (abbreviation: p-EtTAZ); bathophenanthroline (abbreviation: BPhen); bathocuproin (abbreviation: BCP); 2,2',2''-(1,3,5-benzenetriyl)-tris(1-phenyl-1H-benzimidazole) (abbreviation: TPBI); 4,4-bis(5-methyl benzoxazol-2-yl)stilbene (abbreviation: BzOs); or the like.

In addition, as a substance that can be used as a substance which becomes an emission center (also referred to as an emission center), the following can be given: a phosphorescent material such as the above-described (acetylacetonate)bis[2,3-bis(4-fluorophenyl)quinoxalinato]iridium(III) (abbreviation: $Ir(Fdpq)_2(acac)$) and (acetylacetonate)bis[2,3-bis(4-fluorophenyl)-5-methylpyrazinato]iridium(III) (abbreviation: $Ir(Fdppr-Me)_2(acac)$), (acetylacetonate)bis(2,3-diphenylquinoxalinato)iridium(III) (abbreviation: $Ir(dpq)_2(acac)$), (acetylacetonate)bis[2-(4-fluorophenyl)-3-methylquinoxalinato]iridium (III) (abbreviation: $Ir(MFpq)_2(acac)$), bis[2,3-bis(4-trifluoromethylphenyl)quinoxalinato](picolinate)iridium(III) (abbreviation: $Ir(CF_3dpq)_2(Pic)$), or bis[2-(4,6-difluorophenyl)pyridinato]iridium(III) picolinate (abbreviation: FIrpic); a fluorescent material such as 4-(dicyanomethylene)-2-isopropyl-6-[2-(1,1,7,7-tetramethyljulolidin-9-yl)ethenyl]-4H-pyran (abbreviation: DCJTI), 4-(dicyanomethylene)-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidin-9-yl)ethenyl]-4H-pyran (abbreviation: DCJTB), N,N'-dimethylquinacridone (abbreviation: DMQd), N,N'-diphenylquinacridone (abbreviation: DPQd), 9,10-diphenylanthracene (abbreviation: DPAnth), Nile Red, coumalin 6, coumalin 545T; or the like.

Conventionally, in a case of using a phosphorescent material for a substance which becomes an emission center, there has been a defect that driving voltage is high though current efficiency is high. When a phosphorescent material is applied to the embodiment mode of the present invention, current efficiency is high and driving voltage is low. Therefore, power consumption can be drastically reduced.

In addition, (acetylacetonate)bis[2,3-bis(4-fluorophenyl)quinoxalinato]iridium(III) (abbreviation: $Ir(Fdpq)_2(acac)$), (acetylacetonate)bis[2,3-bis(4-fluorophenyl)-5-methylpyrazinato]iridium(III) (abbreviation: $Ir(Fdppr-Me)_2(acac)$), (acetylacetonate)bis[2-(4-fluorophenyl)-3-methylquinoxalinato]iridium(III) (abbreviation: $Ir(MFpq)_2(acac)$), and bis[2-(4,6-difluorophenyl)pyridinato]iridium (III) picolinate (abbreviation: FIrpic) have a fluoro group; bis[2,3-bis(4-trifluoromethylphenyl)quinoxalinato](picolinate)iridium(III) (abbreviation: $Ir(CF_3dpq)_2(Pic)$) has a trifluoromethyl group; 4-(dicyanomethylene)-2-isopropyl-6-[2-(1,1,7,7-tetramethyljulolidin-9-yl)ethenyl]-4H-pyran (abbreviation: DCJTI), 4-(dicyanomethylene)-2-methyl-6-[2-(1,1,7,7-tetramethyljulolidin-9-yl)ethenyl]-4H-pyran (abbreviation: DCJT), and 4-dicyanomethylene-2-tert-butyl-6-[2-(1,1,7,7-tetramethyljulolidin-9-yl)ethenyl]-4H-pyran (abbreviation: DCJTB) have a cyano group; and N,N'-dimethylquinacridone (abbreviation: DMQD), N N'-diphenylquinacridone (abbreviation: DPQd), 9,10-diphenylanthracene (abbreviation: DPAnth), Nile Red, coumalin 6, and coumalin 545T have a carbonyl group. As described above, a substance having an electron withdrawing group such as a fluoro group, a trifluoromethyl group, a cyano group, or a carbonyl group tends to have a high electron trap property (large electron affinity); therefore, driving voltage is high in a conventional mode. However, when being applied to the embodiment mode of the present invention, driving voltage can be reduced.

It is to be noted that when a phosphorescent material having an electron withdrawing group is applied to the embodiment mode of the present invention, electron efficiency is high and driving voltage can be further reduced.

In addition, the thickness of each of the first light-emitting region 102a and the second light-emitting region 102b is 1 nm or more and 10 nm or less, preferably 1 nm or more and 5 nm or less. The light-emitting region can be formed by co-evaporating a host material and a substance which becomes an emission center. The light-emitting region may also be formed by a wet method or other methods.

The first light-emitting region 102a and the second light-emitting region 102b are formed having an interval therebetween by forming the region 103 formed from a material having a carrier transporting property. The region 103 formed from a material having a carrier transporting property has a carrier transporting property, and any material can be used as long as light emission from the light-emitting region is not quenched; however, the thickness of each of the light-emitting regions in the present invention is 1 nm or more and 10 nm or less, preferably 1 nm or more and 5 nm or less. For the region 103 formed from a material having a carrier transporting property, the following can be used: materials such as NPB, TPD, TDATA, MTDATA, DNTPD, m-MTDAB, TCTA, $Alq_3$, $Almq_3$, $BeBq_2$, BAlq, $Zn(BOX)_2$, $Zn(BTZ)_2$, PBD, OXD-7, TAZ01, p-EtTAZ, BPhen, BCP, TPBI, and BzOs. In addition, these materials may also be combined. This region 103 formed from a material having a carrier transporting property and a host material of the light-emitting layer 102 may be formed from a same material, and in this case, a manufacturing process can be simplified, which is advantageous. The region 103 formed from a material having a carrier transporting property may be manufactured by an evaporation method or the like. Although there is a case where a small amount of substance which becomes an emission center is contained in the region 103 formed from a material having a carrier transporting property for manufacture reasons, it does not cause problems in operation; thereby being able to be included in the present invention.

One of the first carrier transporting layer 101 and the second carrier transporting layer 104 is formed from a material having a high hole transporting property, and the other is formed form a material having a high electron transporting property. When light emission is obtained from the light-emitting layer when seen from the light-emitting layer, a layer which is formed at the electrode side to which high voltage is applied is formed from a material having a high hole transporting property, and a layer which is formed at the electrode side to which low voltage is applied is formed from a material having a high electron transporting property. Accordingly, carriers can be efficiently transported to the light-emitting layer 102. As the material having a high hole transporting property, the following can be given: NPB, TPD, TDATA, MTDATA, DNTPD, m-MTDAB, TCTA, phthalocyanine (abbreviation: $H_2Pc$), copper phthalocyanine (abbreviation: CuPc), vanadyl phthalocyanine (abbreviation: VOPc), molybdenum oxide, vanadium oxide, or the like. In addition, a multilayer structured layer in which two or more layers including the above-described substance are combined may be used. As the material having a high electron transporting property, the following can be given: Alq$_3$, Almq$_3$, BeBq$_2$, BAlq, Zn(BOX)$_2$, Zn(BTZ)$_2$, PBD, OXD-7, TAZ01, p-EtTAZ, BPhen, BCP, TPBI, BzOs, or the like. In addition, a multilayer structured layer in which two or more layers including the above-described substance are combined may be used. These carrier transporting layers may be formed by a method such as an evaporation method. The carrier transporting layers may be formed by a wet method depending on the material.

The substance which becomes an emission center traps electrons and the region 103 formed from a material having a carrier transporting property reduces carriers going through; accordingly, recombination efficiency of carriers which are electrons and holes is favorable, and the light-emitting element of the present invention which has the above-described structure can obtain current efficiency (represented by the relation between current density and luminance) which is equal to the conventional light-emitting element having one thick light-emitting layer. In addition, the light-emitting element of the present invention has driving voltage which is lower than that of the conventional light-emitting element having one thick light-emitting layer; therefore, the light-emitting element with low power consumption can be obtained. Moreover, a thickness of the light-emitting layer of the present invention is thinner than that of the conventional light-emitting element: therefore the light-emitting element with low power consumption can be obtained.

Figure 1B:
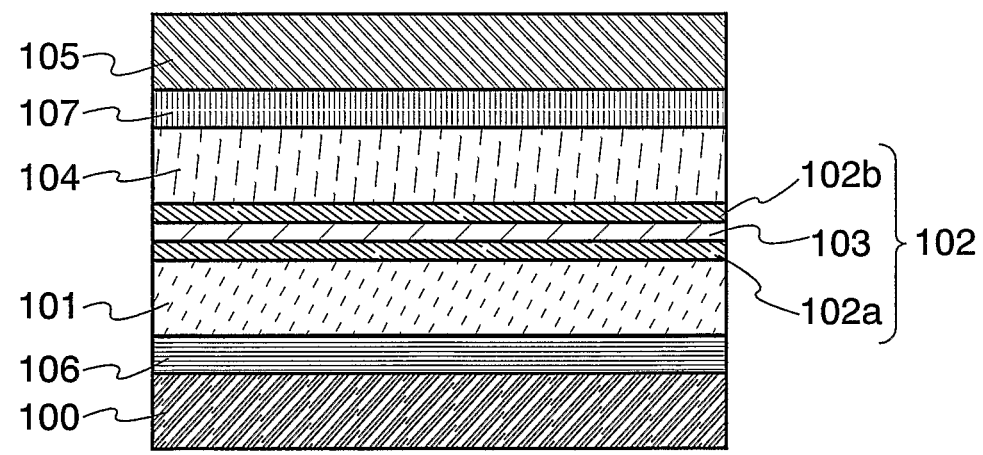

FIG. 1B shows a structure in which the structure of FIG. 1A is provided with a first carrier injecting layer 106 and a second carrier injecting layer 107 that are carrier injecting layers having a superior carrier injecting property to the first carrier transporting layer 101 and the second carrier transporting layer 104. The carrier injecting layer is provided closer to the electrode than the carrier transporting layer. In addition, when light-emission is obtained from the light-emitting layer, the carrier injecting layer which is provided at the electrode side to which high voltage is applied is formed form a material that is excellent in a hole injecting property, and the carrier injecting layer which is provided at the electrode side to which low voltage is applied is formed from a material that is excellent in an electron injecting property, when seen from the light-emitting layer. It is to be noted that a material that is relatively excellent in a carrier injecting property than the material used for the carrier transporting layer may be used for the carrier injecting layer. Specifically, the following can be given: a phthalocyanine based compound such as phthalocyanine (H$_2$Pc) or a copper phthalocyanine (CuPC); or high molecular compound such as poly(ethylenedioxythiophene)/poly (styrene sulfonate) water solution (PEDOT/PSS). As the material which is excellent in an electron injecting property, the following can be given: an inorganic substance such as alkali metal, alkaline earth metal, fluoride of alkali metal, fluoride of alkaline earth metal, oxide of alkali metal, or oxide of alkaline earth metal. In addition to the inorganic substance, BPhen, BCP, p-EtTAZ, TAZ, BzOs, or the like can be given. By this structure, carriers can be efficiently injected from the electrode. The carrier injecting layer can be formed by a method such as an evaporation method.

Figure 1C:
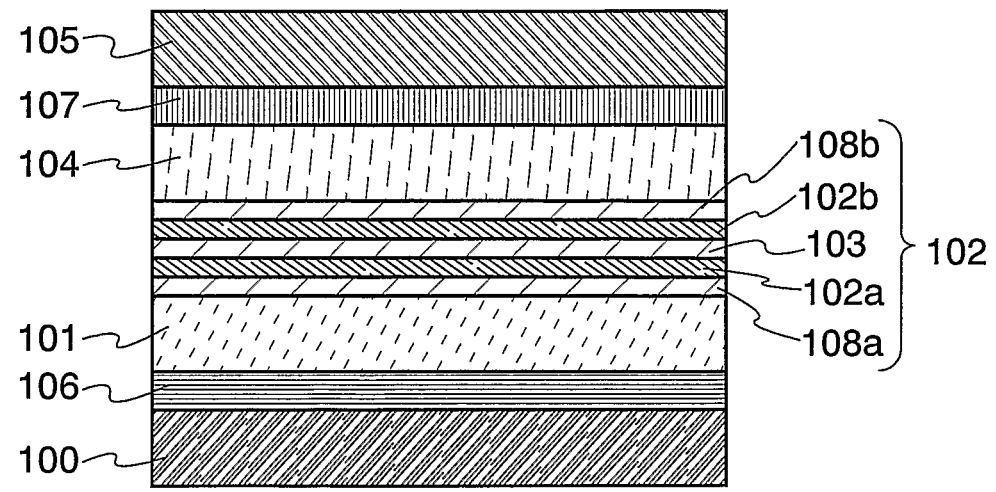

FIG. 1C shows a structure in which regions 108a and 108b formed from a material having a carrier transporting property are provided at the both electrodes sides of the light-emitting layer 102 in the structure of FIG. 1B. The regions 108a and 108b formed from a material having a carrier transporting property may be formed from the same material as the region 103 formed from a material having a carrier transporting property. Only one of the regions 108a and 108b formed from the material having a carrier transporting property may be provided. The light-emitting element of the present invention may have such a structure.

Further, when there is a possibility that energy of an excited substance which becomes an emission center moves from the light-emitting layer to other layers (functional layers such as the carrier transporting layer and the carrier injecting layer), the regions 108a or 108b formed from the material having a carrier transporting property may be formed between the layer to which the energy might move and the light-emitting layer. At this time, a band gap of the material having a carrier transporting property is made bigger than that of the substance used for the layer to which the energy might move (for example, the carrier transporting layer 101 or 104). In addition, the region 108a or 108b formed from the material having a carrier transporting property may be 1 to 5 nm thick. The light-emitting element of the present invention having such a structure can effectively suppress movement of excited energy of the substance which becomes an emission center to other layers, which leads to increase of light emission efficiency. In addition, in this structure, the thickness of the region 108a or 108b formed from the material having a carrier transporting property is as thin as 1 to 5 nm; accordingly, the structure is advantageous which can obtain the effect with little increase of driving voltage.

Figure 2A:
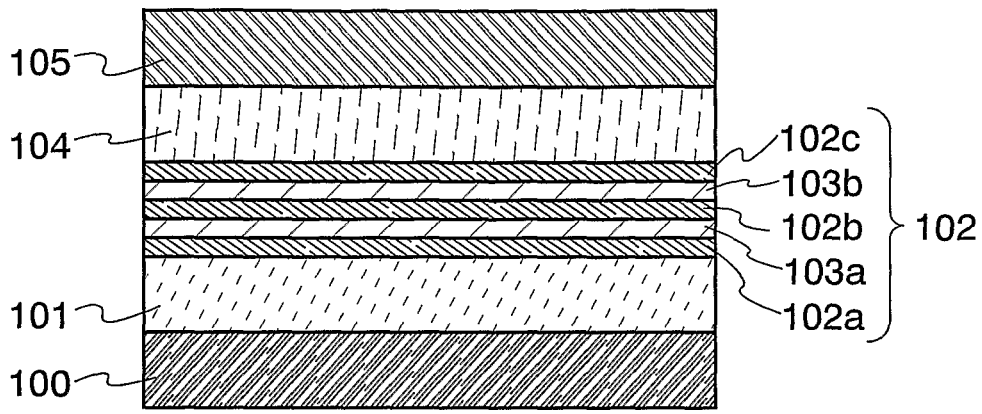
FIGS. 2A to 2C each show a cross-sectional view of a light-emitting element of the present invention.

In FIG. 2A, the light-emitting layer 102 includes the first light-emitting region 102a, the second light-emitting region 102b, a third light-emitting region 102c, a region 103a formed form a material having a carrier transporting property, and a region 103b formed from a material having a carrier transporting property. In this case, the first region 103a formed from a material having a carrier transporting property is provided between the first light-emitting region 102a and a second light-emitting region 102b, and the second region 103b formed from the material having a carrier transporting property is provided between the second light-emitting region 102b and the third light-emitting region 102c. Therefore, the first light-emitting region 102a, the second light-emitting region 102b, and the third light-emitting region 102c are formed at intervals. A material or the like used for the third light-emitting region 102c is the same as the first light-emitting region 102a and the second light-emitting region 102b in FIGS. 1A to 1C, and a material or the like used for the first region 103a formed form a material having a carrier transporting property and the second region 103b formed from a material having a carrier transporting property is the same as the region 103 formed from a material having a carrier transporting property in FIGS. 1A to 1C; therefore, repeated explanation is omitted. The corresponding descriptions may be referred. It is to be noted that the structures described in FIGS. 1B and 1C may be combined to be used.

The substance which becomes an emission center traps electrons and the regions 103a and 103b formed from a material having a carrier transporting property reduces carriers going through the light-emitting layer 102 without recombination; accordingly, recombination efficiency of carriers which are holes and electrons is favorable, and the light-emitting element of the present invention which has the above-described structure can obtain current efficiency (represented by the relation between current density and luminance) which is equal to the conventional light-emitting element having one thick light-emitting layer. In addition, the light-emitting element of the present invention has driving voltage which is lower than that of the conventional light-emitting element having one thick light-emitting layer; therefore, the light-emitting layer with low power consumption can be obtained. Moreover, a thickness of the light-emitting layer of the present invention is thinner than that of the conventional light-emitting element: therefore the light-emitting element with low power consumption can be obtained.

Figure 2B:
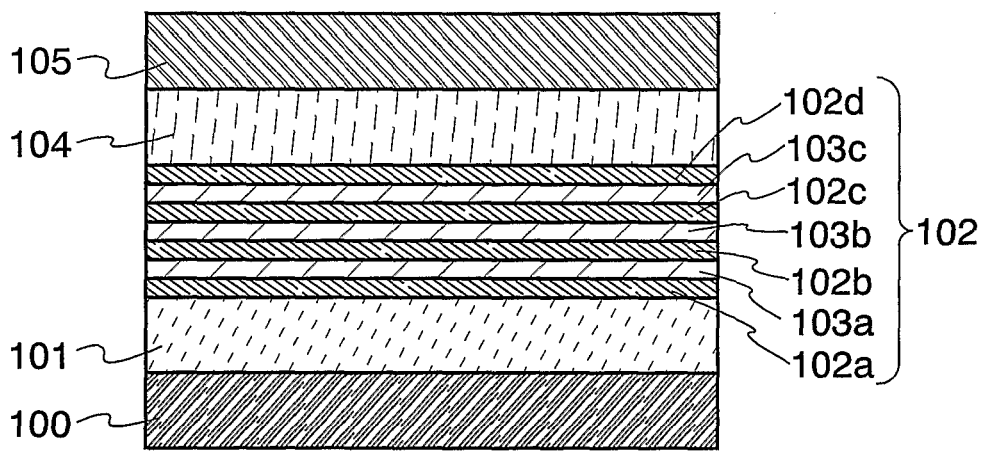

In FIG. 2B, the light-emitting layer 102 includes the first light-emitting region 102a, the second light-emitting region 102b, the third light-emitting region 102c, a fourth light-emitting region 102d, the first region 103a formed from a material having a carrier transporting property, the second region 103b formed from a material having a carrier transporting property, and a third region 103c formed from a material having a carrier transporting property. In this case, the first region 103a formed from a material having a carrier transporting property is provided between the first light-emitting region 102a and the second light-emitting region 102b; the second region 103b formed from a material having a carrier transporting property is provided between the second light-emitting region 102b and the third light-emitting region 102c; and the third region 103c formed from a material having a carrier transporting property is provided between the third light-transmitting region 102c and the fourth light-transmitting region 102d. Therefore, the first light-emitting region 102a, the second light-emitting region 102b, the third light-emitting region 102c, and the fourth light-emitting region 102d are formed at intervals. A material or the like used for the third light-emitting region 102c and the fourth light-emitting region 102d is the same as the first light-emitting region 102a and the second light-emitting region 102b in FIGS. 1A to 1C, and a material or the like used for the first region 103a formed from a material having a carrier transporting property, the second region 103b formed from a material having a carrier transporting property, and the third region 103c formed from a material having a carrier transporting property is the same as the region 103 formed from a material having the carrier transporting property in FIGS. 1A to 1C; therefore, the repeated explanation is omitted. The corresponding description may be referred. It is to be noted that the structures described in FIGS. 1B and 1C may be combined to be used.

The substance which becomes an emission center traps electrons and the regions 103a, 103b, and 103c formed from a material having the carrier transporting property reduces carriers going through the light-emitting layer 102 without recombination; accordingly, recombination efficiency of carriers which are electrons and holes is favorable, and the light-emitting element of the present invention which has the above-described structure can obtain current efficiency (represented by the relation between current density and luminance) which is equal to the conventional light-emitting element having one thick light-emitting layer. In addition, the light-emitting element of the present invention has driving voltage which is lower than that of the conventional light-emitting element having one thick light-emitting layer; therefore, the light-emitting layer with low power consumption can be obtained. Moreover, a thickness of the light-emitting layer of the present invention is thinner than that of the conventional light-emitting element: therefore the light-emitting element with low power consumption can be obtained.

Figure 2C:
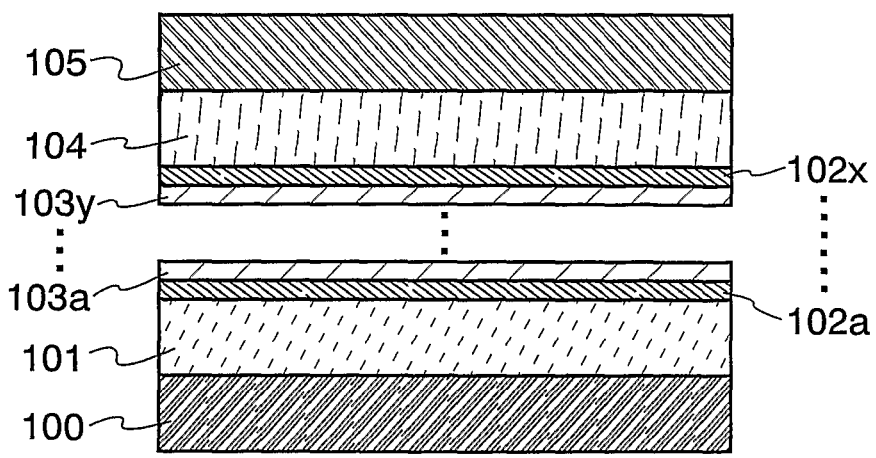

FIG. 2C shows an example in which the light-emitting layer 102 is formed by an n layer (n is a natural number of 2 or more) including a first light-emitting region 102a to an n-th light-emitting region 102x and an m layer (m=n−1) including a region 103a formed from a material having a carrier transporting property to a region 103y formed from a material having a carrier transporting property. In this case, each of the layer y (m=n−1) including the region 103a formed from a material having a carrier transporting property to the region 103y formed from a material having a carrier transporting property are formed between each light-emitting regions. A material or the like used for the first light-emitting region 102a to the n-th light-emitting region 102x is the same as the material or the like of the first light-emitting region 102a and the second light-emitting region 102b in FIGS. 1A to 1C. In addition, a material or the like used for the first region 103a formed from a material having a carrier transporting property to the m-th region 103y formed from a material having a carrier transporting property is the same as the region 103 formed from a material having a carrier transporting property in FIGS. 1A to 1C. Therefore, the repeated descriptions are omitted. The corresponding descriptions are referred. It is to be noted that the structures described in FIGS. 1B and 1C can be combined to be used.

The substance which becomes an emission center traps electrons and the regions 103a, 103b, 103c formed from a material having a carrier transporting property reduces carriers going through the light-emitting layer 102 without recombination; accordingly, recombination efficiency of each carriers which are electrons and holes is favorable, and the light-emitting element of the present invention which has the above-described structure can obtain current efficiency (represented by the relation between current density and luminance) which is equal to the conventional light-emitting element having one thick light-emitting layer. In addition, the light-emitting element of the present invention has driving voltage which is lower than that of the conventional light-emitting element having one thick light-emitting layer; therefore, the light-emitting layer with low power consumption can be obtained. Further, when the number of n is too large, driving voltage is considered to be high. The number of n is preferably 2 or more and 5 or less, more preferably 2 or more and 3 or less.

Figure 3A:
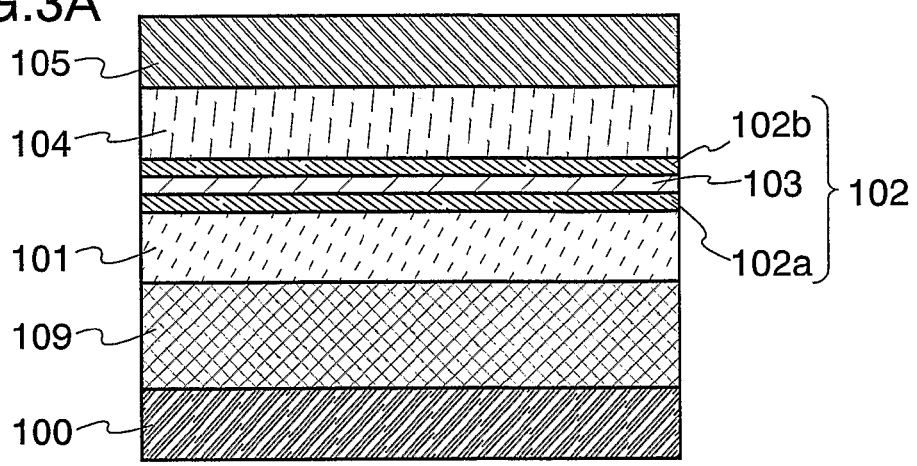
FIGS. 3A to 3C each show a cross-sectional view of a light-emitting element of the present invention.
Figure 3B:
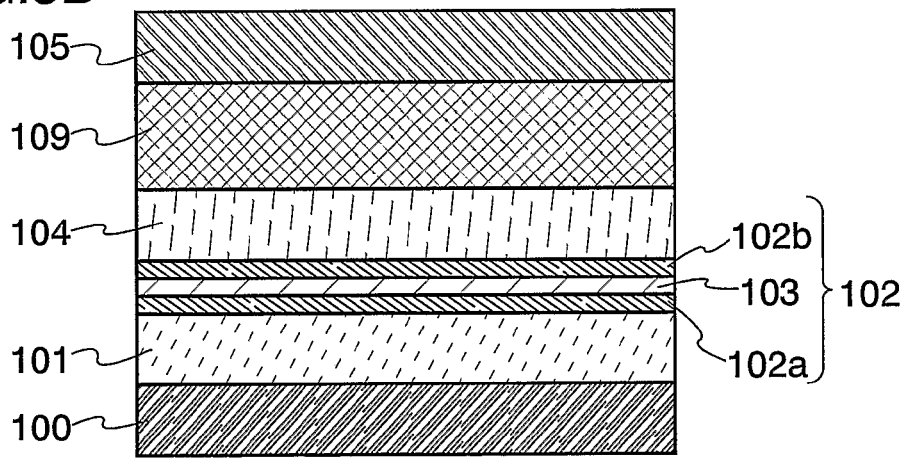
Figure 3C:
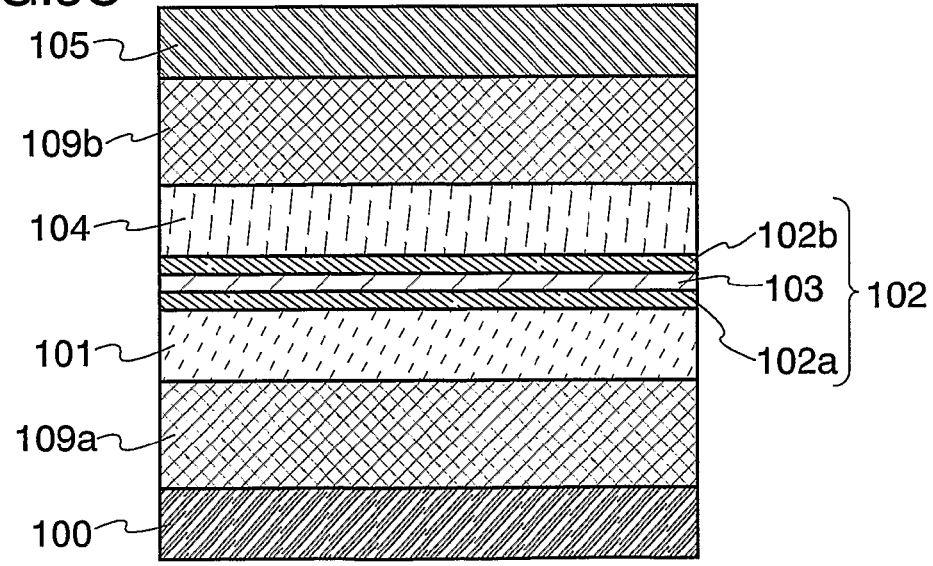

FIGS. 3A to 3C show a structure in which the structure of FIG. 1A is provided with a buffer layer 109 (a first buffer layer 109a and a second buffer layer 109b). When light emission is obtained when seen from the light-emitting layer, the buffer layer 109 which is provided at an electrode side to which high voltage is applied is formed from a composite material of an organic compound having a hole transporting property and a metal compound. As the metal compound, oxide or nitride of transition metal is desirable, and oxide or nitride of metal that belongs to any of Groups 4 to 8 of the periodic table is more desirable. Specifically, vanadium oxide, tantalum oxide, molybdenum oxide, tungsten oxide, rhenium oxide, and ruthenium oxide are preferable. As the organic compound having a hole transporting property, $H_2Pc$, CuPc, VOPc, or the like can be used in addition to an organic material having an aryl amino group such as NPB, TPD, TDATA, MTDATA, DNTPD, m-MTDAB, or TCTA.

In addition, an organic material as shown by the following general formula (1) can also be preferably used as the organic compound having a hole transporting property. As the specific example, 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9- phenylcarbazole (abbreviation: PCzPCA2), or the like can be given. A composite material using the organic compound having this structure is excellent in thermal stability and highly reliable.

5-tris[4-(N-carbazolyl)phenyl]benzene (abbreviation: TCPB), or the like can be given.

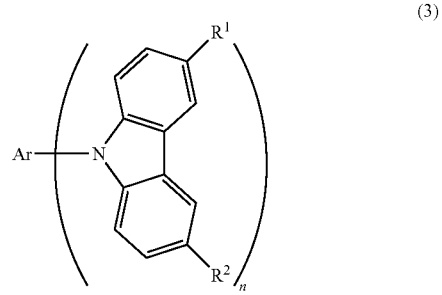

(3)

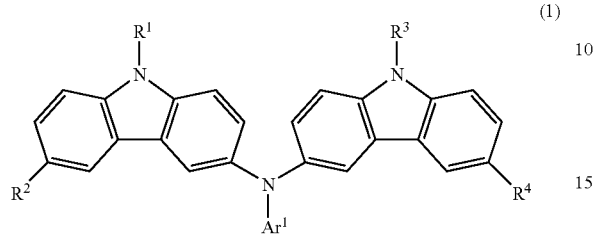

(1)

In the general formula (1), R¹ and R³ may be the same or different from each other. Each of R¹ and R³ represents any one of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon stoms; Ar¹ represents any one of an aryl group having 6 to 25 carbon atoms and a heteroaryl group having 5 to 9 carbon atoms; R² represents any one of hydrogen, an alkyl group having 1 to 6 carbon atoms, and an aryl group having 6 to 12 carbon atoms; and R⁴ represents any one of hydrogen, an alkyl group having 1 to 6 carbon atoms, an aryl group having 6 to 12 carbon atoms, and a substituent shown by a general formula (2).

In the general formula (3), Ar represents an aromatic hydrocarbon group having 6 to 42 carbon atoms, n represents a natural number of 1 to 3, and each of R¹ and R² represents hydrogen, an alkyl group having 1 to 4 carbon atoms, or an aryl group having 6 to 12 carbon atoms.

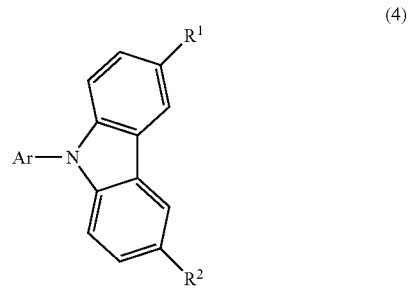

(4)

In the general formula (4), Ar represents a monovalent aromatic hydrocarbon group having 6 to 42 carbon atoms, and each of R¹ and R² represents hydrogen, an alkyl group having 1 to 4 carbon atoms, or an aryl group having 6 to 12 carbon atoms.

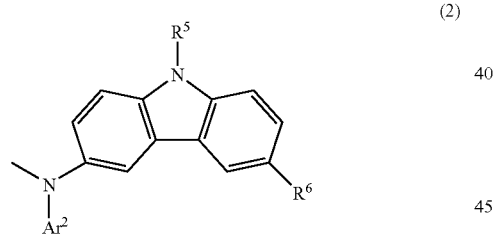

(2)

In the general formula (2), R⁵ represents any one of hydrogen, an alkyl group having 1 to 6 carbon atoms, an aryl group having 6 to 25 carbon atoms, a heteroaryl group having 5 to 9 carbon atoms, an arylalkyl group, and an acyl group having 1 to 7 carbon atoms; Ar² represents any one of an aryl group having 6 to 25 carbon atoms and a heteroaryl group having 5 to 9 carbon atoms; and R⁶ represents any one of hydrogen, an alkyl group having 1 to 6 carbon atoms, and an aryl group having 6 to 12 carbon atoms.

In addition, an organic material as shown by any one of the following general formulas (3) to (6) can also be preferably used. As a specific example of the organic compound shown by any one of the following general formulas (3) to (6), N-(2-naphthyl)carbazole (abbreviation: NCz), 4,4'-di(N-carbazolyl)biphenyl (abbreviation: CBP), 9,10-bis[4-(N-barbazolyl)phenyl]anthracene (abbreviation: BCPA), 3,5-bis[4-(N-carbazolyl)phenyl]biphenyl (abbreviation: BCPBi), 1,3,

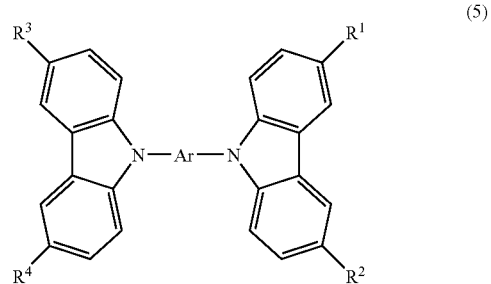

(5)

In the general formula (5), Ar represents a divalent aromatic hydrocarbon group having 6 to 42 carbon atoms, and each of $R^1$ to $R^4$ represents hydrogen, an alkyl group having 1 to 4 carbon atoms, or an aryl group having 6 to 12 carbon atoms.

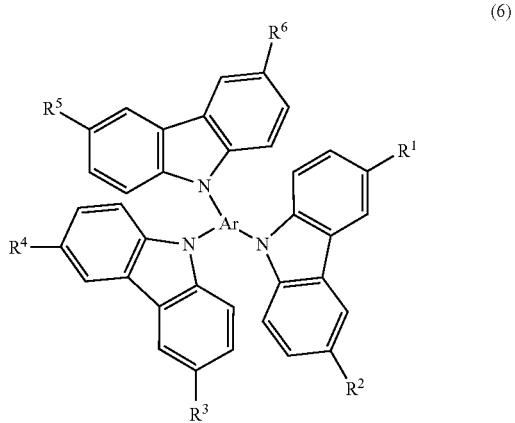

(6)

In the general formula (6), Ar represents a trivalent aromatic hydrocarbon group having 6 to 42 carbon atoms, and each of $R^1$ to $R^6$ represents hydrogen, an alkyl group having 1 to 4 carbon atoms, or an aryl group having 6 to 12 carbon atoms.

Furthermore, aromatic hydrocarbon such as anthracene, 9,10-diphenylanthracene (abbreviation: DPA), 2-tert-buthyl-9,10-di(2-naphthyl)anthracene (abbreviation: t-BuDNA), tetracene, rubrene, or pentacene can also be used. Moreover, aromatic hydrocarbon having a vinyl group such as 4,4'-bis(2,2-diphenylvinyl)biphenyl (abbreviation: CPVBi) or 9,10-bis[4-(2,2-diphenylvinyl)phenyl]anthracene (abbreviation: DPVPA) can also be used.

The buffer layer 109 can be formed by co-evaporating the above-described metal compound and an organic compound having a hole transporting property, and may be formed by any method of a wet method or other methods. Further, it is desirable that the organic compound and the metal compound are included in the buffer layer 109 so that a mass ratio is 95:5 to 20:80, furthermore 90:10 to 50:50.

Further, when seen from the light-emitting layer 102, in a case where the buffer layer 109 is provided at an electrode side to which low voltage is applied, it is preferable that the buffer layer 109 is formed with two layers. Specifically, a layer having a function to generate electrons is further provided at the side closer to the light-emitting layer 102 in the buffer layer 109. The layer having a function to generate electrons may be formed from a transparent conductive material or a composite material of an organic compound having an electron transporting property and an inorganic compound. As the inorganic compound, alkali metal and alkaline earth metal, or oxide or nitride containing those is desirable. Specifically, lithium, sodium, potassium, cesium, magnesium, calcium, strontium, barium, lithium oxide, magnesium nitride, calcium nitride are preferable. Also, as the organic compound having an electron transporting property, for example, a material formed from a metal complex or the like having a quinoline skeleton or a benzoquinoline skeleton such as $Alq_3$, $Almq_3$, $BeBq_2$, or BAlq can be used. Besides, a material formed from a metal complex having a oxazole-based or thiazole-based ligand such as $Zn(BOX)_2$ or $Zn(BTZ)_2$ can be used. Furthermore, PBD, OXD-7, TAZ01, p-EtTAZ, BPhen, BCP, or the like can be used other than the metal complex.

The buffer layer 109 has a role to adjust a light path by adjusting its thickness. Light reflected by the electrode causes interference with light directly emitted to the outside the light emitting element. Light emission can be amplified by adjusting the thickness of the buffer layer 109 and adapting the phases of the light directly emitted to the outside the light-emitting element and the light reflected by the reflective electrode, and higher luminance can be obtained than the luminance when the same current is supplied. In other words, light emission efficiency can be enhanced. In addition, the phase of the light is adapted in a particular wavelength, and therefore, color purity is also enhanced. Even when the material as described above is formed as thick as the wavelength, increase of driving voltage is hardly caused; accordingly, it is possible to perform the optical design as described above.

In addition, by forming the above-described buffer layer 109 over an electrode (a first electrode 100) which is formed earlier, concavity and convexity formed on the electrode can be reduced; accordingly, it is possible to drastically reduce a defect that the first light-emitting region 102a, the second light-emitting region 102b, and the region 103 formed from a material having a carrier transporting property are interrupted due to the concavity and convexity. In the light-emitting element of the present invention, the first light-emitting region 102a, the second light-emitting region 102b, and the region 103 formed from a material having a carrier transporting property are formed to be very thin, and even slight concavity and convexity can cause interruption of the layer; therefore, it is considered to be effective to provide the buffer layer 109.

It is to be noted that the buffer layer 109 can be provided at the first electrode 100 side or a second electrode 105 side, or at both sides.

It is to be noted that the structures of FIGS. 3A to 3C can be appropriately combined with any structure of FIGS. 1A to 1C and FIGS. 2A to 2C.

[Embodiment Mode 2]

In this embodiment mode, a manufacturing method of a light-emitting device of the present invention will be explained with reference to FIGS. 4A to 4E, 5A to 5C, and 6. It is to be noted that an example in which an active matrix light-emitting device which emits light to a counter substrate side is shown; however, the present invention can also be applied to a passive matrix light-emitting device.

Figure 4A:
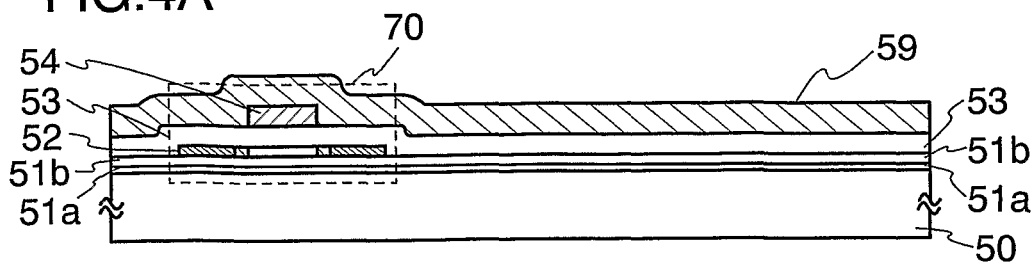
FIGS. 4A to 4E are cross-sectional views each showing a manufacturing method of a light-emitting device of the present invention.

First, after a first base insulating layer 51a and a second base insulating layer 51b are formed over a substrate 50, a semiconductor layer is further formed over the second base insulating layer 51b (FIG. 4A).

As a material for the substrate 50, glass, quartz, plastic (such as polyimide, acrylic, polyethylene terephthalate, polycarbonate, polyacrylate, or polyethersulfone), or the like can be used. These substrates may be used after being polished by CMP or the like. A glass substrate is used in this embodiment mode.

The first base insulating layer 51a and the second base insulating layer 51b are formed to prevent an element in the substrate 50 such as alkali metal or alkaline earth metal which adversely affects characteristics of a semiconductor film from diffusing in the semiconductor layer. As the material, silicon oxide, silicon nitride, silicon oxide containing nitrogen, silicon nitride containing oxygen, or the like can be used. In this embodiment mode, the first base insulating layer 51a is formed of silicon nitride and the second base insulating layer 51b is formed of silicon oxide. The base insulating layer is formed with the first base insulating layer 51a and the second base insulating layer 51b in this embodiment mode; however, the base insulating laser may be formed with a single layer or a multilayer including two or more layers. In addition, if diffusion of an impurity does not bother, the base insulating layer is not necessary to be formed.

The base insulating layer may be formed by processing the surface of the substrate 50 with high density plasma. The high density plasma is, for example, generated by using 2.45 GHz of microwave, and has electron density of $10^{11}$ to $10^{13}/cm^3$, electron temperature of 2 eV or less, and iron energy of 5 eV or less. Such high density plasma has low kinetic energy of active species, and causes less plasma damage as compared with a conventional plasma processing; therefore, a film with less defect can be formed. The distance between an antenna which generates microwave and the substrate 50 is set to be 20 to 80 mm, preferably 20 to 60 mm.

The surface of the substrate 50 can be nitrided by performing the above-described high density plasma in a nitrogen atmosphere, for example an atmosphere containing nitrogen and rare gas, an atmosphere containing nitrogen, hydrogen, and rare gas, or an atmosphere containing ammonia and rare gas. In a case of using a glass substrate, a quartz substrate, a silicon wafer, or the like as the substrate 50 and a case of performing nitriding treatment by the above-described high density plasma, a nitride film formed over the surface of the substrate 50 contains silicon nitride as its main component; therefore, the nitride film can be used as the first base insulating layer 51a. Silicon oxide or silicon oxynitride may be formed by a plasma CVD method over this nitride layer to form the second base insulating layer 51b.

In addition, by performing nitriding treatment by similar high density plasma on the surface of the base insulating layer formed of silicon oxide of silicon oxynitride, a nitride film can be formed over the surface thereof. This nitride film is favorable since it can suppress diffusion of impurities from the substrate 50 and can be formed to be very thin. Therefore, there is little effect of stress to the semiconductor layer formed thereover.

A semiconductor layer which is subsequently formed is obtained by crystallizing an amorphous silicon film by laser in this embodiment mode. The amorphous silicon film is formed to be 25 to 100 nm thick (preferably 30 to 60 nm thick) over the second base insulating layer 51b. As a manufacturing method of the amorphous silicon film, there is a sputtering method, a reduced pressure CVD method, a plasma CVD method, or the like. Thereafter, heat treatment is performed at 500° C. for one hour to perform dehydrogenation.

Subsequently, the amorphous silicon film is crystallized by using a laser irradiation device to form a crystalline silicon film. In this embodiment mode, an excimer laser is used for laser crystallization, and an oscillated laser beam is processed into a linear beam spot by using an optical system and used for emitting to the amorphous silicon film. Thus obtained crystalline silicon film is used as the semiconductor layer.

In addition, as another crystallization method, the amorphous silicon film is crystallized by only thermal treatment or thermal treatment using a catalyst element which promotes crystallization. As the element which promotes crystallization, nickel, iron, palladium, tin, lead, cobalt, platinum, copper, gold, or the like is given. By using such an element, crystallization is performed at lower temperature and for a shorter amount of time as compared with crystallization performed only by thermal treatment; therefore, the glass substrate or the like receives less damage. In a case of performing crystallization only by thermal treatment, a quartz substrate or the like which is resistant to heat may be used as the substrate 50.

Subsequently, a small amount of impurities are added to the semiconductor layer in order to control a threshold value if necessary, which is so-called channel doping. In order to obtain a required threshold value, impurities that impart n type or p type (phosphorus, boron, or the like) are added by an ion doping method or the like.

Thereafter, the semiconductor layer is processed into a predetermined shape as shown in FIG. 4A to obtain an island-shaped semiconductor layer 52. This process is performed by applying a photo resist to the semiconductor layer, exposing a predetermined mask shape, baking, forming a resist mask over the semiconductor layer, and etching the layer by using this mask.

Subsequently, a gate insulating film 53 is formed so as to cover the semiconductor layer 52. The gate insulating film 53 is formed of an insulating film containing silicon to be 40 to 150 nm thick by using a plasma CVD method or a sputtering method. In this embodiment mode, the gate insulating film 53 is formed by using silicon oxide. In this case, the surface of the gate insulating film 53 may be densified by oxidization or nitridation treatment by high density plasma treatment in an oxygen atmosphere or a nitrogen atmosphere.

Further, before forming the gate insulating film 53, the surface of the semiconductor layer 52 may be oxidized or nitrided by high density plasma treatment. At this time, by performing the high density plasma treatment in an oxygen atmosphere or a nitrogen atmosphere by setting the temperature of the substrate 50 at 300 to 450° C., a favorable interface with the gate insulating film 53 which is formed thereover can be formed.

Next, a gate electrode 54 is formed over the gate insulating film 53. The gate electrode 54 may be formed by an element selected from tantalum, tungsten, titanium, molybdenum, aluminum, copper, chromium, and niobium, or an alloy material or a compound material containing the element as its main component. In addition, a semiconductor film typified by a polycrystalline silicon film doped with an impurity element such as phosphorus may be used. AgPdCu alloy may also be used.

Moreover, the gate electrode 54 is formed with a single layer in this embodiment mode; however, the gate electrode 54 may be formed with a stacked layer of two or more layers including tungsten as a lower layer and molybdenum as an upper layer. Even in a case of forming the gate electrode 54 as a stacked layer, the materials described in the former clause may be used. In addition, the combination may be appropriately selected. The gate electrode 54 is processed by etching which uses a mask using a photo resist.

Subsequently, high concentration impurities are added to the semiconductor layer 52 by using the gate electrode 54 as a mask. Accordingly, a thin film transistor 70 including the semiconductor layer 52, the gate insulating film 53, and the gate electrode 54 is formed.

It is to be noted that a manufacturing method of the thin film transistor is not particularly limited, and the manufacturing process may be appropriately changed so that a transistor with a desired structure can be formed.

In this embodiment mode, a top gate thin film transistor using a crystalline silicon film which is crystallized by using laser is used; however, a bottom gate thin film transistor using an amorphous semiconductor film can be used for a pixel portion. Not only silicon but also silicon germanium can be used for an amorphous semiconductor. In a case of using silicon germanium, it is preferable that concentration of germanium is approximately 0.01 to 4.5 atomic %.

In addition, a microcrystalline semiconductor film (semi-amorphous semiconductor) in which a crystal grain of 0.5 to 20 nm can be observed in an amorphous semiconductor can also be used. A microcrystalline semiconductor film in which a crystal grain of 0.5 to 20 nm can be observed is called a so-called microcrystal (μc).

Semiamorphous silicon (also referred to as SAS) which is a semiamorphous semiconductor can be obtained by glow discharge decomposition of gas containing silicon. As the typical gas containing silicon, $SiH_4$ can be given. Besides, $Si_2H_6$, $SiH_2Cl_2$, $SiHCl_3$, $SiCl_4$, $SiF_4$, or the like can be used. SAS can be easily formed by diluting this gas containing silicon with hydrogen or a mixture of hydrogen and one or more rare gas elements selected from helium, argon, krypton, and neon. It is preferable that the gas containing silicon is diluted at dilution ratio of 10 to 1000 times. The generation of a film by reaction of the glow discharge decomposition may be performed at a pressure of 0.1 to 133 Pa. For forming the glow discharge, high-frequency power of 1 to 120 MHz, preferably 13 to 60 MHz may be supplied. The substrate is preferably heated at 300° C. or less, and more preferably at 100 to 250° C.

Raman spectrum of SAS formed in this manner is shifted toward lower wave numbers than 520 $cm^{-1}$. The diffraction peaks of (111) and (220), which are believed to be derived from Si crystal lattice, are observed in the SAS by the X-ray diffraction. The SAS contains hydrogen or halogen of at least 1 atomic % or more to terminate dangling bonds. As impurity elements contained in the film, each concentration of impurities for atmospheric component such as oxygen, nitrogen, and carbon is desirably set to be $1\times10^{20}/cm^3$ or less. In particular, the concentration of oxygen is set to be $5\times10^{19}/cm^3$ or less, and preferably $1\times10^{19}/cm^3$ or less. The mobility (μ) of a TFT using a semiamorphous semiconductor is 1 to 10 $cm^2/$Vsec.

In addition, this SAS may be further crystallized by laser.

Subsequently, an insulating film (hydrogenated film) 59 is formed of silicon nitride so as to cover the gate electrode 54 and the gate insulating film 53. After forming the insulating film (hydrogenated film) 59, the insulating film is heated at 480° C. for one hour to activate an impurity element and hydrogenate the semiconductor layer 52. After forming the insulating film (hydrogenated film) 59, the insulating film (hydrogenated film) 59 may be hydrogenated by high density plasma treatment by introducing hydrogen gas. Accordingly, the layer can be densified. Moreover, the semiconductor layer 52 can be hydrogenated by discharging hydrogen by subsequently performing thermal treatment at 400 to 450° C.

Figure 4B:
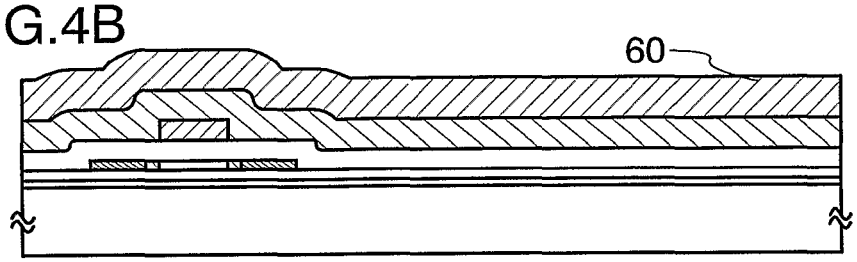
Figure 4C:
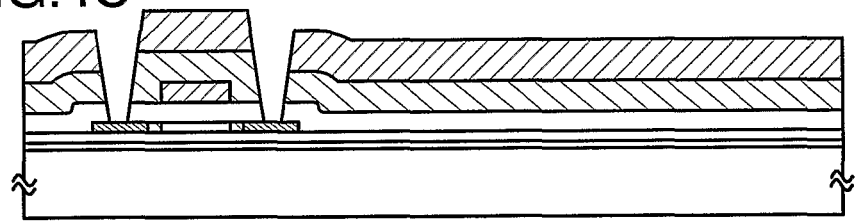
Figure 4D:
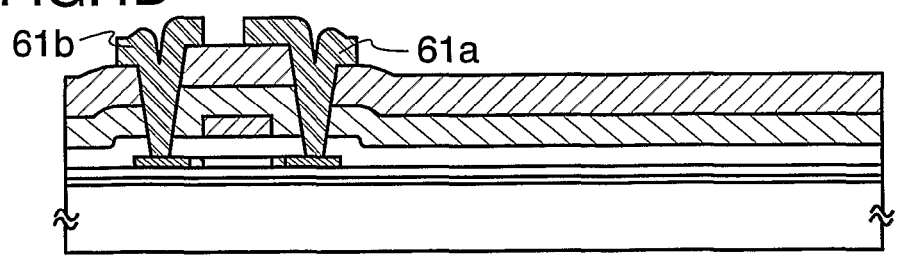

Next, a first interlayer insulating layer 60 which covers the insulating film (hydrogenated film) 59 is formed. As a material for forming the first interlayer insulating layer 60, the following can be used: silicon oxide, acrylic, polyimide, siloxane, a low dielectric material, or the like. In this embodiment mode, a silicon oxide film is formed as the first interlayer insulating layer (FIG. 4B).

Subsequently, contact holes reaching the semiconductor layer 52 are opened. The contact hole can be formed by performing etching until the semiconductor layer 52 is exposed by using a resist mask, for which either of wet etching or dry etching can be used. It is to be noted that etching may be performed once or a plurality of times depending on the conditions. In a case of performing etching a plurality of times, both wet etching and dry etching may be performed (see FIG. 4C).

Then, a conductive layer which covers the contact hole or the first interlayer insulating layer 60 is formed. A connecting portion 61a, a wiring 61b, and the like are formed by processing the conductive layer into a desired shape. This wiring may have a single layer made of aluminum; copper; alloy of aluminum, carbon, and nickel; alloy of aluminum, carbon, and molybdenum; or the like. Moreover, the wiring may have a stacked structure of molybdenum, aluminum, and molybdenum; a stacked structure of titanium, aluminum, and titanium; or a stacked structure of titanium, titanium nitride, aluminum, and titanium from the substrate side.

Figure 4E:
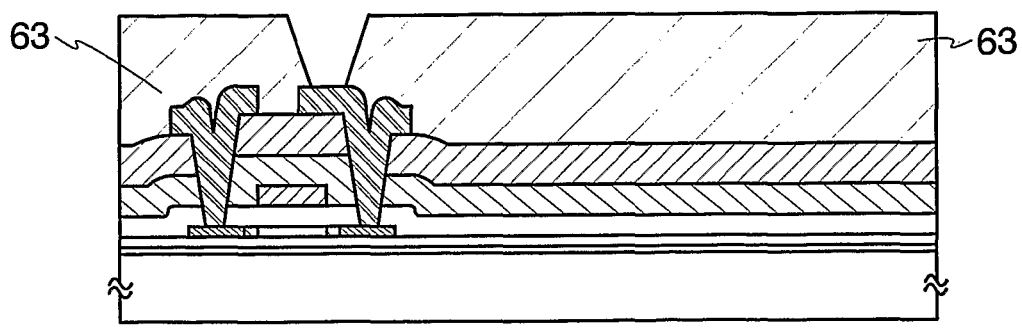

Thereafter, a second interlayer insulating layer 63 is formed so as to cover the connecting portion 61a, the wiring 61b, and the first interlayer insulating layer 60. As a material for the second interlayer insulating layer 63, acrylic, polyimide, siloxane, or the like having a self-planarization property are preferably used. In this embodiment mode, siloxane is used as the second interlayer insulating layer 63 (FIG. 4E).

Subsequently, an insulating layer may be formed of silicon nitride or the like over the second interlayer insulating layer 63. The insulating layer is formed to prevent the second interlayer insulating layer 63 from being etched more than necessary in the following etching of a pixel electrode. Therefore, the insulating layer is not necessary to be formed in a case where etching rate ratio of the pixel electrode and the second interlayer insulating layer is large. Then, a contact hole penetrating the second interlayer insulating layer 63 and reaching the connecting portion 61a is formed.

Then, a conductive layer having a light-transmitting property which covers the contact hole and the second interlayer insulating layer 63 (or the insulating layer) is formed, and the conductive layer having a light-transmitting property is processed to form a first electrode 64 of a thin film light-emitting element. Here, the first electrode 64 is electrically connected to the connecting portion 61a.

As a material of the first electrode 64, the following can be given: the conductive film as shown in Embodiment Mode 1 such as metal having conductivity such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), titanium (Ti); alloy such as alloy formed of aluminum and silicon (Al—Si), alloy formed of aluminum and titanium (Al—Ti), or alloy formed of aluminum, silicon, and copper (Al—Si—Cu); nitride of a metal material such as titanium nitride (TiN); a metal compound such as indium tin oxide (ITO), ITO containing silicon (ITSO), or indium zinc oxide (IZO) in which 2 to 20 wt % of zinc oxide (ZnO) is mixed into indium oxide.

Figure 5A:
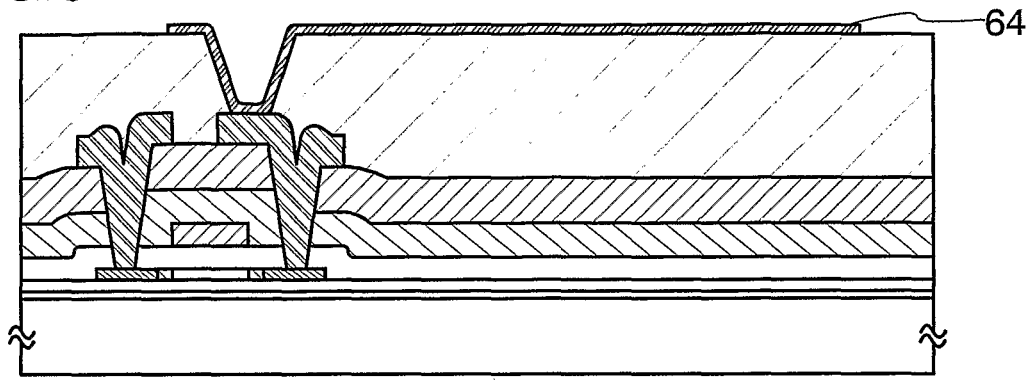
FIGS. 5A to 5C are cross-sectional views each showing a manufacturing method of a light-emitting device of the present invention.

In addition, the electrode from which light emission is extracted may be formed of a conductive film having a light-transmitting property, and a very thin film of metal such as Al or Ag is used, in addition to a metal compound such as indium tin oxide (ITO), ITO containing silicon (ITSO), or indium zinc oxide (IZO) in which 2 to 20 wt % of zinc oxide (ZnO) is mixed into indium oxide. In this embodiment mode, since light emission is extracted from a counter substrate (second electrode) side, it is preferable that the first electrode is formed of a material having high reflectivity (Al, Ag, or the like). In this embodiment mode, the first electrode 64 is formed using aluminum (FIG. 5A)

Figure 5B:
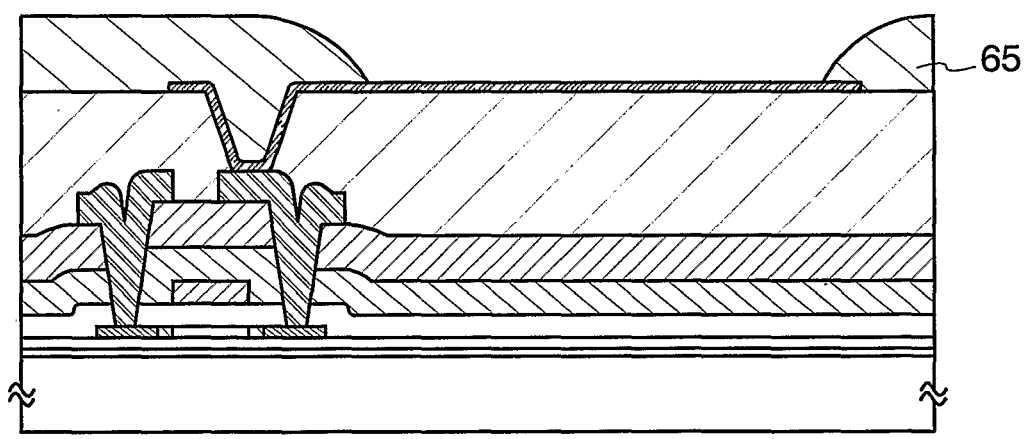
Figure 5C:
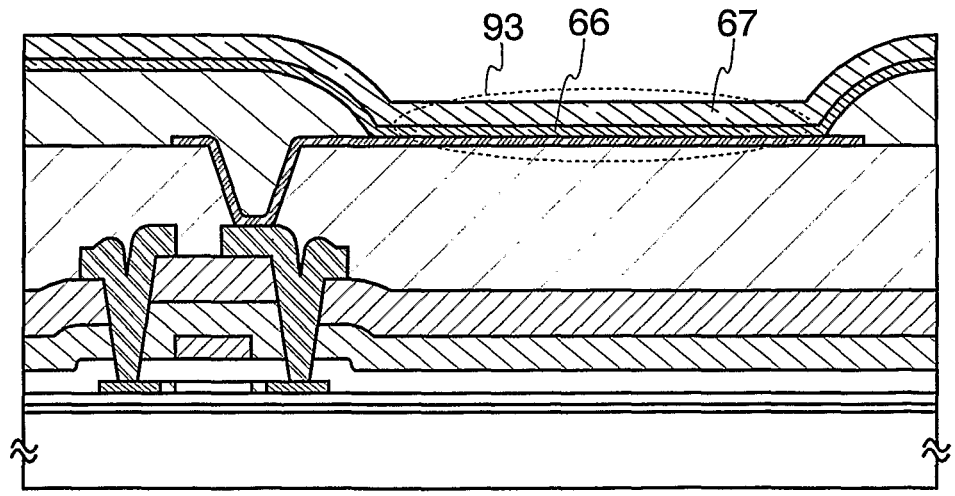

Next, an insulating layer formed from an organic material or an inorganic material is formed so as to cover the second interlayer insulating layer 63 (or the insulating layer) and the first electrode 64. Subsequently, the insulating layer is processed so that part of the first electrode 64 is exposed to form a partition wall 65. As a material of the partition wall 65, a photosensitive organic material (acrylic, polyimide, or the like) is preferably used; however, a non-photosensitive organic material or an inorganic material may be used. In addition, the partition wall 65 may be used as a black matrix by making the partition wall 65 black in such a way that a black pigment or dye such as titanium black or carbon nitride is dispersed into the material of the partition wall 65 using a dispersant or the like. It is desirable that the partition wall 65 has a tapered shape in its end surface toward the first electrode with its curvature changing continuously (FIG. 5B).

Next, a layer 66 containing an organic compound is formed, and then a second electrode 67 which covers the layer 66 containing an organic compound is formed. Accordingly, a light-emitting element 93 in which the layer 66 containing an organic compound is interposed between the first electrode 64 and the second electrode 67 can be formed. In a light-emitting device in which light is emitted from a counter substrate side, the second electrode 67 is formed using a light-transmissive conductive material, and in this embodiment mode, the second electrode 67 is formed of ITSO. Accordingly, the light-emitting element in which the layer 66 containing an organic compound is interposed between the first electrode 64 and the second electrode 67 is formed. The light-emitting element has a structure as shown in Embodiment Mode 1. Thereafter, a silicon oxide film containing nitrogen is formed as a passivation film by a plasma CVD method. A silicon oxynitride film formed of $SiH_4$, $N_2O$, and $NH_3$ by a plasma CVD method; a silicon oxynitride film formed of $SiH_4$ and $N_2O$; or a silicon oxynitride film formed of gas in which $SiH_4$ and $N_2O$ is diluted with Ar may be formed in a case of using a silicon oxide film containing nitrogen.

Moreover, a silicon oxynitride hydrogenated film formed of $SiH_4$, $N_2O$, and $H_2$ may be applied as a passivation film. As a matter of course, a first passivation film is not limited to a single layer, and other insulating layer containing silicon may be used as a single layer or a stacked layer. In addition, a multilayer film including a carbon nitride film and a silicon nitride film, a multilayer film of styrene polymer, a silicon nitride film, or a diamond like carbon film may be formed instead of the silicon oxide film containing nitrogen.

Subsequently, in order to protect the light-emitting element from a substance which promotes deterioration such as water, a display portion is sealed. In a case of using a counter substrate for sealing, the counter substrate is attached to the light-emitting element by using an insulating sealing material which is not shown so that an external connecting portion is exposed. A space between the counter substrate and an element substrate may be filled with an inert gas such as dried nitrogen. Alternatively, the sealing material may be applied to the entire surface of the pixel portion to attach the counter substrate. An ultraviolet curing resin or the like is preferably used for the sealing material. The sealing material may be mixed with a drying agent or particles which keep a gap between the substrates uniform. Then, a flexible wiring substrate is attached to the external connecting portion to complete the light-emitting device (FIG. 6). In this embodiment mode, a light-transmissive resin 88 or the like fills between a counter substrate 94 and the element to perform sealing. Accordingly, the light-emitting element 93 can be prevented from deteriorating due to water. It is desirable that the resin 88 has a hygroscopic property. Furthermore, it is further preferable to disperse a drying agent 89 having a high light-transmitting property in the resin 88, since an effect of moisture can be further suppressed.

It is to be noted that either an analog video signal or a digital video signal may be used in the light-emitting device of the present invention having a display function. In a case of using a digital video signal, the digital video signal is divided into a video signal using voltage and a video signal using current. When the light-emitting element emits light, the video signal inputted to a pixel uses a constant voltage or a constant current. When the video signal uses a constant voltage, the voltage applied to the light-emitting element or the current flowing in the light-emitting element is constant. When the video signal uses a constant current, the voltage applied to the light emitting element or the current flowing in the light-emitting element is constant. The light emitting element to which the constant voltage is applied is driven by constant voltage driving, and the light-emitting element in which the constant current flows is driven by the constant current driving. A constant current flows in the light-emitting element driven by the constant current without the change of the resistance of the light-emitting element. Any one of the driving methods described above can be used for a light-emitting device and the driving method thereof of the present invention.

The light-emitting device having the above-described structure of the present invention operates at low power consumption.

This embodiment mode can be implemented in combination with other appropriate embodiment modes.

[Embodiment Mode 3]

An deposition apparatus used in the present invention and a forming method of a light-emitting element of the present invention by using the deposition apparatus will be explained with reference to FIGS. 12, 13, 14, and 15. This embodiment mode is especially effective to a case where a host material of a light-emitting region and a material for forming a layer having a carrier transporting property are the same. Further, there is a case where a small amount of substance which becomes an emission center is mixed into a layer having a carrier transporting property in a light-emitting element formed by this method.

Figure 15:
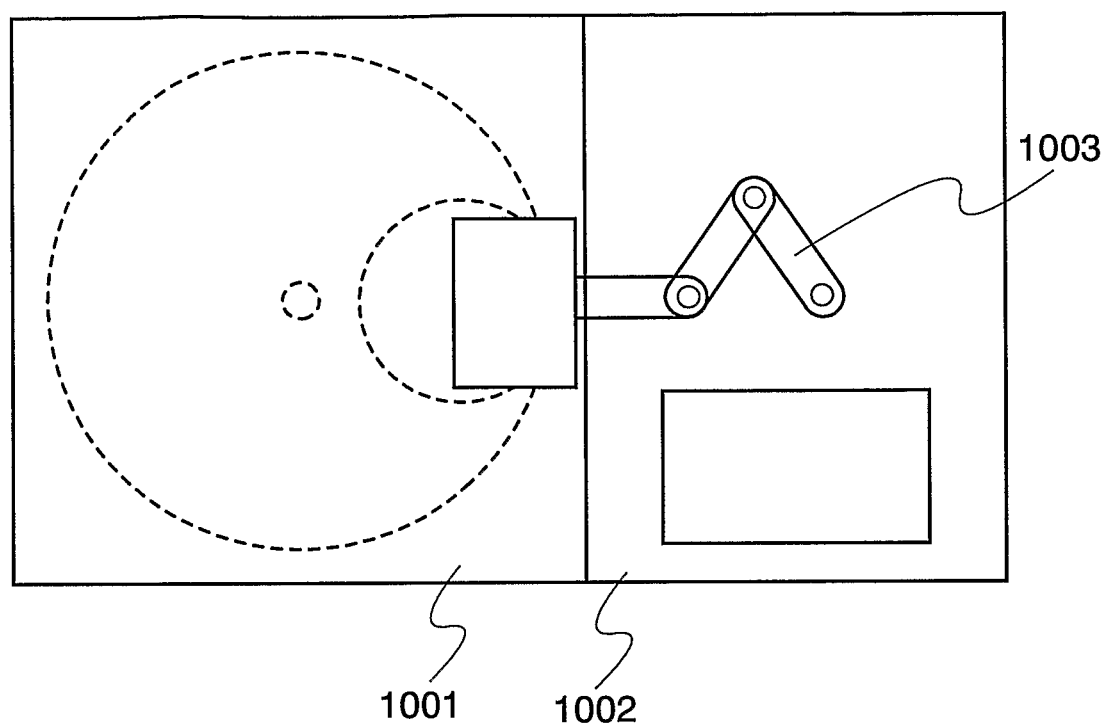
FIG. 15 is a view exemplifying a manufacturing device of a light-emitting region.

The deposition apparatus used for an implementation of the present invention is provided with a transport chamber 1002 in addition to a processing chamber 1001 which performs evaporation to an object to be processed. The object to be processed is transported to the processing chamber 1001 through the transport chamber 1002. The transport chamber 1002 is provided with an arm 1003 for transferring the object to be processed (FIG. 15).

Figure 12:
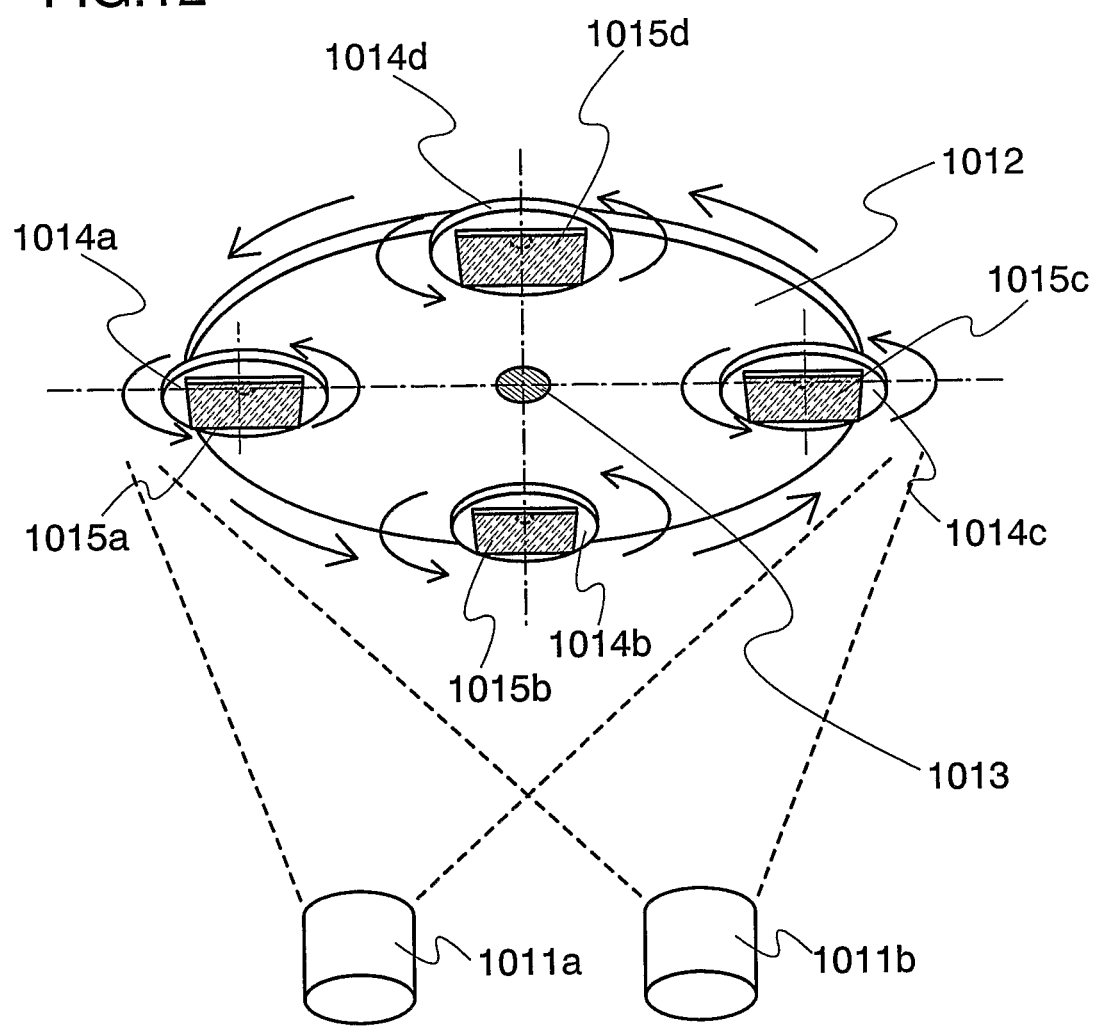
FIG. 12 is a view exemplifying a manufacturing method of a light-emitting region.

As shown in FIG. 12, a holding portion for holding the object to be processed, an evaporation source 1011a in which a first material is held, and an evaporation source 1011b in which a second material is held are provided inside the processing chamber 1001. In FIG. 12, the holding portion for holding the object to be processed is formed by a first rotating plate 1012 which rotates around an axis 1013 and a plurality of second rotating plates 1014a to 1014d provided on the first rotating plate 1012. Each of the second rotating plates 1014a to 1014d independently rotates around axes that are correspondingly provided, differently from the axis 1013. Objects to be processed 1015a to 1015d are held on the second rotating plates 1014a to 1014d, respectively.

In FIG. 12, the objects to be processed 1015a, 1015b, 1015c, and 1015d are held on the second rotating plates 1014a, 1014b, 1014c, and 1014d, respectively.

A light-emitting region is formed as follows. First, a material held in the evaporation sources 1011a and 1011b are heated to sublimate. In addition, the second rotating plates 1014a to 1014d that hold the first rotating plate 1012 and the objects to be processed are rotated. As shown in FIG. 12, when the distance between the object to be processed 1015a and the evaporation source 1011a is shorter than that between the object to be processed 1015a and the evaporation source 1011b, each material is deposited so that the concentration of the first material is higher than that of the second material. On the other hand, the distance between the object to be processed 1015c and the evaporation source 1011b is shorter than that between the object to be processed 1015c and the evaporation source 1011a, each material is deposited so that the concentration of the second material is higher than that of the first material.

Next, when the position of the second rotating plate 1014a inside the processing chamber 1001 is changed by the rotation of the first rotating plate; the object to be processed 1015a is held at the position of the second rotating plate 1014c in FIG. 12; and the distance between the object to be processed 1015a and the evaporation source 1011b is shorter than that between the object to be processed 1015a and the evaporation 1011a, each material is deposited so that the concentration of the second material is higher than that of the first material.

In this manner, by changing the positions of the objects to be processed 1015a to 1015d relative to the evaporation sources 1011a and 1011b, a light-emitting region including a plurality of regions each having different concentration ratio of the contained materials can be formed. Here, the thickness of each region in the stacked direction included in the light-emitting region (length of one cycle of the periodic change in the concentration ratio) may be appropriately changed.

For example, when the rotation speed of the first rotating plate 1012 is increased, one cycle of the change of the concentration ratio of the first material and the second material is shortened. In other words, one cycle of the change of the concentration ratio of a substance which becomes an emission center and a host material is shortened.

In addition, by fixing the rotation speed of the first rotating plate 1012 and increasing the deposition speed from the evaporation source 1011a and the evaporation source 1011b, one cycle of the change of the concentration ratio of the first material and the second material can be lengthened.

Accordingly, by using the deposition apparatus shown in this embodiment mode, for example by using a substance which becomes an emission center as the first material and a host material as the second material, the light-emitting element of the present invention can be easily formed.

In addition, in a case of forming the light-emitting element of the present invention, a method for forming each region by opening and closing a shutter between the evaporation source and the object to be processed can be considered.

Further, in the structure shown by FIG. 12, each of the first rotating plate and the second rotating plate may be rotated individually. For example, only the first rotating plate may be rotated to perform deposition.

Also, the shapes of the first rotating plate 1012 and the second rotating plates 1014a to 1914d are not particularly limited, and polygon such as square may be used in addition to circular as shown in FIG. 12. Moreover, the second rotating plates 1014a to 1014d may not necessarily be formed; however, by providing the second rotating plates 1014a to 1014d, in-plane variation such as a thickness of a layer which is formed to the object to be processed can be reduced.

Figure 13:
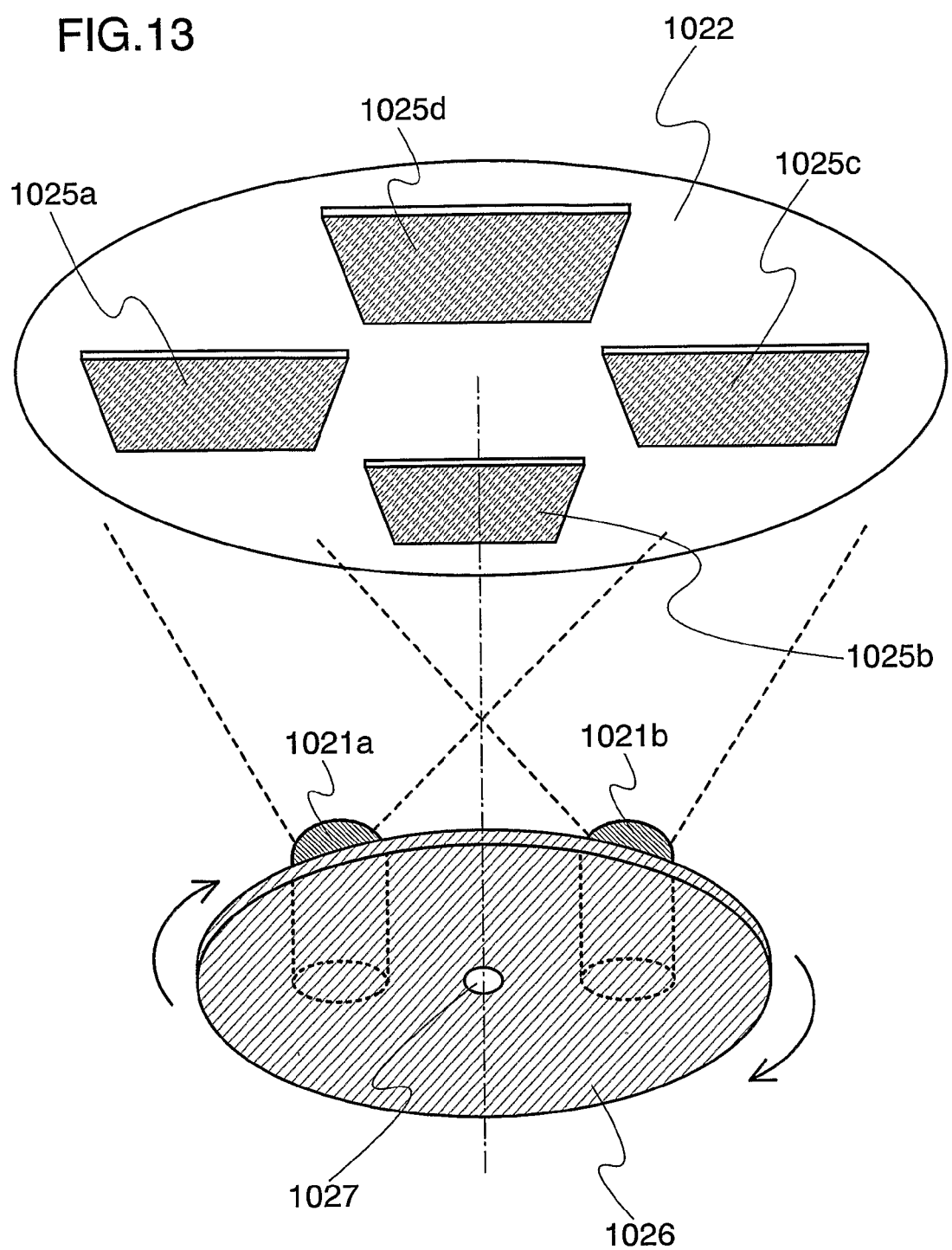
FIG. 13 is a view exemplifying a manufacturing method of a light-emitting region.

The structure inside the processing chamber 1001 is not limited to the structure shown in FIG. 12, and for example, the structure in which the positions of the evaporation sources are changed as shown in FIG. 13 may also be used.

In FIG. 13, evaporation sources 1021a and 1021b are fixed, and a rotating plate 1026 which rotates around an axis 1027 and a holding portion 1022 for holding an object to be processed are provided to face each other. Objects to be processed 1025a to 1025d are held on the holding portion 1022. A first material is held in the evaporation source 1021a and a second material is held in the evaporation source 1021b. When the evaporation sources are placed so that the distance between the evaporation source 1021a and the object to be processed 1025a is shorter than that between the evaporation source 1021b and the object to be processed 1025a, each material is deposited on the object to be processed 1025a so that the concentration of the first material is higher than that of the second material. Also, when the rotating plate 1026 rotates and the distance between the evaporation source 1021b and the object to be processed 1025a is shorter than that between the evaporation source 1021a and the object to be processed 1025a, each material is deposited on the object to be processed 1025a so that the concentration of the second material is higher than that of the first material. As described above, the deposition apparatus may have a structure in which the position of the evaporation source relative to the object to be processed is changed in accordance with the change of the position of the evaporation source. In other words, the evaporation source and the object to be processed may be provided so that each position is relatively changed.

In the case of the structure of FIG. 13, when the rotation speed of the evaporation source 1021a and the evaporation source 1021b is increased, one cycle of the periodic change of the concentration ratio of the first material and the second material is shortened. In other words, one cycle of the change of the concentration ratio of a substance which becomes an emission center and a host material is shortened.

Figure 14:
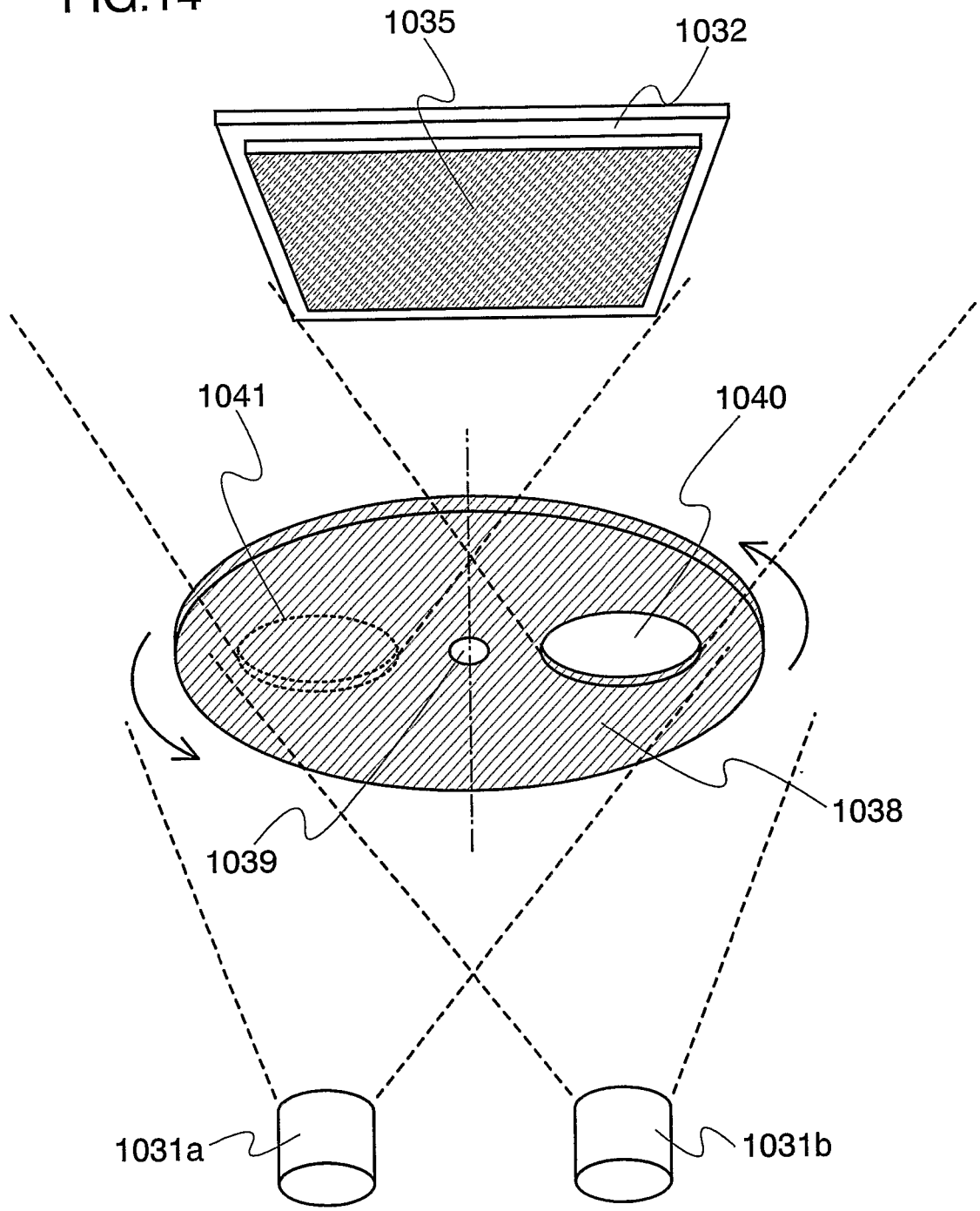
FIG. 14 is a view exemplifying a manufacturing method of a light-emitting region.

In addition to the structures as shown in FIGS. 12 and 13, a structure as shown in FIG. 14 may be used, in which a rotating plate provided with an opening is provided between an evaporation source and a holding portion. This rotating plate functions as a mask when the position of the opening is changed.

In FIG. 14, each of an evaporation source 1031a in which a first material is held and an evaporation source 1031b in which a second material is held is provided so as to face a holding portion 1032 by having a rotating place 1038 provided with an opening 1040 therebetween. The rotating plate 1038 rotates around an axis 1039, and the position of the opening 1040 is changed by the rotation. When the opening 1040 is positioned so as to be closer to the evaporation source 1031a than to the evaporation source 1031b, gas is diffused in a state that the concentration of the first material is higher that that of the second material from the opening 1040 to the holding portion 1032, and each material is deposited to an object to be processed 1035 held by the holding portion 1032 so that the concentration of the first material is higher than that of the second material. Also, if the rotating plate 1038 rotates and the opening 1040 is positioned so as to be closer to the evaporation source 1031b than to the evaporation source 1031a (for example, the opening is positioned as shown by a dashed line 1041), each material is deposited on the object to be processed 1035 so that the concentration of the second material is higher than that of the first material.

In the case of the structure of FIG. 14, when the rotation speed of the rotating plate 1038 is increased, one cycle of the change of the concentration ratio of the first material and the second material is shortened. In other words, one cycle of the change of the concentration ratio of a substance which becomes an emission center and a host material that are included in a light-emitting region is shortened.

As described above, the positions of the evaporation source and the object to be processed are relatively changed, and accordingly, the light-emitting element of the present invention can be formed. The position of the opening provided on the rotating plate functioning as a mask is relatively changed in addition to the evaporation source; accordingly, the light-emitting element of the present invention can be formed.

It is to be noted that the structure of the deposition apparatus is not limited to the one shown in FIG. 15, and for example, a structure in which a sealing chamber for sealing the light-emitting element is further provided may also be employed. In addition, the number of the processing chambers for performing deposition is not limited to one, and two or more of the processing chambers may be provided.

As for the deposition speeds of the evaporation sources of the first material and the second material may be the same or different. For example, by setting the deposition speed of the host material to be approximately the same as the deposition speed of the substance which becomes an emission center, a structure can be obtained, in which a region having high concentration of the host material and a region having high concentration of the substance which becomes an emission center are stacked alternately.

In a case where the deposition speed of the host material is increased and the deposition speed of the substance which becomes an emission center is decreased, a structure can be obtained, in which a region having high concentration of the host material and a region in which the substance which becomes an emission center is dispersed are stacked alternately.

One cycle of the periodic change is changed depending on the distance between a substrate and the evaporation source, the distance between the evaporation sources, the distance between the substrate and the rotating axis, and the like in addition to the rotation speed of the substrate and the evaporation speed; therefore, an optimal value may be appropriately set in each apparatus. Although it depends on a size of the substrate, it is preferable that the distance between the evaporation sources is approximately two times as long as the distance between the center of the substrate and the rotating axis. For example, in a case of using 12×12 cm substrate, the distance between the substrate and the evaporation source is set to be 20 to 40 cm, the distance between the evaporation sources is set to be 15 to 30 cm, the distance between the center of the substrate and the rotating axis is set to be 8 to 15 cm, the deposition speed is set to be 0.2 to 2.0 nm/s, and the rotation speed is set to be 4 to 12 rpm; accordingly, the light-emitting element of the present invention can be formed.

[Embodiment Mode 4]

Figure 7A:
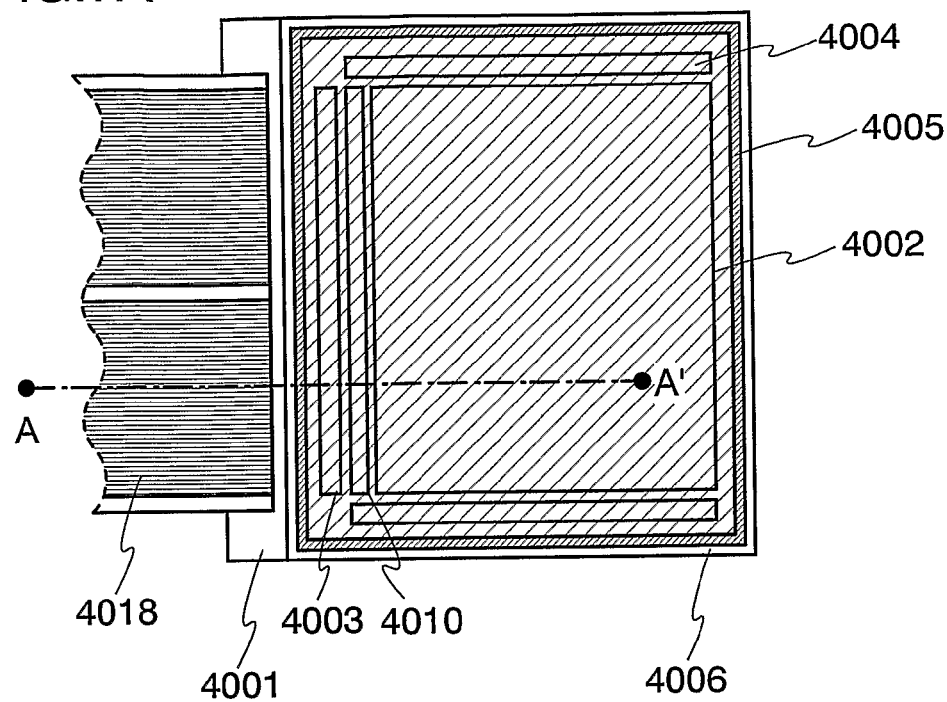
FIGS. 7A and 7B are a top view and a cross-sectional view of a light-emitting device of the present invention.
Figure 7B:
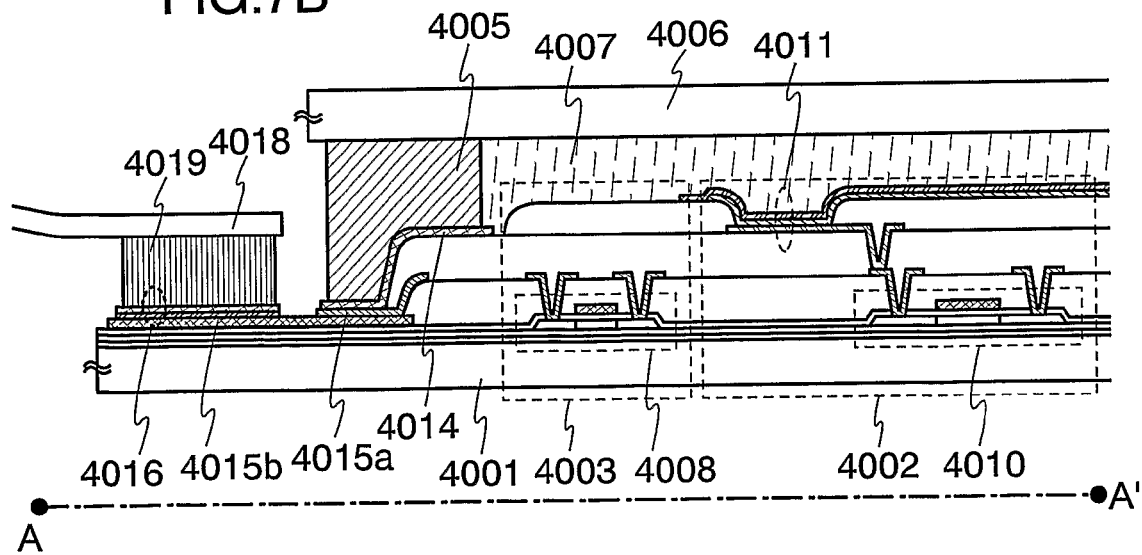

In this embodiment mode, an external appearance of a panel of an active matrix light-emitting device will be explained with reference to FIGS. 7A and 7B. FIG. 7A is a top view of the panel in which a transistor and a light-emitting element formed over a substrate is sealed by a sealing material formed between the substrate and a counter substrate 4006. FIG. 7B corresponds to a cross-sectional view of FIG. 7A. In addition, a structure included in the light-emitting element of this panel is the one as shown in Embodiment Mode 1.

A sealing material 4005 is provided so as to surround a pixel portion 4002, a signal line driver circuit 4003, and a scanning line driver circuit 4004 that are provided over a substrate 4001. In addition, the counter substrate 4006 is provided over the pixel portion 4002, the signal line driver circuit 4003, and the scanning line driver circuit 4004. Accordingly, the pixel portion 4002, the signal line driver circuit 4003, and the scanning line driver circuit 4004 are sealed by the substrate 4001, the sealing material 4005, and the counter substrate 4006 along with a filling material 4007.

The pixel portion 4002, the signal line driver circuit 4003, and the scanning line driver circuit 4004 that are provided over the substrate 4001 have a plurality of thin film transistors. In FIG. 7B, a thin film transistor 4008 included in the signal line driver circuit 4003 and a thin film transistor 4010 included in the pixel portion 4002 are shown in FIG. 7B.

A light-emitting element 4011 is electrically connected to the thin film transistor 4010.

A lead wiring 4014 corresponds to a wiring for supplying a signal or power source voltage to the pixel portion 4002, the signal line driver circuit 4003, and the scanning line driver circuit 4004. The lead wiring 4014 is connected to the connection terminal 4016 through lead wirings 4015a and 4015b. The connection terminal 4016 is electrically connected to a terminal included in a flexible printed circuit (FPC) 4018 through an anisotropic conductive film 4019.

As the filling material 4007, an ultraviolet curing resin or a thermal curing resin can be used in addition to inert gas such as nitrogen or argon, and polyvinyl chloride, acrylic, polyimide, an epoxy resin, a silicone resin, polyvinyl butylal, or ethylene vinylene acetate can be used.

It is to be noted that the light-emitting device of the present invention includes in its category a panel where the pixel portion having the light-emitting element is formed and a module where an IC is mounted on the panel.

The light-emitting device of the present invention having the structure as described above can be a light-emitting device which needs little power consumption.

This embodiment mode can be implemented in combination with other appropriate embodiment modes.

[Embodiment Mode 5]

In this embodiment mode, the panel shown in Embodiment Mode 4, a pixel circuit included in a module, a protection circuit, and operations thereof will be explained.

Figure 8A:
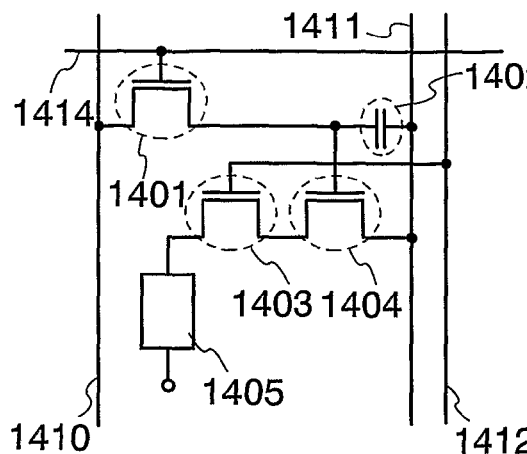
FIGS. 8A to 8F are circuit diagrams each showing one example of a pixel circuit.

In a pixel shown in FIG. 8A, a signal line 1410 and power source lines 1411 and 1412 are arranged in a column direction, and a scanning line 1414 is arranged in a row direction. The pixel also includes a switching TFT 1401, the driving TFT 1403, a current control TFT 1404, a capacitor element 1402, and the light-emitting element 1405.

Figure 8B:
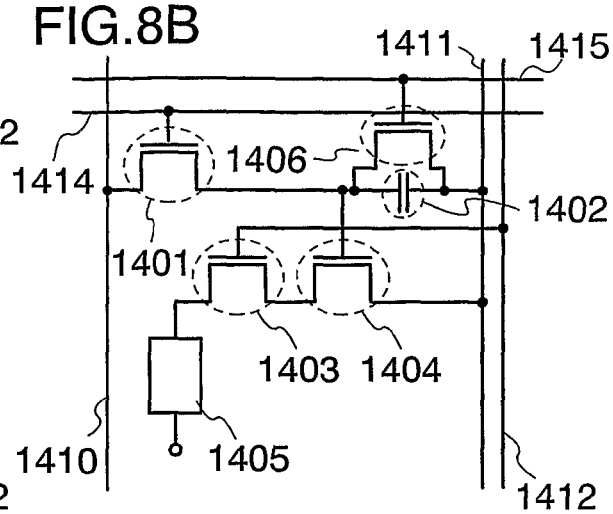
Figure 8C:
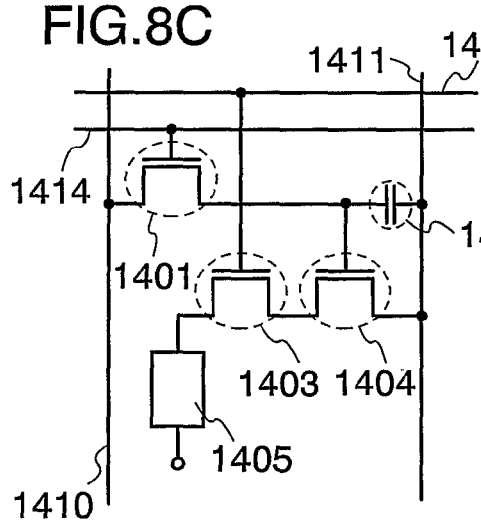

In a pixel shown in FIG. 8C, a gate electrode of the driving TFT 1403 is connected to the power source line 1412 which is arranged in a row direction, and the structure other than that is the same as the pixel shown in FIG. 8A. In other words, both of the pixels shown in FIGS. 8A and 8C show the same equivalent circuit diagram. However, in a case where the power source line 1412 is arranged in a row direction (FIG. 8A) and a case where the power source line 1412 is arranged in a column direction (FIG. 8C), each of power Source lines is formed of a conductive film of a different layer. Here, attention is focused on a wiring to which the gate electrode of the driving TFT 1403 is connected, and in order to indicate that layers for forming these are different, FIGS. 8A and 8C are separately described.

As a feature of the pixel shown in FIGS. 8A and 8C, the driving TFT 1403 and the current controlling TFT 1404 are connected in series. The channel length L (1403) and the channel width W (1403) of the driving TFT 1403 and the channel length L (1404) and the channel width W (1404) of the current controlling TFT 1404 are preferably set so as to satisfy L (1403)/W (1403): L (1404)/W (1404)=5 to 6000:1.

It is to be noted that the driving TFT 1403 operates in a saturation region and has a role to control a current value supplied to the light-emitting element 1405. The current controlling TFT 1404 operates in a linear region and has a function to control a current supply to the light-emitting element 1405. In view of manufacturing steps, it is preferable that both TFTs have the same conductivity type. In this embodiment mode, both TFT are formed as n-channel TFTs. The driving TFT 1403 may be a depletion type TFT as well as an enhancement type TFT. In a light-emitting device of the present invention with the above-described structure, the current controlling TFT 1404 operates in a linear region; therefore, a slight change in Vgs of the current controlling TFT 1404 does not affect a current value supplied to the light-emitting element 1405. That is, the current value of the light-emitting element 1405 can be determined by the driving TFT 1403 which operates in a saturation region. With the above-described structure, such a light-emitting device can be provided in which image quality is enhanced by improving luminance variations of a light-emitting device caused by the variations in characteristics of a TFT.

In the pixels shown in FIGS. 8A to 8D, the switching TFT 1401 controls a video signal inputted to the pixel. When the switching TFT 1401 is turned on, a video signal is inputted to the pixel. Then, the voltage of the video signal is held in the capacitor element 1402. It is to be noted that the capacitor element 1402 is provided in FIGS. 8A and 8C; however, the invention is not limited to this. When gate capacitance or the like is large enough to hold the video signal, the capacitor element 1402 is not required to be provided.

Figure 8D:
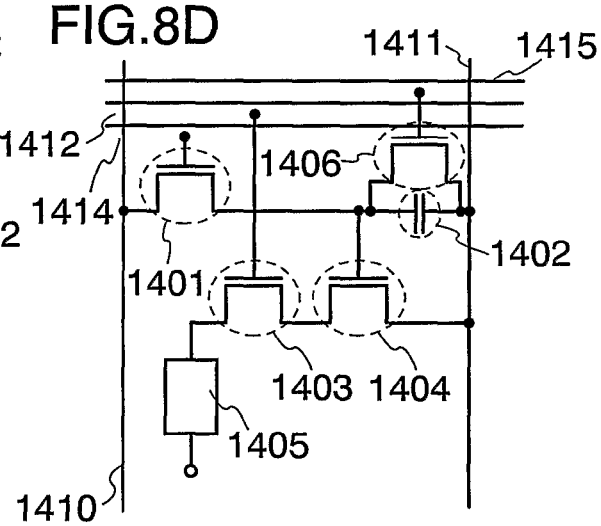

The pixel shown in FIG. 8B is the same as the pixel structure shown in FIG. 8A except for that a TFT 1406 and the scanning line 1414 are additionally provided. Similarly, the pixel shown in FIG. 8D is the same as the pixel structure shown in FIG. 8C except for that the TFT 1406 and the scanning line 1414 are additionally provided. The TFT 1406 is controlled to be on or off by the scanning line 1414 which is anew placed. When the TFT 1406 is turned on, the charge held in the capacitor element 1402 is discharged; thereby the current controlling TFT 1404 is turned off. That is, by providing the TFT 1406, a current supply to the light-emitting element 1405 can be forcibly blocked. Therefore, the TFT 1406 can be called an erasing TFT. As a result, with the structures shown in FIGS. 8B and 8D, the duty ratio can be enhanced since a lighting period can start at the same time or right after a writing period without waiting for signals for all the pixels to be written.

Figure 8E:
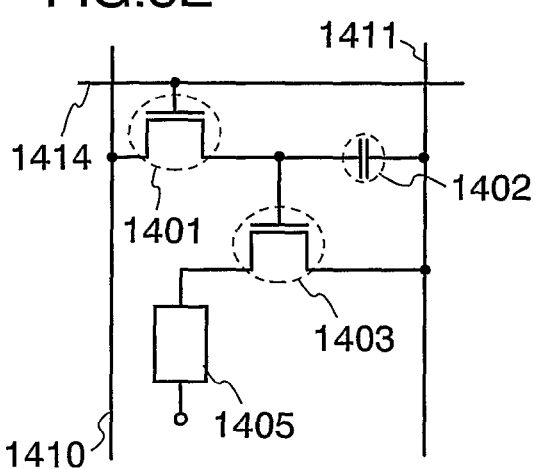
Figure 8F:
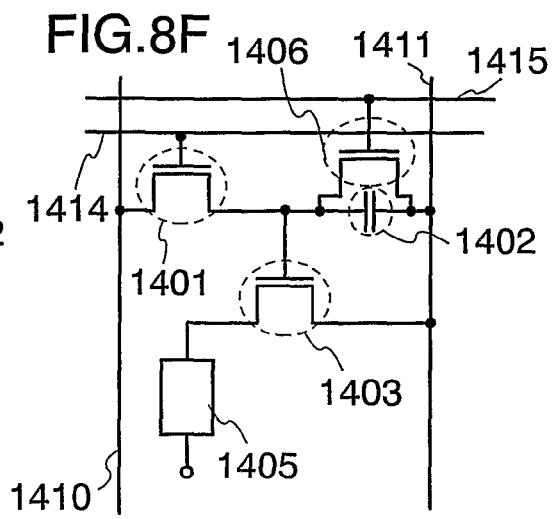

In a pixel shown in FIG. 8E, the signal line 1410 and the power source line 1411 are provided in a column direction and the scanning line 1414 is provided in a row direction. In addition, the switching TFT 1401, the driving TFT 1403, the capacitor element 1402, and the light-emitting element 1405 are provided. A pixel shown in FIG. 8F is the same as the pixel structure shown in FIG. 8E except for that the TFT 1406 and the scanning line 1415 are additionally provided. It is to be noted that the duty ratio can be enhanced in the structure shown in FIG. 8F as well by placing the TFT 1406.

Figure 10:
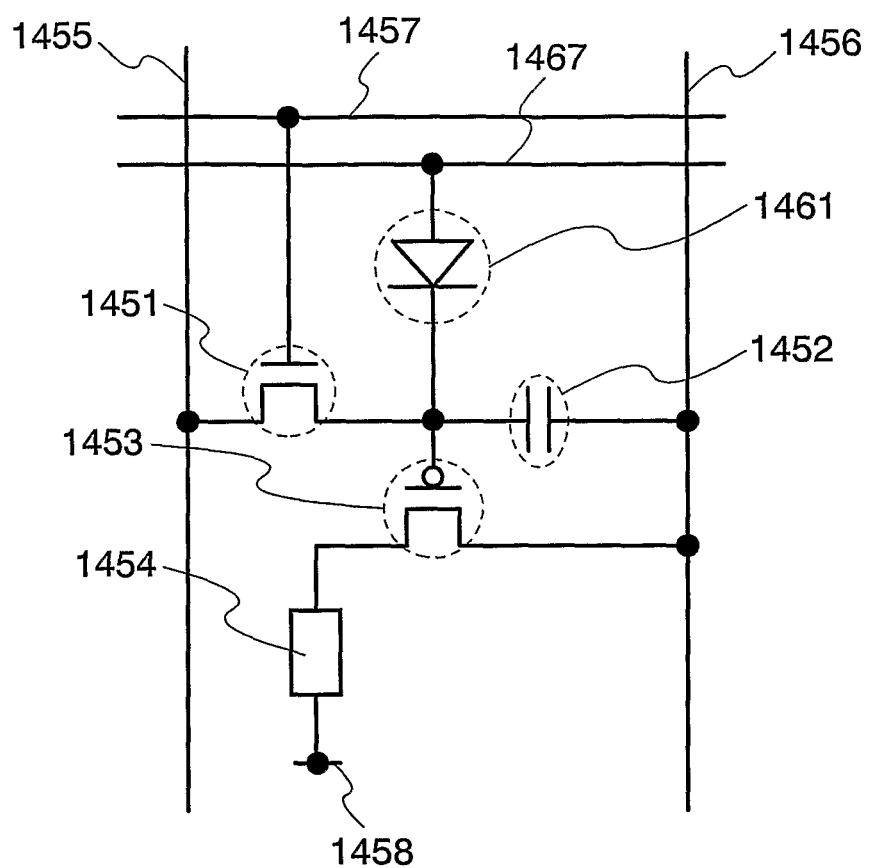
FIG. 10 is a circuit diagram showing one example of a pixel circuit.

FIG. 10 is a pixel structure example of a case where the driving TFT 1403 is forcibly turned off. A selecting TFT 1451, a driving TFT 1453, an erasing diode 1461, and a light-emitting element 1454 are provided. A source and a drain of the selecting TFT 1451 are each connected to a signal line 1455 and a gate of the driving TFT 1453. A gate of the selecting TFT 1451 is connected to a first gate line 1457. A source and a drain of the driving TFT 1453 are each connected to a first power source line 1456 and the light-emitting element 1454. An erasing diode 1461 is connected to the gate of the driving TFT 1453 and a second gate line 1467.

The capacitor element 1452 has a function to hold gate potential of the driving TFT 1453. Therefore, the capacitor element 1452 is connected between the gate of the driving TFT 1453 and the power source line 1456; however, the present invention is not limited to this. The capacitor element 1452 is only required to be provided so as to be able to hold the gate potential of the driving TFT 1453. Moreover, in a case where the gate capacitance of the driving TFT 1453 is large enough to hold the gate potential of the driving TFT 1453, the capacitor element 1452 may be omitted.

As an operating method, the first gate line 1457 is selected, the selecting TFT 1451 is turned on, and a signal is inputted from the signal line 1455 to the capacitor element 1452. Then, current of the driving TFT 1453 is controlled in accordance with the signal. Current flows from the first power source line 1456 through the light emitting element 1454 to a second power source line 1458.

In a case where a signal is required to be erased, the second gate line 1467 is selected (high potential here) to turn on the erasing diode 1461; thereby, current flows from the second gate line 1467 to the gate of the driving TFT 1453. As a result, the driving TFT 1453 is turned off. Then, current does not flow through the light emitting element 1454 to the second power source line 1458. Consequently, a non-lighting period can be formed, and a length of a lighting period can be freely controlled. In a case where a signal is required to be held, the second gate line 1467 is non-selected (low potential here). Then, the erasing diode 1461 is turned off; therefore, the gate potential of the driving TFT 1453 is held.

It is to be noted that the erasing diode 1461 may be any elements having a rectifying property. It may be a PN diode, a PIN diode, a Schottky diode, or a Zener diode.

As described above, various pixel circuits can be employed. In particular, in a case of forming a thin film transistor using an amorphous semiconductor film, it is preferable that the semiconductor films of the driving TFTs 1403 and 1453 be formed large. Therefore, it is preferable that the above-described pixel structure has a top light emission type in which light is emitted from a light emission stacked-layer to the counter substrate side.

Such an active matrix light emitting device is considered to be advantageous in that it can be driven at a low voltage when the pixel density is increased since a TFT is provided for each pixel.

In this embodiment mode, the active matrix light-emitting device in which a TFT is provided in each pixel is explained; however, the present invention can also be applied to a passive matrix light-emitting device. A passive matrix light-emitting device has high aperture ratio since a TFT is not provided in each pixel. In a case of a light-emitting device in which light is emitted to both sides of a light emission stacked-layer, the light transmittance is enhanced when a passive matrix light-emitting device is used.

Next, a case where a diode is provided for the scanning line and the signal line as a protection circuit is explained with reference to the equivalent circuit shown in FIG. 8E.

Figure 9:
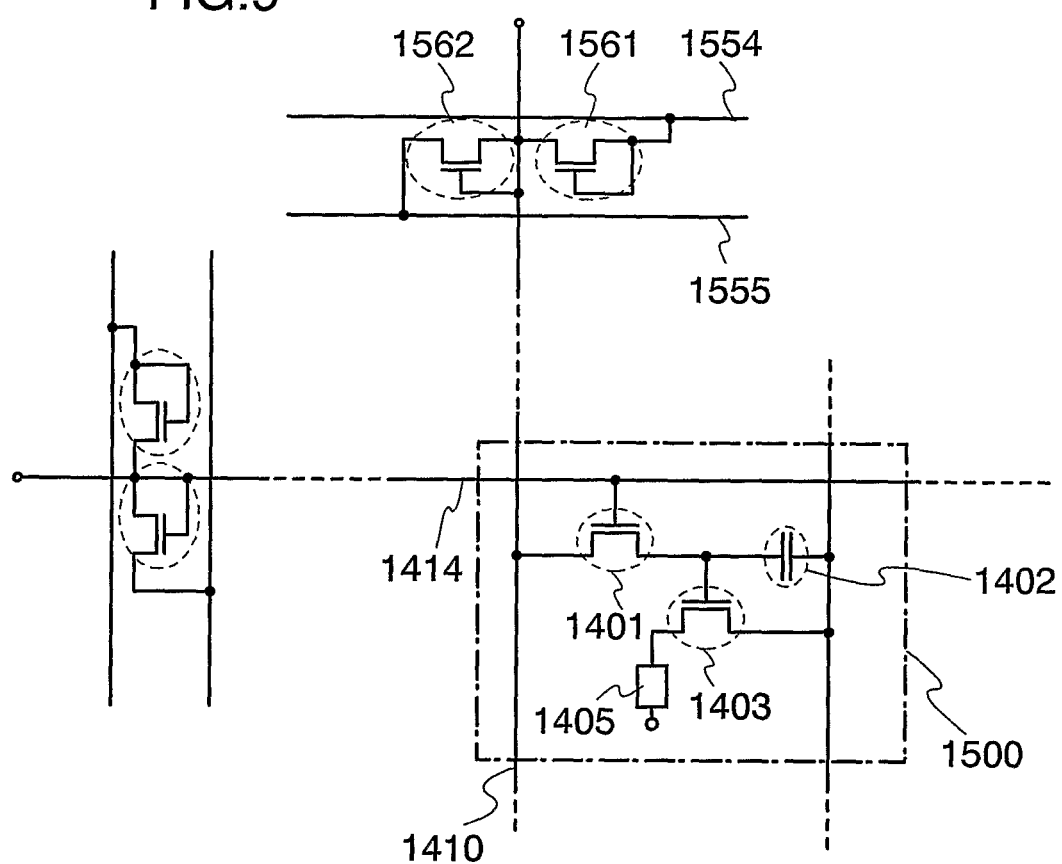
FIG. 9 is a circuit diagram showing one example of a protection circuit.

In FIG. 9, the switching TFTs 1401 and 1403, the capacitor element 1402, and the light-emitting element 1405 are provided in a pixel portion 1500. The signal line 1410 is provided with diodes 1561 and 1562. The diodes 1561 and 1562 are formed in accordance with the above-described embodiment mode similarly to the switching TFT 1401 or 1403, and have a gate electrode, a semiconductor layer, a source electrode, a drain electrode, or the like. The diodes 1561 and 1562 operate as diodes by connecting the gate electrode to the drain electrode or the source electrode. Common potential lines 1554 and 1555 that are connected to the diodes are formed of the same layer as the gate electrode. Therefore, a contact hole is required to be formed in a gate insulating layer so that the common potential lines 1554 and 1555 are connected to the source electrode or the drain electrode of the diode.

A diode provided for the scanning line 1414 has a similar structure.

As described above, by the present invention, a protection diode provided for an input stage can be concurrently formed. It is to be noted that the position of the protection diode is not limited to this, and the protection diode can be provided between the driver circuit and the pixel.

The light-emitting device having such a protection circuit needs little power consumption. In addition, with the above-described structure, reliability as the light-emitting device can be further enhanced.

[Embodiment Mode 6]

As electronic devices of the present invention mounted with the light-emitting device (module) of the present invention, the following can be given: a camera such as a video camera or a digital camera, a goggle type display (head mounted display), a navigation system, an audio reproducing device (a car audio component set or the like), a computer, a game machine, a mobile information terminal (mobile computer, mobile phone, mobile game machine, electronic book, or the like), an image reproducing device provided with a recording medium (specifically, a device which reproduces a recording medium such as a DVD (Digital Versatile Disc) and includes a display capable of displaying the reproduced image), and the like. Specific examples of these electronic devices are shown in FIGS. 11A to 11E.

Figure 11A:
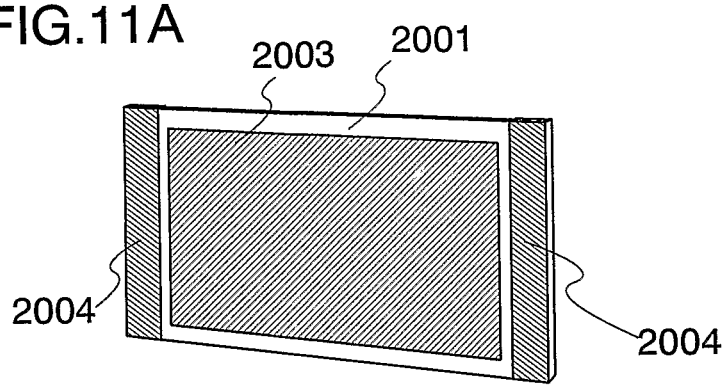
FIGS. 11A to 11E are views each showing an electronic device of the present invention.

FIG. 11A shows a light-emitting device, and a television receiver and a monitor of a personal computer corresponds to this. A housing 2001, a display portion 2003, a speaker portion 2004, and the like are included. The light-emitting device of the present invention needs little power consumption. A polarizing plate or a circular polarizing plate is preferably provided in a pixel portion in order to enhance the contrast. For example, a ¼ λ plate, a ½ λ plate, and a polarizing plate are preferably provided over a counter substrate in this order. Moreover, a reflection preventing film may also be provided over the polarizing plate.

Figure 11B:
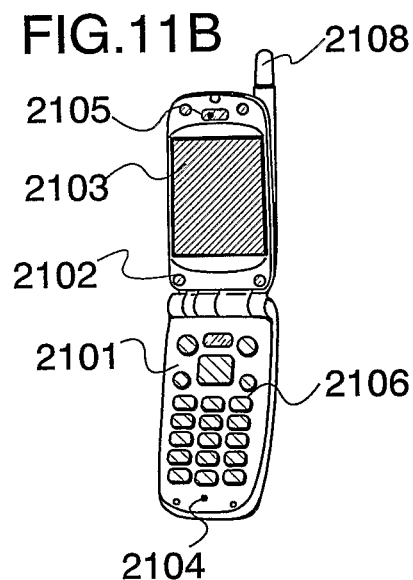

FIG. 11B shows a cellular phone, which includes a main body 2101, a housing 2102, a display portion 2103, an audio input portion 2104, an audio output portion 2105, an operation key 2106, an antenna 2108, and the like. The cellular phone of the present invention needs little power consumption.

Figure 11C:
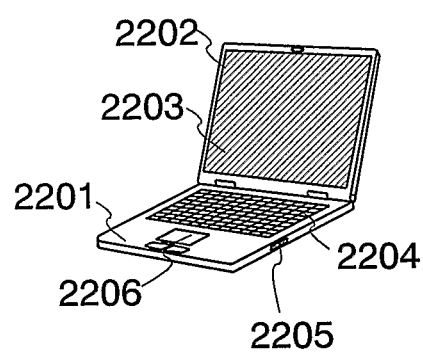

FIG. 11C shows a computer, which includes a main body 2201, a housing 2202, a display portion 2203, a keyboard 2204, an external connecting port 2205, a pointing mouse 2206, and the like. The computer of the present invention needs little power consumption. FIG. 11C exemplifies a laptop computer; however, the present invention can also be applied to a desktop computer or the like.

Figure 11D:
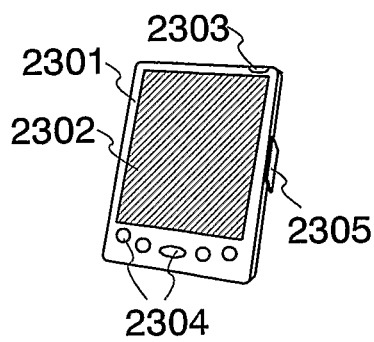

FIG. 11D shows a mobile computer, which includes a main body 2301, a display portion 2302, a switch 2303, an operation key 2304, an infrared port 2305, and the like. The mobile computer of the present invention needs little power consumption.

Figure 11E:
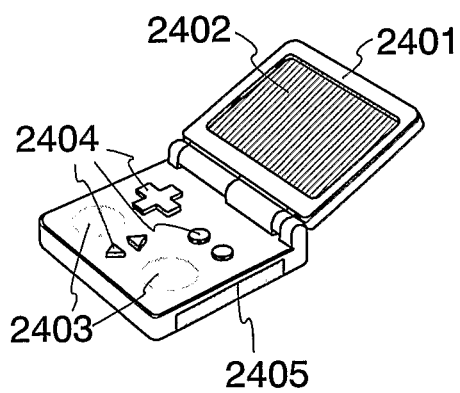

FIG. 11E shows a mobile game machine, which includes a housing 2401, a display portion 2402, a speaker portion 2403, an operation key 2404, a recording medium insert portion 2405, and the like. The mobile game machine of the present invention needs little power.

As described above, the application range of the present invention is quite wide, and the present invention can be used for electronic devices of any field.

The present invention can be implemented in combination with other appropriate embodiment modes.

[Embodiment 1]

In this embodiment, five kinds of light-emitting elements each having a different structure were manufactured, and measurement results of element characteristics are shown. An element 2 and an element 3 are light-emitting elements of the present invention. The element 2 and the element 3 have a light-emitting layer provided with a two layered light-emitting region and a three layered light-emitting region, respectively. The thickness of each of the light-emitting regions is 2 nm, and a region formed from a material having a carrier transporting property is provided to be 2 nm between the light-emitting regions. An element 1 has a one layered light-emitting region of a light-emitting layer, and its thickness is 2 nm. Each of an element 4 and an element 5 has a light-emitting layer provided with one layered light-emitting region. In addition, a region formed from a material having a carrier transporting property is provided at both of the electrode sides of the light-emitting layer of the elements 1 to 4 to be 2 nm thick, whereas the region is not provided for the element 5. The other structures in the light-emitting elements are all the same. ITSO as a first electrode, DNTPD (a thickness of 40 nm) as a first carrier injecting layer, NPB (a thickness of 20 nm) as a first carrier transporting layer, TAZ01 (a thickness of 20 nm) as a second carrier transporting layer, and a composite material formed from TAZ01 and Li (TAZ01: Li=1:0.01 in weight ratio, and a film thickness of 40 nm) as a second carrier injecting layer were used. When light emission is obtained from the light-emitting layer, a structure in which voltage is applied so that voltage of the first electrode is higher is used, and the above-described region formed from a material having a carrier transporting property and light-emitting layer provided with the light-emitting region are interposed between the first carrier transporting layer and the second carrier transporting layer. Moreover, CBP was used for a material used for the region formed from a material having a carrier transporting property and a host material of the light-emitting region, and Ir(Fdpq)$_2$(acac) was used for a substance which becomes an emission center. CBP and Ir(Fdpq)$_2$(acac) in the light-emitting region were set to be 1:0.08 in weight ratio. It is to be noted that a material in which Ir(Fdpq)$_2$(acac) was dispersed in CBP is hereinafter denoted by CBP: Ir(Fdpq)$_2$(acac), and a material in which Li was dispersed in TAZ01 is hereinafter denoted by TAZ: Li as a matter of convenience. In addition, the material used in this embodiment is shown below. The general formula (7-1) shows DNTPD, the general formula (7-2) shows NPB, the general formula (7-3) shows TAZ01, the general formula (7-4) shows CBP, and the general formula (7-5) shows Ir(Fdpq)$_2$(acac).

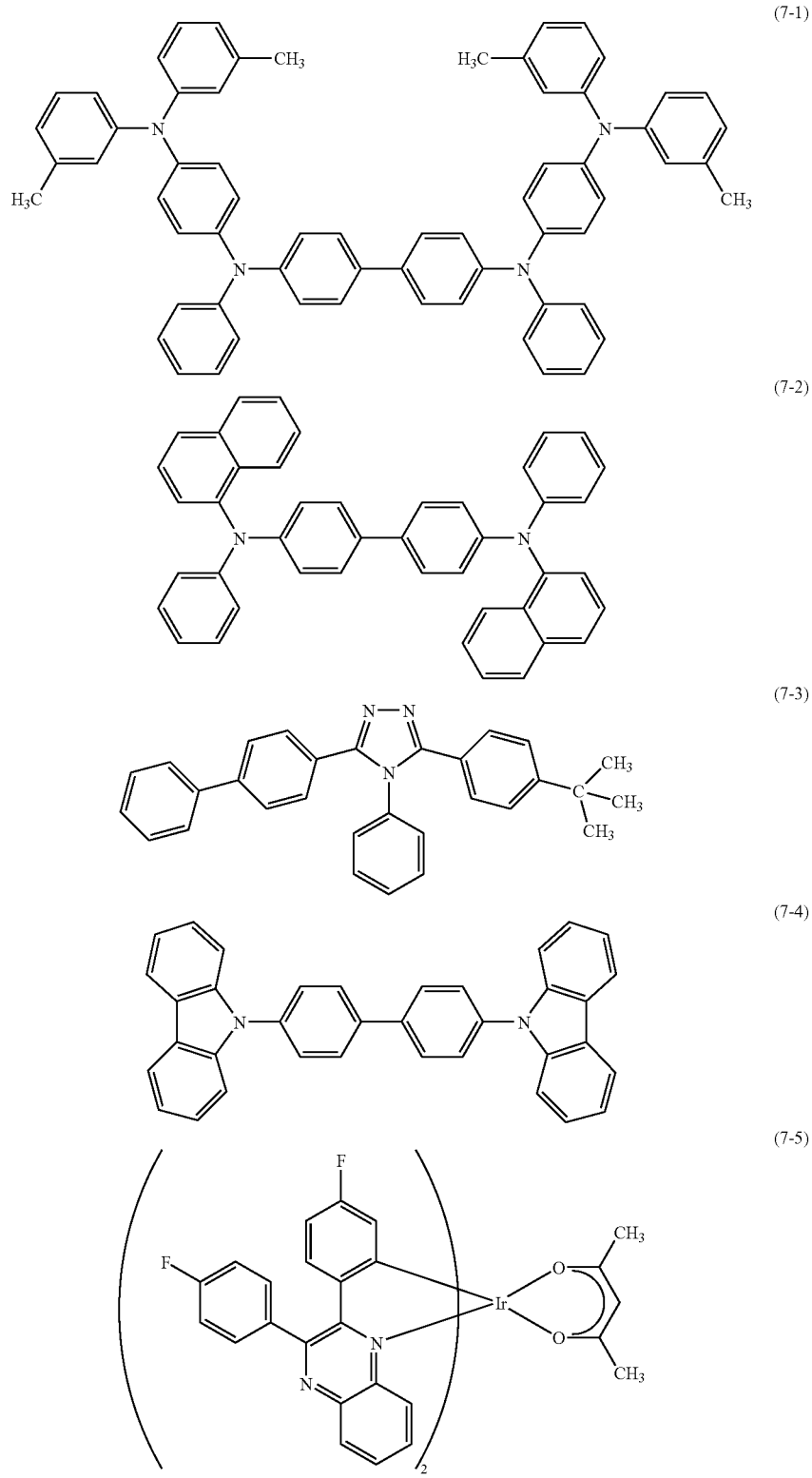

(7-1)

(7-2)

(7-3)

(7-4)

(7-5)

A manufacturing method of the element is shown. The element is formed over a glass substrate, and ITSO is formed to be 110 nm thick sequentially from the glass substrate side as a first electrode. The ITSO was deposited by a sputtering method. In the present invention, a shape of the first electrode was set to be 2×2 mm. Next, as a pretreatment for forming a layer containing an organic compound over the first electrode, a surface of the substrate was washed by a porous resin (representatively, made of PVA (polyvinyl alcohol), nylon, or the like), heat treatment was performed at 200° C. for one hour, and UV ozone treatment was performed for 370 seconds. Subsequently, DNTPD was deposited to be 40 nm thick and NPB was deposited to be 20 nm thick. Over these stacked film, 2 nm of CBP, 2 nm of CBP:Ir(Fdpq)$_2$(acac), and 2 nm of CBP were stacked in the element 1; 2 nM of CBP, 2 nm of CBP: Ir(Fdpq)$_2$(acac), 2 nm of CBP, 2 nm of CBP: Ir(Fdpq)$_2$(acac), and 2 nm of CBP were stacked in the element 2; 2 nm of CBP, 2 nm of CBP:Ir(Fdpq)$_2$(acac), 2 nm of CBP, 2 nm of CBP: Ir(Fdpq)$_2$(acac), 2 nm of CBP, 2 nm of CBP: Ir(Fdpq)$_2$(acac), and 2 nm of CBP were stacked in the element 3; 2 nm of CBP, 30 nm of CBP: Ir(Fdpq)$_2$(acac), and 2 nm of CBP were stacked in the element 4; and 30 nm of CBP: Ir(Fdpq)$_2$(acac) was deposited in the element 5. Then, TAZ01 was deposited to be 20 nm and TAZ 01: Li was deposited to be 40 nm. Finally, Al was deposited to be 200 nm as a second electrode to complete the element. It is to be noted that a vacuum evaporation method by resistance heating was used for expect for the first electrode.

Table 1 shows voltage, chromaticity, and light emission efficiency of each element in a case of approximately 1000 cd/m$^2$.

TABLE 1

|  | voltage (V) | chromaticity x | chromaticity y | current efficiency (cd/A) | power efficiency (lm/W) |
| --- | --- | --- | --- | --- | --- |
| element 1 | 11.4 | 0.63 | 0.27 | 1.9 | 0.62 |
| element 2 | 11.2 | 0.70 | 0.29 | 2.8 | 0.88 |
| element 3 | 11.6 | 0.70 | 0.28 | 3.1 | 0.92 |
| element 4 | 13.6 | 0.71 | 0.28 | 3.1 | 0.80 |
| element 5 | 14.6 | 0.71 | 0.29 | 2.3 | 0.54 |

Figure 16A:
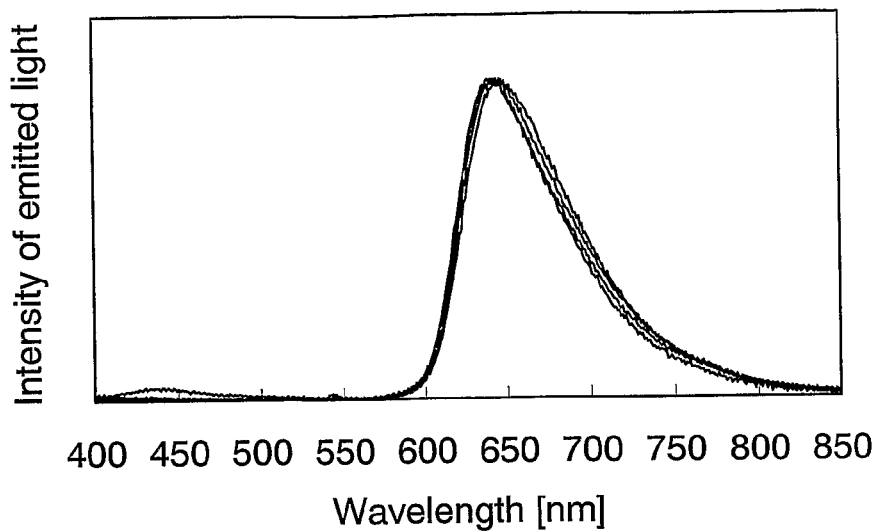
FIGS. 16A to 16C each show light-emission spectra of elements 1 to 5.
Figure 16B:
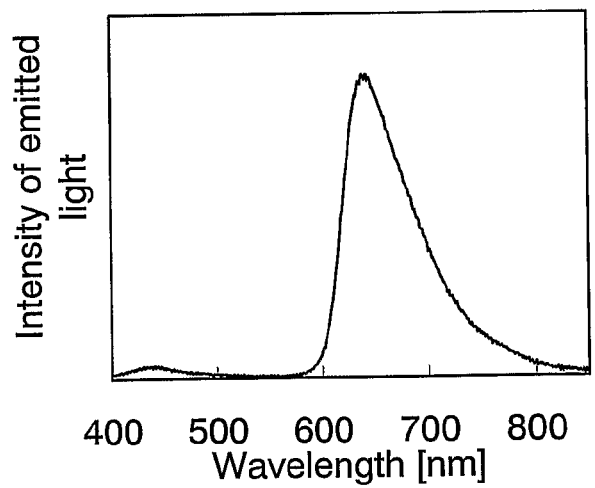
Figure 16C:
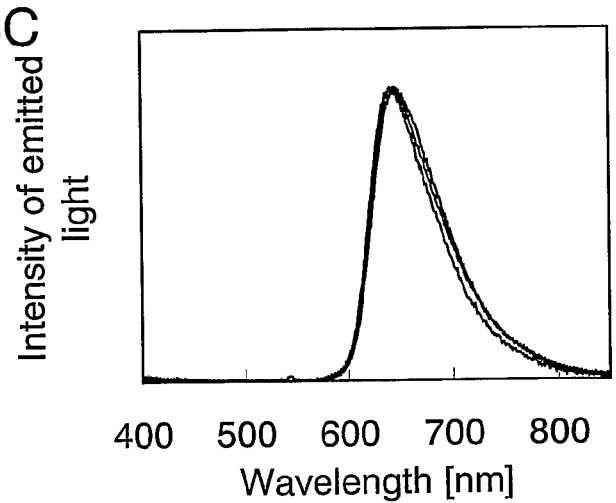

FIG. 16A shows light emission spectra of the elements 1 to 5, FIG. 16B shows light emission spectrum of the single element 1, and FIG. 16C shows light emission spectra of the elements 2 to 5. Any of them have light emission peak in the vicinity of 640 nm; however, as can be clearly seen when FIG. 16B and FIG. 16C are compared, only the element 1 has slight light emission in the vicinity of 430 nm. It is considered that NPB which was used as the first carrier transporting layer emits light from a wavelength of light emission. It is considered that, in a case where the light-emitting region is formed with one layer, Ir(Fdpq)$_2$(acac) cannot trap electrons sufficiently, and electrons that passed through and holes were recombined in NPB, and accordingly, light emission occurred. Ir(Fdpq)$_2$(acac) exhibits red emission with good color purity; however, as can be seen from Table 1, the chromaticity of the element 1 deteriorates as compared with other elements due to light emission from NPB.

Figure 17:
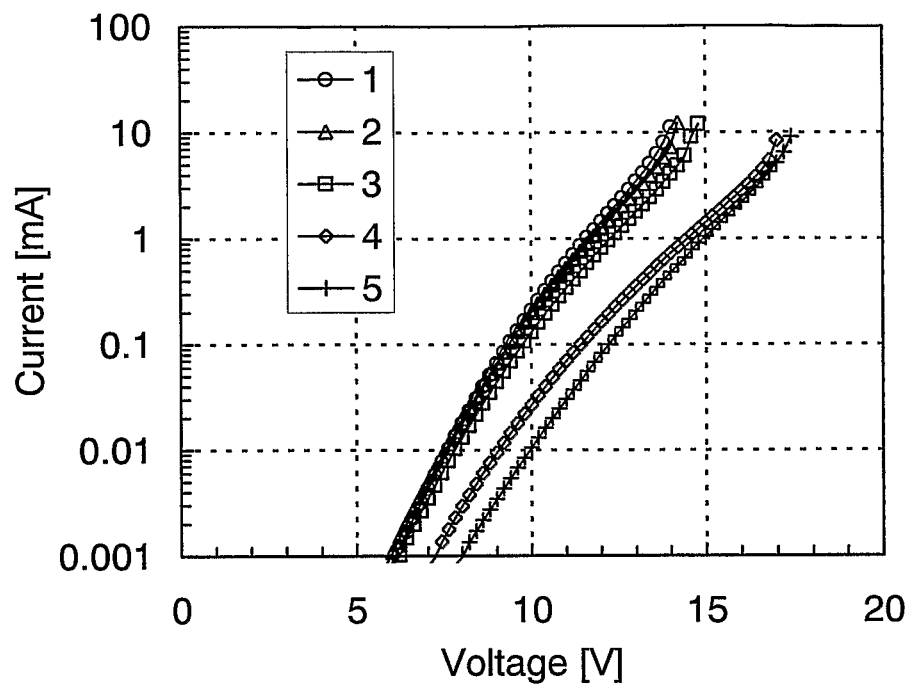
FIG. 17 shows voltage-current curves of elements 1 to 5.
Figure 18:
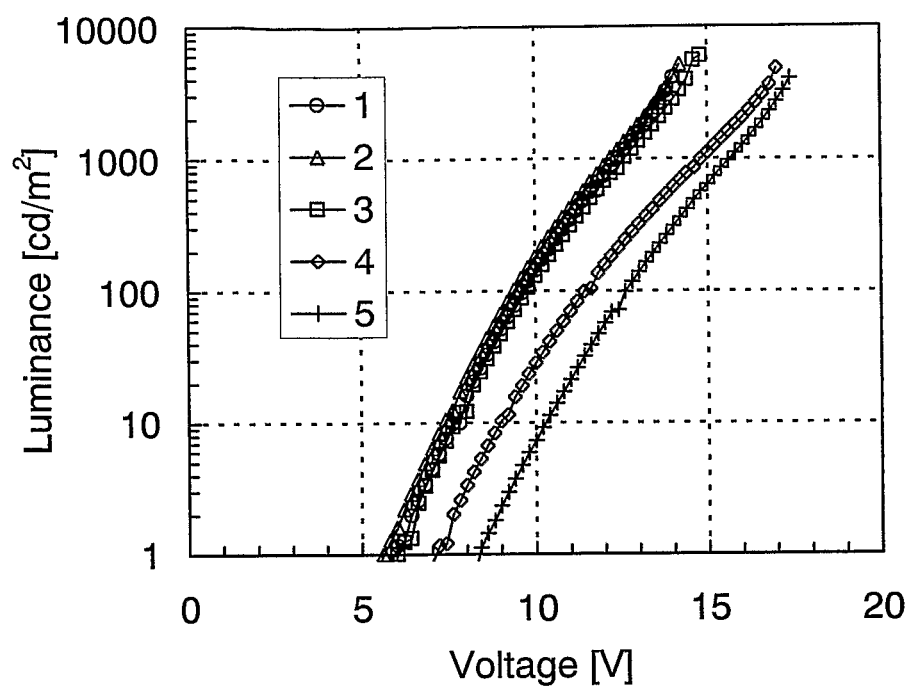
FIG. 18 shows voltage-luminance curves of elements 1 to 5.

FIG. 17 shows current-voltage curves of the elements 1 to 5. As shown in FIG. 17, it is found that more current flows in the element 1 and the elements 2 and 3 that are the light-emitting elements of the present invention than in the element 4 and the element 5 which has a conventional element structure. In addition, FIG. 18 shows luminance-voltage curves. As for a light-emitting element which emits light by interposing a layer containing an organic compound between a pair of electrodes to apply current, the current density is proportional to the luminance, like the light-emitting element of the present invention; accordingly, more luminance can be obtained in the element 1 and the elements 2 and 3 that are the light-emitting elements of the present invention than in the element 4 and the element 5 which has the conventional element structure, as can be seen from the result of FIG. 17. In other words, the element 2 and the element 3 that are the light-emitting elements of the present invention need low driving voltage and little power consumption.

Figure 19:
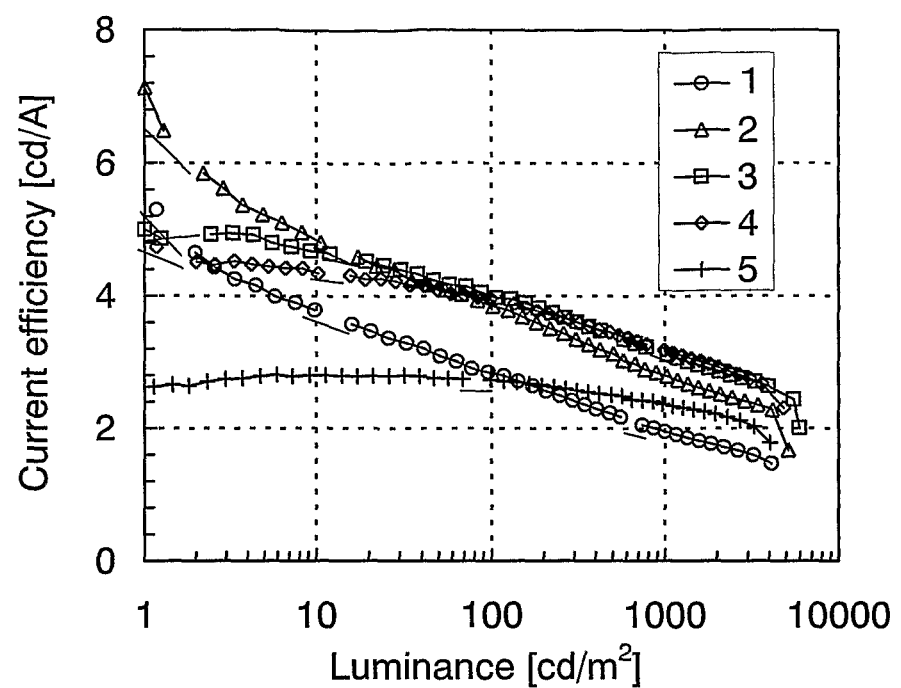
FIG. 19 shows luminance-current efficiency curves of elements 1 to 5.

FIG. 19 shows luminance-current efficiency curves. It is found that current efficiency is high in both of the element 2 and the element 3 of the present invention as compared with the element 5 of the conventional element structure. In addition, current efficiency is also high in the element 4; accordingly, it can be considered that the current efficiency is enhanced by providing 2 nm of CBP in a region which is in contact with a carrier transporting layer in a light-emitting layer. In other words, it is considered that efficiency degradation due to movement of energy of an excited substance which becomes an emission center to the other layers (functional layers such as the carrier transporting layer and a carrier injecting layer) is reduced because a substance having a larger band gap than a material used for the functional layer is interposed between the light-emitting layer and the layer; accordingly, the current efficiency is enhanced. Therefore, in this embodiment, 2 nm of CBP layer is provided for both regions that are in contact with the carrier transporting layer in the light-emitting layer. However, the similar effect of enhancement of the current efficiency can be obtained even by forming the CBP layer only in one of the regions where the functional layer to which energy might move from an exciton is formed. In addition, the CBP layer is effective with an extremely thin film; accordingly, an effect of enhancement of the current efficiency can be obtained with little increase of driving voltage. It is to be noted that when the thickness is 1 to 5 nm, there is little increase of the driving voltage, and an effect of enhancement of the current efficiency can be obtained. Consequently, not only the driving voltage can be reduced, but also the current efficiency can be enhanced by applying the present invention and further forming a thin film formed from a material having a wider band gap than a material used for the functional layer to which the energy might move from the exciton at the side where a layer to which energy might move from the exciton from the light-emitting layer. Therefore, power consumption can be further reduced. Specifically, power efficiency of the element 2 of the present invention when luminance is approximately 100 cd/m$^2$ is 0.88 μm/W and that of the element 3 is 0.92 lm/W, while on the other hand, the power efficiency of the conventional element 5 is 0.54 lm/W. Accordingly, the element of the present invention can reduce almost half of power consumption as compared with the conventional element.

As described above, the light-emitting element of the present invention does not have deterioration of color purity and needs less power consumption.

[Embodiment 2]

In this embodiment, a comparative result of reduction characteristics of a substance (Ir(Fdpq)$_2$(acac)) which becomes an emission center and a host material (CBP) that were used in the light-emitting layer of Embodiment 1 is exemplified. The reduction characteristics were examined by cyclic voltammetry (CV) measurement. It is to be noted that an electrochemical analyzer (ALS model 600A, manufactured by BAS Inc.) was used for the measurement.

As for a solution used in the CV measurement, dehydrated dimethylformamide (DMF) was used as a solvent. Tetra-n-butylammonium perchlorate (n-Bu$_4$NClO$_4$), which is a supporting electrolyte, was dissolved in the solvent so that the concentration of the tetra-n-butylammonium perchlorate was 100 mmol/L. Furthermore, an object to be measured was dissolved therein and prepared so that the concentration thereof was 1 mmol/L. Also, a platinum electrode (PTE platinum electrode, manufactured by BAS Inc.) was used as a work electrode. A platinum electrode (VC-3 Pt counter electrode (5 cm), manufactured by BAS Inc.) was used as an auxiliary electrode. An Ag/Ag⁺ electrode (RE 5 nonaqueous reference electrode, manufactured by BAS Inc.) was used as a reference electrode. It is to be noted that the measurement was carried out at room temperature.

Figure 20A:
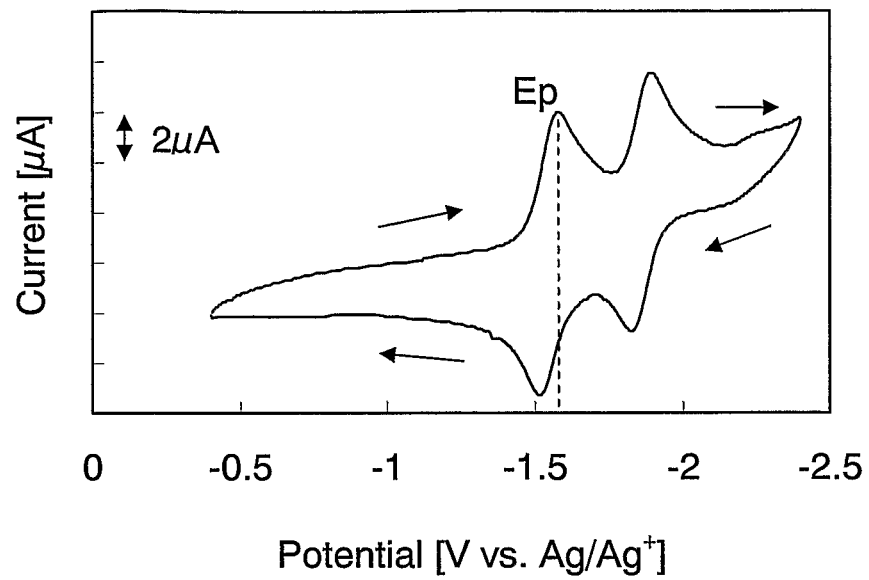
FIGS. 20A and 20B each show CV measurement data of Ir(Fdpq)$_2$(acac) and CBP.

First, reduction peak potential of Ir(Fdpq)$_2$(acac) was measured by the CV measurement. The measurement result is shown in FIG. 20A. The measurement was performed by scanning potential of a work electrode with respect to a reference electrode from −0.40 to −2.40V, and then scanning from −2.40 to −0.40V. It is to be noted that the scanning speed was set to be 0.1 V/s. According to FIG. 20A, it was found that the reduction peak potential ($E_{pc}$) of Ir(Fdpq)$_2$(acac) was −1.58 [V vs. Ag/Ag⁺].

Figure 20B:
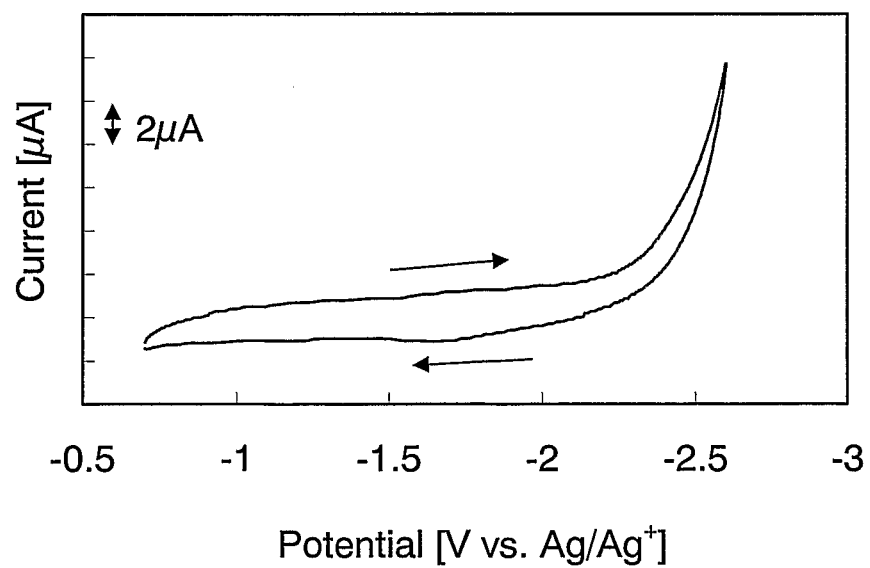

Next, reduction peak potential of CBP was measure by the CV measurement. The measurement result is shown in FIG. 20B. The measurement was performed by scanning potential of a work electrode with respect to a reference electrode from −0.70 to −2.60V, and then scanning from −2.60 to −0.70V. It is to be noted that the scanning speed was set to be 0.1 V/s. According to FIG. 20B, the reduction peak potential of CBP ($E_{pc}$) was not measured between −0.70 to −2.60 [V vs. Ag/Ag⁺]. Therefore, it can be considered that the reduction potential of CBP is at least less than −2.60 [V vs. Ag/Ag⁺].

According to the above results, it was found that an absolute value of the reduction peak potential of Ir(Fdpq)$_2$(acac) (=1.58V) was smaller than that of the reduction peak potential of CBP (>2.60V). In other words, Ir(Fdpq)$_2$(acac) is reduced more easily than CBP; therefore, it can be said that electron affinity of Ir(Fdpq)$_2$(acac) is larger than that of CBP.

[Embodiment 3]

In this embodiment, eight kinds of light-emitting elements each having a different element structure were manufactured, and the measuring result of element characteristics are shown. Elements A to F are light-emitting elements of the present invention, and the elements have a light-emitting layer provided with two to seven layered light-emitting regions, respectively. The thickness of each of the light-emitting region is 2 nm, and 2 nm of a region formed from a material having a carrier transporting property is provided between the light-emitting regions. In an element H, a light-emitting region of a light-emitting layer is formed with one layer and its thickness is 2 nm. An element G has a light-emitting layer provided with a 30 nm of a light-emitting region. In addition, a region formed from a material having a carrier transporting property is provided at the both of the electrode sides of the light-emitting layer of the elements A to F and an element H to be 2 nm thick, whereas the region is not provided for the element G. The other structures in the light-emitting elements are all the same. ITSO was used as a first electrode, DNTPD (a thickness of 40 nm) was used as a first carrier injecting layer, TCTA (a thickness of 20 nm) was used as a first carrier transporting layer, TAZ01 (a thickness of 20 nm) was used as a second carrier transporting layer, and a composite material formed from TAZ01 and Li (TAZ01: Li=1:0.01 in weight ratio, and a thickness of 20 nm) was used as a second carrier injecting layer. It is to be noted that when light emission is obtained from the light-emitting layer, a structure in which voltage is applied so that the voltage of the first electrode is higher is used, and a light-emitting layer provided with the above-described region formed form a material having a carrier transporting property and a plurality of light-emitting regions are interposed between the first carrier transporting layer and the second carrier transporting layer. In addition, CBP was used as a material for the region formed from a material having a carrier transporting property and a host material of the light-emitting region, and Ir(Fdppr-Me)$_2$(acac) was used as the substance which becomes an emission center. CBP and Ir(Fdppr-Me)$_2$(acac) in the light-emitting region were set so as to be 1:0.08 in weight ratio. It is to be noted that a material in which Ir(Fdppr-Me)$_2$(acac) is dispersed in CBP is hereinafter denoted by CBP: Ir(Fdppr-Me)$_2$(acac), and a material in which Li is dispersed in TAZ01 is denoted by TAZ01: Li. A structural formula of TCTA and Ir(Fdppr-Me)$_2$(acac) that were used in this embodiment is hereinafter shown. The general formula (8-1) shows TCTA, and the general formula (8-2) shows Ir(Fdppr-Me)$_2$(acac).

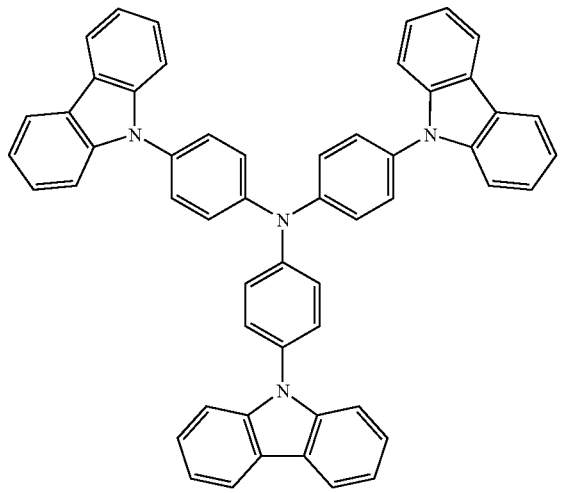

(8-1)

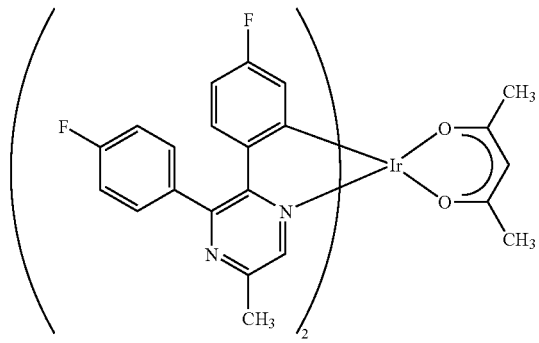

(8-2)

A manufacturing method of the element is shown. The element is formed over a glass substrate, and ITSO is formed to be 110 nm thick sequentially from the glass substrate side as a first electrode. The ITSO was deposited by a sputtering method. In the present invention, a shape of the first electrode was set to be 2×2 mm. Next, as a pretreatment for forming a layer containing an organic compound over the first electrode, a surface of the substrate was washed by a porous resin (representatively, made of PVA (polyvinyl alcohol), nylon, or the like), heat treatment was performed at 200° C. for one hour, and UV ozone treatment was performed for 370 seconds.

Subsequently, DNTPD was deposited to be 40 nm thick and TCTA was deposited to be 20 nm thick. Over these stacked films, 2 nm of CBP, 2 nm of CBP: Ir(Fdppr-Me)$_2$ (acac), 2 nm of CBP, 2 nm of CBP: Ir(Fdppr-Me)$_2$(acac), and 2 nm of CBP were sequentially stacked in the element A. When 2 nm of CBP:Ir(Fdppr-Me)$_2$(acac) and 2 nm of CBP are defined as one unit, the light-emitting layer of the element A has a structure in which the unit×2 are stacked over 2 nm of CBP. In the same manner, the element B has a structure in which the unit×3 are stacked over 2 nm of CBP; the element C has a structure in which the unit×4 are stacked over 2 nm of CBP; the element D has a structure in which the unit×5 are stacked over 2 nm of CBP; the element E has a structure in which the unit×6 are stacked over 2 nm of CBP; the element F has a structure in which the unit×7 are stacked over 2 nm of CBP; and the element H has a structure in which the unit×1 is stacked over 2 nm of CBP. In the element G 30 nm of CBP: Ir(Fdppr-Me)$_2$(acac) was deposited over the stacked film of DNTPD and TCTA. The light-emitting layer of each element was formed as described above, and thereafter 20 nm of TAZ01 and 20 nm of TAZ01: Li were deposited. Finally, Al was deposited to be 200 nm thick as a second electrode to complete the element. It is to be noted that a vacuum evaporation method by resistance heating was used with the exception of the first electrode. The structure of the light-emitting layer of each element is shown in Table 2. In the table 2, unit corresponds to a stacked layer of CBP: Ir(Fdppr-Me)$_2$(acac) (2 nM) and CBP (2 nm).

TABLE 2

| the structure of the light-emitting element | the number of light-emitting region |
|---|---|
| element A | unit × 2 over CBP (2 nm) | 2 |
| element B | unit × 3 over CBP (2 nm) | 3 |
| element C | unit × 4 over CBP (2 nm) | 4 |
| element D | unit × 5 over CBP (2 nm) | 5 |
| element E | unit × 6 over CBP (2 nm) | 6 |
| element D | unit × 7 over CBP (2 nm) | 7 |
| element G | CBP: Ir(Fdppr-Me)$_2$(acac) (30 nm) | — |
| element H | unit × 1 over CBP (2 nm) | 1 |

Figure 21A:
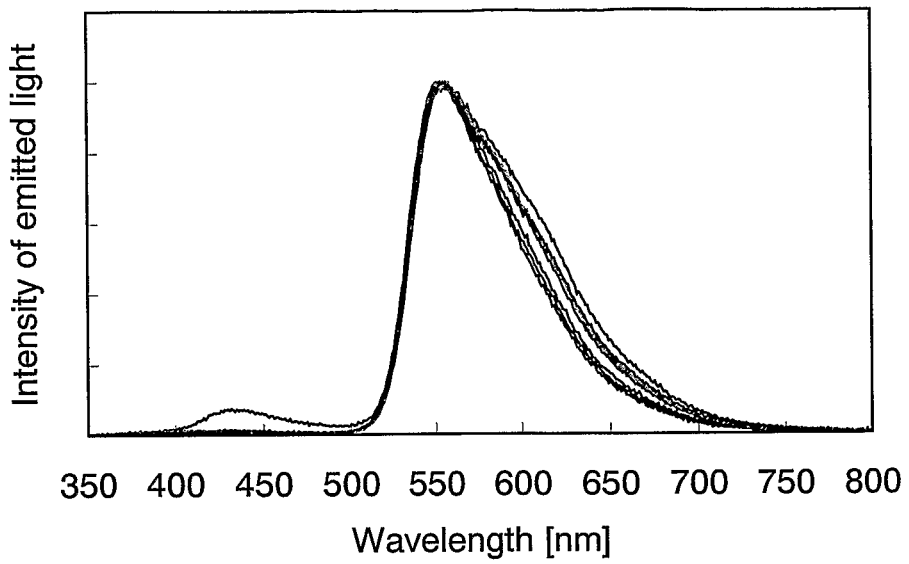
FIGS. 21A to 21C each shows light-emission spectra of elements A to H.
Figure 21B:
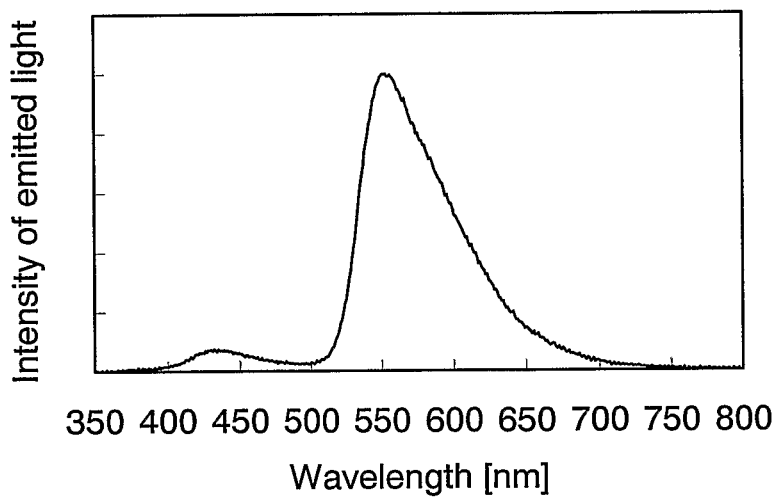
Figure 21C:
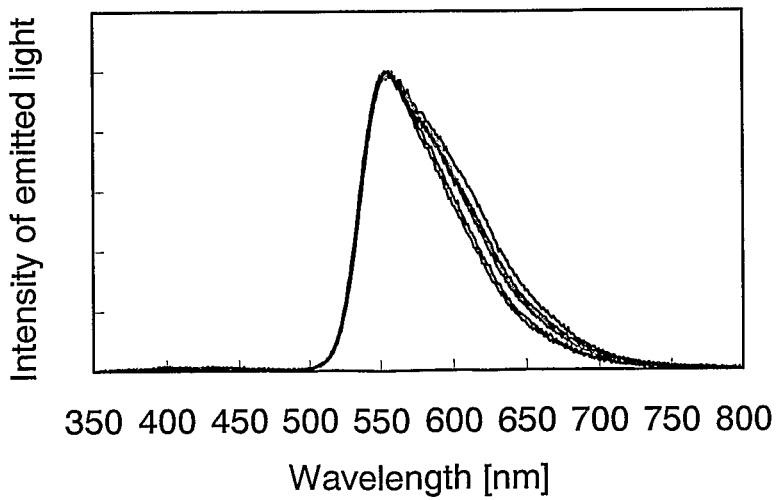

FIG. 21A shows light emission spectra of the elements A to H, FIG. 21B shows single light emission spectrum of the element 1, and FIG. 21C shows light emission spectra of the elements A to G. Any of them have light emission peak in the vicinity of 550 nm; however, as can be clearly seen when FIG. 21B and FIG. 21C are compared, only the element H has slight light emission in the vicinity of 430 nm. It is considered that TCTA which was used as the first carrier transporting layer emits light from a wavelength of light emission. It is considered that, in a case where the light-emitting region is formed with one layer, Ir(Fdppr-Me)$_2$(acac) cannot trap electrons sufficiently, and electrons that passed through and holes were recombined in TCTA, and accordingly, light emission occurred.

Figure 22:
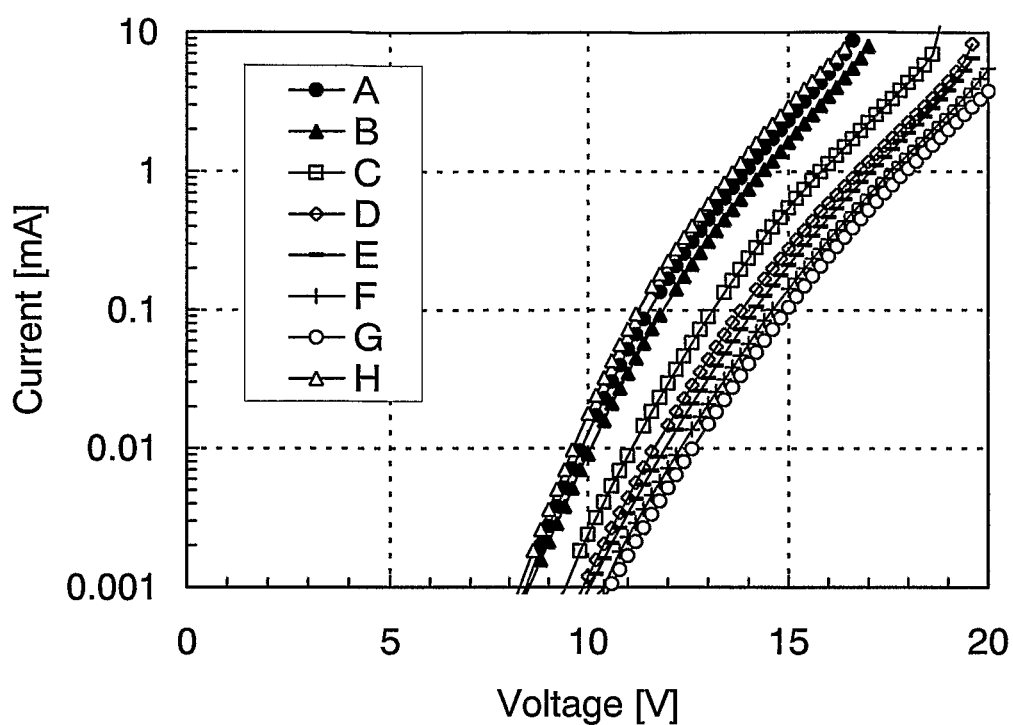
FIG. 22 shows voltage-current curves of elements A to H.
Figure 23:
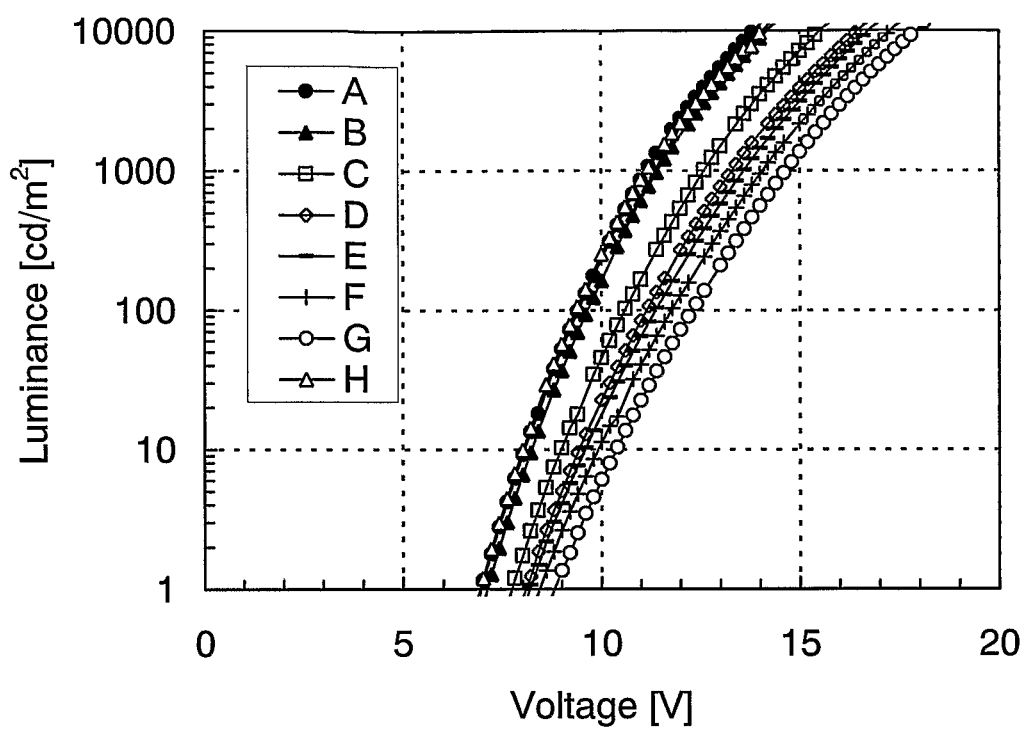
FIG. 23 shows voltage-luminance curves of elements A to H.

FIG. 22 shows current-voltage curves of the elements A to H. As shown in FIG. 22, it is found that more current flows at lower voltage in an element (the elements A to F and H) having a light-emitting layer provided with one or a plurality of 2 nm of light-emitting regions than in the element G having the conventional element structure. In addition, FIG. 23 shows luminance-voltage curves. As for a light-emitting element which emits light by interposing a layer containing an organic compound between a pair of electrodes to apply current, the current density is proportional to the luminance, like the light-emitting element of the present invention. Accordingly, more luminance can be obtained at lower voltage in the element (the elements A to F and H) having a light-emitting layer provided with one or a plurality of 2 nm of light-emitting regions than in the element G having the conventional element structure, as can be seen from the result of FIG. 22.

Figure 24:
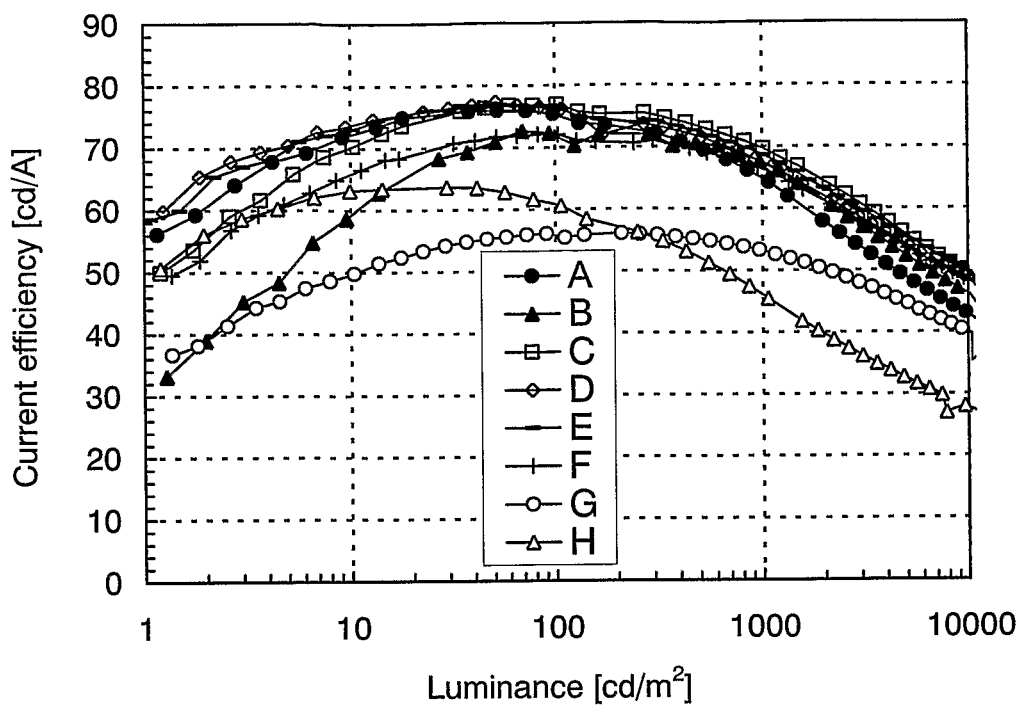
FIG. 24 shows luminance-current efficiency curves of element A to H.
Figure 25:
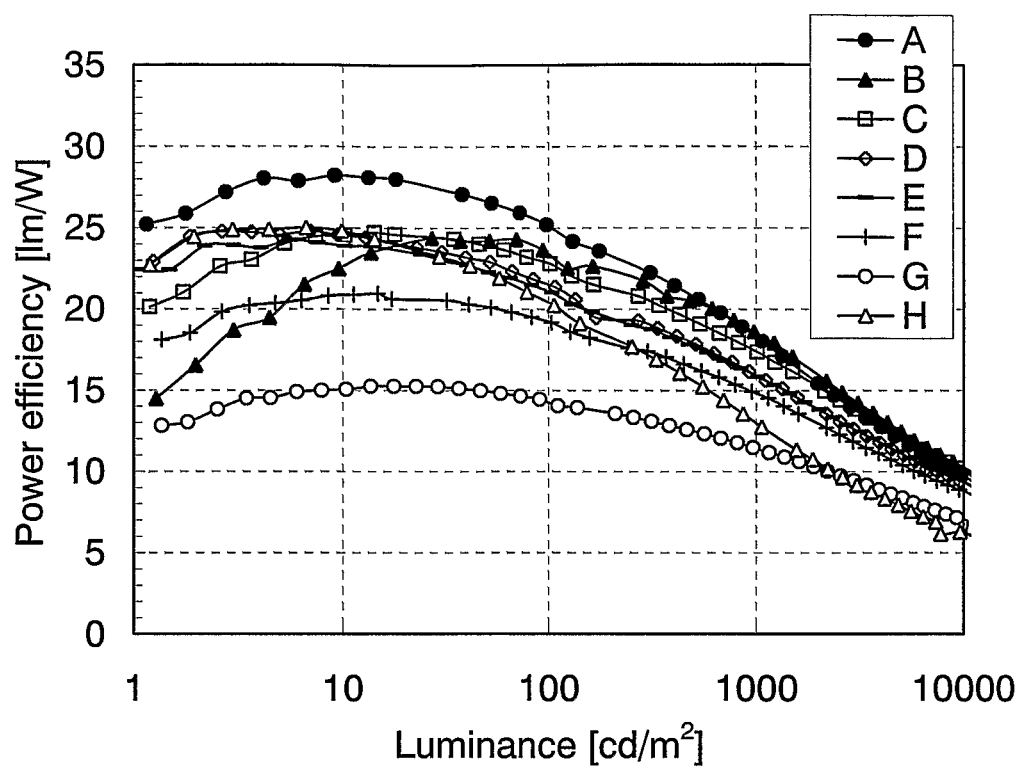
FIG. 25 shows luminance-power efficiency curves of elements A to H.

FIG. 24 shows luminance-current efficiency curves, and FIG. 25 shows luminance-power efficiency curves. As shown in FIG. 24 and FIG. 25, the element G which has the conventional element structure has a bad current-voltage characteristic and a bad luminance-voltage characteristic as compared with the element (the elements A to F and H) having the light-emitting layer provided with one or plurality of 2 nm of light-emitting regions; therefore, the current efficiency and the power efficiency are also bad. In addition, the element H having one light-emitting region has a good current-voltage characteristic and a good luminance-voltage characteristic; however, the current efficiency and the power efficiency is bad because TCTA which is used as the first carrier transporting layer emits light as shown in FIGS. 21A to 21C. Moreover, when the elements A to F are compared with each other, there are few changes in the current efficiency even when the number of the light-emitting regions is changed; however, the power efficiency is different depending on the element.

Figure 26:
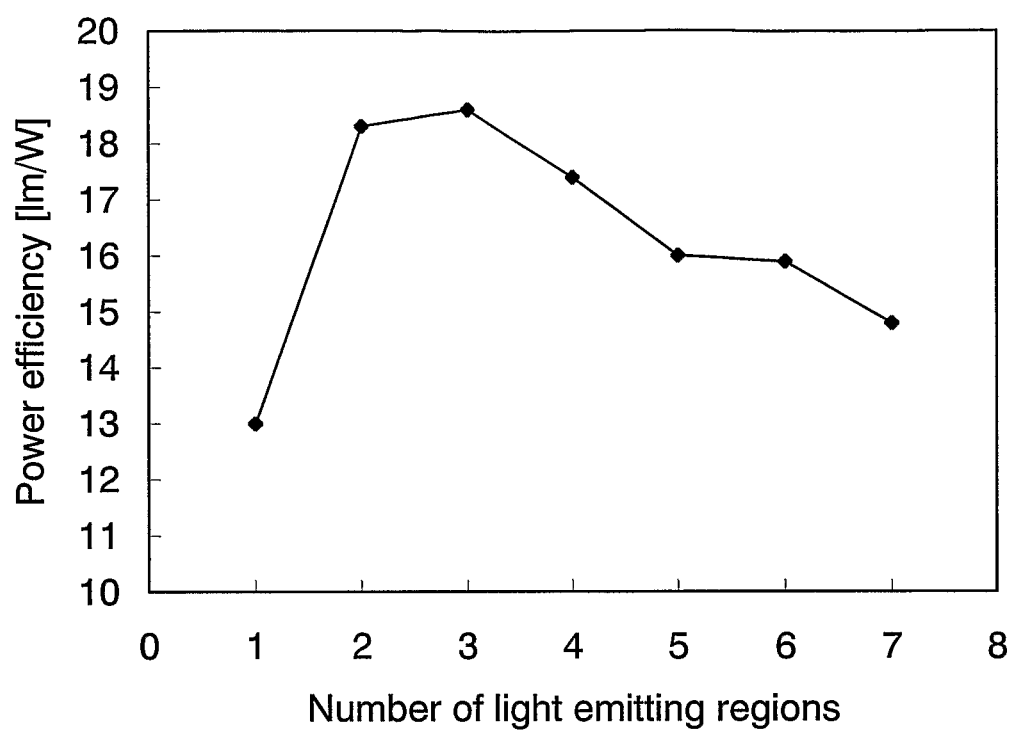
FIG. 26 shows the number of light-emitting region-power efficiency at 1000 cd/m$^2$.

FIG. 26 is a graph in which power efficiency at 1000 cd/m$^2$ was plotted with respect to the number of light-emitting region. As shown in FIG. 26, the power efficiencies of elements having two to seven of light-emitting regions are superior to an element having one light-emitting region. In addition, the power efficiency is decreased with increase of the number of light-emitting regions after the peak of the case of two to three light-emitting regions. This is because that driving voltage is increased when the number of light-emitting regions is increased. In other words, in a case of two or more light-emitting regions, the current efficiency hardly depends on the number of light-emitting regions (see FIG. 24); however, the driving voltage is increased when the number of light-emitting regions is increased, and accordingly such a result was obtained. According to the above-described results, it was found that the light-emitting element of the present invention which has a plurality of light-emitting regions is a light-emitting element which has high current efficiency and needs low driving voltage, in which the best number of the light-emitting regions was found to be 2 to 3.

[Embodiment 4]

In this embodiment, a comparative result of reduction characteristics of a substance Ir(Fdppr-Me)$_2$(acac) which becomes an emission center and a host material (CBP) that were used in the light-emitting layer of Embodiment 3 is shown The reduction characteristics were examined by cyclic voltammetry (CV) measurement. It is to be noted that an electrochemical analyzer (ALS model 600A, manufactured by BAS Inc.) was used for the measurement.

As for a solution used in the CV measurement, dehydrated dimethylformamide (DMF) was used as a solvent. Tetra-n-butylammonium perchlorate (n-Bu$_4$NClO$_4$), which is a supporting electrolyte, was dissolved in the solvent so that the concentration of the tetra-n-butylammonium perchlorate was 100 mmol/L. Furthermore, an object to be measured was dissolved therein and prepared so that the concentration thereof was 1 mmol/L. Also, a platinum electrode (PTE platinum electrode, manufactured by BAS Inc.) was used as a work electrode. A platinum electrode (VC-3 Pt counter electrode (5 cm), manufactured by BAS Inc.) was used as an auxiliary electrode. An Ag/Ag$^+$ electrode (RE 5 nonaqueous reference electrode, manufactured by BAS Inc.) was used as a reference electrode.

Figure 27:
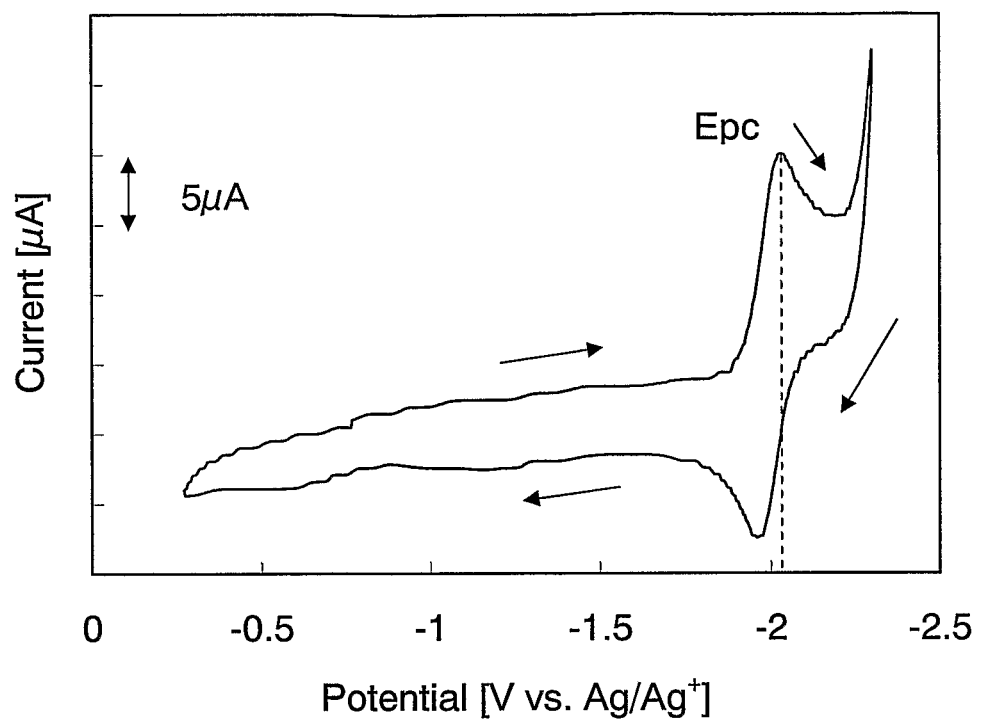
FIG. 27 shows CV measurement data of Ir(Fdppr-Me)$_2$(acac).

First, reduction peak potential of Ir(Fdppr-Me)$_2$(acac) was measured by the CV measurement. The measurement result is shown in FIG. 27. The measurement was performed by scanning potential of a work electrode with respect to a reference electrode from −0.27 to −2.30V, and then scanning from −2.30 to −0.27V. It is to be noted that the scanning speed was set to be 0.1 V/s. According to FIG. 27A, it was found that the reduction peak potential ($E_{pc}$) of Ir(Fdppr-Me)$_2$(acac) was −2.03 [V vs. Ag/Ag$^+$].

The reduction characteristic of CPB follows the description in Embodiment 2 (FIG. 20B).

According to the above results, it was found that an absolute value of the reduction peak potential of Ir(Fdppr-Me)$_2$(acac) (=2.03V) was smaller than that of the reduction peak potential of CBP (>2.60V). In other words, Ir(Fdppr-Me)$_2$(acac) is reduced more easily than CBP; therefore, it can be said that electron affinity of Ir(Fdppr-Me)$_2$(acac) is larger than that of CBP.

This application is based on Japanese Patent Application serial no. 2005-197614 filed in Japan Patent Office on Jun. 6, 2005, the entire contents of which are hereby incorporated by reference.

The invention claimed is:

1. A light-emitting element comprising:
   a first electrode;
   a second electrode;
   a light-emitting layer interposed between the first electrode and the second electrode, wherein:
   the light-emitting layer includes at least a first layer, a second layer and a third layer,
   the first layer includes a substance to be an emission center dispersed in a host material,
   the second layer includes the substance dispersed in the host material, and
   the third layer is interposed between the first layer and the second layer; and
   a fourth layer comprising an organic compound having hole transporting property and a metal compound the fourth layer between the light-emitting layer and one of the first electrode and the second electrode.

2. The light-emitting element according to claim 1, wherein a thickness of the third layer is 1 nm or more and 10 nm or less.

3. The light-emitting element according to claim 1, wherein a thickness of each of the first layer and the second layer is 1 nm or more and 10 nm or less.

4. The light-emitting element according to claim 1, wherein a thickness of each of the first layer, the second layer, and the third layer is 1 nm or more and 10 nm or less.

5. The light-emitting element according to claim 1, wherein the third layer contains the host material.

6. The light-emitting element according to claim 1, wherein an absolute value of reduction potential of the substance is smaller than that of reduction potential of the host material.

7. The light-emitting element according to claim 1, wherein electron affinity of the substance is larger than that of the host material.

8. The light-emitting element according to claim 1, wherein the substance is an organic material.

9. The light-emitting element according to claim 1, wherein the substance is a phosphorescent material.

10. The light-emitting element according to claim 1, wherein the substance includes an electron withdrawing group.

11. The light-emitting element according to claim 1, wherein the substance is a phosphorescent material having an electron withdrawing group.

12. The light-emitting element according to claim 1, wherein the substance is contained at 0.001 to 50 wt % with respect to the host material.

13. The light-emitting element according to claim 1, wherein the substance is (acetylacetonate)bis[2,3-bis(4-fluorophenyl)quinoxalinato]iridium(III).

14. The light-emitting element according to claim 1, wherein the substance is (acetylacetonate)bis[2,3-bis(4-fluorophenyl)-5-metylpyrazinato]iridium(III).

15. The light-emitting element according to claim 1, wherein the host material is an organic material.

16. The light-emitting element according to claim 1, wherein the host material is 4,4'-di(N-carbazolyl)biphenyl.

17. The light-emitting element according to claim 1, further comprising a carrier transporting layer, wherein:
   the light-emitting layer includes a fifth layer in contact with the carrier transporting layer,
   a thickness of the fifth layer is 1 nm or more and 10 nm or less,
   the fifth layer includes a material having a carrier transporting property, and
   a band gap of the material having the carrier transporting property is bigger than a band gap of a substance included in the carrier transporting layer.

18. A light-emitting device using the light-emitting element according to claim 1 as a pixel or a light source.

19. An electronic device using the light-emitting element according to claim 1 as a display portion or a light source.

20. The light-emitting element according to claim 1, wherein the third layer contains a material with a carrier transporting property.

21. The light-emitting element according to claim 1, further comprising:
   a fifth layer between the second layer and the second electrode, the fifth layer including the substance dispersed in the host material;
   a sixth layer between the second layer and the fifth layer.

22. The light-emitting element according to claim 1, wherein the metal compound is molybdenum oxide.

23. The light-emitting element according to claim 1, further comprising:
   a fifth layer comprising an organic compound having an electron transporting property and an inorganic compound, the fifth layer between the light-emitting layer and the other of the first electrode and the second electrode.

24. A light-emitting element comprising:
   a first electrode;
   a second electrode;
   a light-emitting layer interposed between the first electrode and the second electrode,
   a first carrier transporting layer between the first electrode and the light-emitting layer; and
   a second carrier transporting layer between the first electrode and the light-emitting layer,
   wherein the light-emitting layer includes:
   a first layer including a first substance to be an emission center dispersed in a first host material;
   a second layer including a second substance dispersed in a second host material, and
   a third layer between the first layer and the second layer, the third layer containing a first material with a carrier transporting property;
   a fourth layer between the first carrier transporting layer and the first layer; the fourth layer containing a second material with a carrier transporting property; and
   a fifth layer between the second carrier transporting layer and the second layer; the fifth layer containing a third material with a carrier transporting property, and wherein the first material is the same as the first host material.

25. The light-emitting element according to claim 24, wherein a band gap of the second material is bigger than a band gap of a substance included in the first carrier transporting layer.

26. The light-emitting element according to claim 24, wherein a band gap of the third material is bigger than a band gap of a substance included in the second carrier transporting layer.

27. The light-emitting element according to claim 24, wherein a band gap of the second material is bigger than a band gap of a substance included in the first carrier transporting layer, and
wherein a band gap of the third material is bigger than a band gap of a substance included in the second carrier transporting layer.

28. The light-emitting element according to claim 24, wherein the second material and the third material are the same as the first material.

29. The light-emitting element according to claim 24, wherein the first substance is the same as the second substance, and
wherein the first host material is the same as the second host material.

30. The light-emitting element according to claim 24, further comprising:
a sixth layer between the second layer and the fifth layer, the sixth layer including a third substance dispersed in a third host material; and
a seventh layer between the second layer and the sixth layer, the seventh layer containing a fourth material with a carrier transporting property.

31. The light-emitting element according to claim 30, wherein the third substance is the same as the first substance and the second substance, and
wherein the third host material is the same as the first host material and the second host material.

32. The light-emitting element according to claim 30, wherein the fourth material is the same as the first material, and
wherein the second material and the third material are the same as the first material.

33. The light-emitting element according to claim 24, a thickness of the third layer is 1 nm or more and 10 nm or less.

34. The light-emitting element according to claim 24, a thickness of each of the first layer and the second layer is 1 nm or more and 10 nm or less.

35. The light-emitting element according to claim 24, a thickness of each of the first layer, the second layer, and the third layer is 1 nm or more and 10 nm or less.

36. The light-emitting element according to claim 24, wherein an absolute value of reduction potential of the first substance is smaller than that of reduction potential of the first host material, and
wherein an absolute value of reduction potential of the second substance is smaller than that of reduction potential of the second host material.

37. The light-emitting element according to claim 24, wherein electron affinity of the first substance is larger than that of the first host material, and
wherein electron affinity of the second substance is larger than that of the second host material.

38. The light-emitting element according to claim 24, wherein each of the first substance and the second substance is an organic material.

39. The light-emitting element according to claim 24, wherein each of the first substance and the second substance is a phosphorescent material.

40. The light-emitting element according to claim 24, wherein each of the first substance and the second substance includes an electron withdrawing group.

41. The light-emitting element according to claim 24, wherein each of the first substance and the second substance is a phosphorescent material having an electron withdrawing group.

42. The light-emitting element according to claim 24, wherein the first substance is contained at 0.001 to 50 wt % with respect to the first host material, and
wherein the second substance is contained at 0.001 to 50 wt % with respect to the second host material.

43. The light-emitting element according to claim 24, wherein each of the first substance and the second substance is (acetylacetonate)bis[2,3-bis(4-fluorophenyl)quinoxalinato]iridium(III).

44. The light-emitting element according to claim 24, wherein each of the first substance and the second substance is (acetylacetonate)bis[2,3-bis(4-fluorophenyl)-5-metylpyrazinato]iridium(III).

45. The light-emitting element according to claim 24, wherein each of the first host material and the second host material is an organic material.

46. The light-emitting element according to claim 24, wherein each of the first host material and the second host material is 4,4'-di(N-carbazolyl)biphenyl.

47. The light-emitting element according to claim 24, wherein a thickness of the fourth layer is 1 nm or more and 10 nm or less, and
wherein a thickness of the fifth layer is 1 nm or more and 10 nm or less.

48. A light-emitting device using the light-emitting element according to claim 24 as a pixel or a light source.

49. An electronic device using the light-emitting element according to claim 24 as a display portion or a light source.

50. The light-emitting element according to claim 24, wherein at least one buffer layer is provided between the light-emitting layer and one of the first electrode and the second electrode.

51. The light-emitting element according to claim 24, further comprising: a sixth layer comprising an organic compound having hole transporting property and a metal compound, the sixth layer between the light-emitting layer and one of the first electrode and the second electrode.

52. The light-emitting element according to claim 51, wherein the metal compound is molybdenum oxide.

53. The light-emitting element according to claim 24, further comprising:
a sixth layer comprising an organic compound having hole transporting property and a metal compound, the sixth layer between one of the first carrier transporting layer and the first electrode and the second carrier transporting layer and the second electrode; and
a seven layer comprising an organic compound having an electron transporting property and an inorganic compound, the seven layer between the other of the first carrier transporting layer and the first electrode and the second carrier transporting layer and the second electrode.

54. A light-emitting element comprising:
a first electrode;
a second electrode; and
a light-emitting layer interposed between the first electrode and the second electrode, wherein the light-emitting layer includes:
- a first layer including a first substance to be an emission center dispersed in a first host material;
- a second layer including a second substance dispersed in a second host material,
- a third layer between the first layer and the second layer, the third layer containing a material with a carrier transporting property;
- a fourth layer between the first electrode and the first layer; the fourth layer containing the material with the carrier transporting property; and
- a fifth layer between the second electrode and the second layer; the fifth layer containing the material with the carrier transporting property, and wherein the material with the carrier transporting property is the same as the first host material.

55. The light-emitting element according to claim 54,
wherein the first substance is the same as the second substance, and
wherein the first host material is the same as the second host material.

56. The light-emitting element according to claim 54, further comprising:
a sixth layer between the second layer and the fifth layer, the sixth layer including a third substance dispersed in a third host material; and
a seventh layer between the second layer and the sixth layer, the seventh layer containing the material with the carrier transporting property.

57. The light-emitting element according to claim 56
wherein the third substance is the same as the first substance and the second substance, and
wherein the third host material is the same as the first host material and the second host material.

58. The light-emitting element according to claim 54
a thickness of the third layer is 1 nm or more and 10 nm or less.

59. The light-emitting element according to claim 54,
a thickness of each of the first layer and the second layer is 1 nm or more and 10 nm or less.

60. The light-emitting element according to claim 54,
a thickness of each of the first layer, the second layer, and the third layer is 1 nm or more and 10 nm or less.

61. The light-emitting element according to claim 54,
wherein an absolute value of reduction potential of the first substance is smaller than that of reduction potential of the first host material, and
wherein an absolute value of reduction potential of the second substance is smaller than that of reduction potential of the second host material.

62. The light-emitting element according to claim 54,
wherein electron affinity of the first substance is larger than that of the first host material, and
wherein electron affinity of the second substance is larger than that of the second host material.

63. The light-emitting element according to claim 54,
wherein each of the first substance and the second substance is an organic material.

64. The light-emitting element according to claim 54,
wherein each of the first substance and the second substance is a phosphorescent material.

65. The light-emitting element according to claim 54,
wherein each of the first substance and the second substance includes an electron withdrawing group.

66. The light-emitting element according to claim 54,
wherein each of the first substance and the second substance is a phosphorescent material having an electron withdrawing group.

67. The light-emitting element according to claim 54,
wherein the first substance is contained at 0.001 to 50 wt % with respect to the first host material, and
wherein the second substance is contained at 0.001 to 50 wt % with respect to the second host material.

68. The light-emitting element according to claim 54,
wherein each of the first substance and the second substance is (acetylacetonate)bis[2,3-bis(4-fluorophenyl)quinoxalinato]iridium(III).

69. The light-emitting element according to claim 54,
wherein each of the first substance and the second substance is (acetylacetonate)bis[2,3-bis(4-fluorophenyl)-5-metylpyrazinato]iridium(III).

70. The light-emitting element according to claim 54,
wherein each of the first host material and the second host material is an organic material.

71. The light-emitting element according to claim 54,
wherein each of the first host material and the second host material is 4,4'-di(N-carbazolyl)biphenyl.

72. The light-emitting element according to claim 54,
wherein a thickness of the fourth layer is 1 nm or more and 10 nm or less, and
wherein a thickness of the fifth layer is 1 nm or more and 10 nm or less.

73. A light-emitting device using the light-emitting element according to claim 54 as a pixel or a light source.

74. An electronic device using the light-emitting element according to claim 54 as a display portion or a light source.

75. The light-emitting element according to claim 54,
wherein at least one buffer layer is provided between the light-emitting layer and one of the first electrode and the second electrode.

76. The light-emitting element according to claim 54, further comprising: a sixth layer comprising an organic compound having hole transporting property and a metal compound, the sixth layer between the light-emitting layer and one of the first electrode and the second electrode.

77. The light-emitting element according to claim 76, wherein the metal compound is molybdenum oxide.

78. The light-emitting element according to claim 54, further comprising:
a sixth layer comprising an organic compound having hole transporting property and a metal compound, the sixth layer between the light-emitting layer and one of the first electrode and the second electrode; and
a seventh layer comprising an organic compound having an electron transporting property and an inorganic compound, the seventh layer between the light-emitting layer and the other of the first electrode and the second electrode.

* * * * *

UNITED STATES PATENT AND TRADEMARK OFFICE
CERTIFICATE OF CORRECTION

PATENT NO. : 8,415,878 B2
APPLICATION NO. : 11/994364
DATED : April 9, 2013
INVENTOR(S) : Satoshi Seo and Yuji Iwaki Page 1 of 1

It is certified that error appears in the above-identified patent and that said Letters Patent is hereby corrected as shown below:

In the Specification:

Column 6, line 47; Change ")-S-methylpyrazinato" to --)-5-methylpyrazinato--.
Column 7, line 27; Change "Ir(CF$_3$dpq)$_2$(Pic))," to --Ir(CF$_3$dpq)$_2$(pic)),--.
Column 7, line 56; Change "Ir(CF$_3$dpq)$_2$(Pic))" to --Ir(CF$_3$dpq)$_2$(pic))--.
Column 33, line 5; Change "2 nM of" to --2 nm of--.
Column 34, line 41; Change "0.88 µm/W " to --0.88 lm/W--.
Column 37, line 4; Change "over-2 nm" to --over 2 nm--.
Column 37, line 21; Change "(2 nM)" to --(2 nm)--.

In the Claims:

Column 40, lines 51-52, claim 24; Change "between the first electrode" to --between the second electrode--.

Signed and Sealed this
Thirtieth Day of July, 2013

Teresa Stanek Rea
*Acting Director of the United States Patent and Trademark Office*

UNITED STATES PATENT AND TRADEMARK OFFICE
CERTIFICATE OF CORRECTION

| | |
|---|---|
| PATENT NO. | : 8,415,878 B2 |
| APPLICATION NO. | : 11/994364 |
| DATED | : April 9, 2013 |
| INVENTOR(S) | : Satoshi Seo |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 606 days.

Signed and Sealed this
Eleventh Day of November, 2014

Michelle K. Lee
*Deputy Director of the United States Patent and Trademark Office*